US010752542B2

(12) United States Patent
Bookbinder et al.

(10) Patent No.: US 10,752,542 B2
(45) Date of Patent: Aug. 25, 2020

(54) ASYMMETRIC STRESS PROFILES FOR LOW WARP AND HIGH DAMAGE RESISTANCE GLASS ARTICLES

(71) Applicant: CORNING INCORPORATED, Corning, NY (US)

(72) Inventors: Dana Craig Bookbinder, Corning, NY (US); Timothy Michael Gross, Corning, NY (US); Jennifer Lynn Hunt, Corning, NY (US); Rostislav Vatchev Roussev, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 188 days.

(21) Appl. No.: 15/909,047

(22) Filed: Mar. 1, 2018

(65) Prior Publication Data

US 2018/0251400 A1   Sep. 6, 2018

Related U.S. Application Data

(60) Provisional application No. 62/466,240, filed on Mar. 2, 2017.

(51) Int. Cl.
| | |
|---|---|
| *C03C 21/00* | (2006.01) |
| *C03B 23/03* | (2006.01) |
| *C03C 3/097* | (2006.01) |
| *C03C 4/18* | (2006.01) |
| *G06F 1/16* | (2006.01) |
| *C03C 23/00* | (2006.01) |
| *H04M 1/02* | (2006.01) |

(Continued)

(52) U.S. Cl.
CPC ........ *C03C 21/002* (2013.01); *C03B 23/0307* (2013.01); *C03C 3/097* (2013.01); *C03C 4/18* (2013.01); *C03C 23/007* (2013.01); *C03B 23/025* (2013.01); *C03C 2204/00* (2013.01); *G06F 1/1656* (2013.01); *H04M 1/0202* (2013.01); *H05K 5/03* (2013.01); *Y02P 40/57* (2015.11)

(58) Field of Classification Search
None
See application file for complete search history.

(56) References Cited

U.S. PATENT DOCUMENTS

| | | |
|---|---|---|
| 2011/0281093 A1 | 11/2011 | Gulati et al. |
| 2013/0061636 A1 | 3/2013 | Imai et al. |
| 2013/0224492 A1 | 8/2013 | Bookbinder et al. |

(Continued)

FOREIGN PATENT DOCUMENTS

| | | | | |
|---|---|---|---|---|
| JP | 2016169143 A | * | 9/2016 | ............. C03C 3/085 |
| WO | 2016204087 A1 | | 12/2016 | |

OTHER PUBLICATIONS

Invitation to Pay Additional Fees of the International Searching Authority; PCT/US2018/020413; dated June 27, 2018; 14 Pages; European Patent Office.

(Continued)

*Primary Examiner* — David Sample
(74) *Attorney, Agent, or Firm* — Kevin M. Johnson

(57) ABSTRACT

A glass article having an asymmetric stress profile exhibiting a high degree of asymmetry and a low degree or no warp. The glass article has a stress profile with a high Asymmetry Figure of Merit and a high Warpage Figure of Merit.

40 Claims, 37 Drawing Sheets

(51) Int. Cl.
  *H05K 5/03* (2006.01)
  *C03B 23/025* (2006.01)

(56) References Cited

U.S. PATENT DOCUMENTS

| | | |
|---|---|---|
| 2014/0242390 A1* | 8/2014 | Allan .................... C03C 21/001 |
| | | 428/410 |
| 2015/0274585 A1 | 10/2015 | Rogers et al. |
| 2016/0016849 A1 | 1/2016 | Allan |
| 2016/0214889 A1 | 7/2016 | Garner et al. |
| 2016/0326050 A1 | 11/2016 | Lee et al. |
| 2017/0015584 A1 | 1/2017 | Krzyzak et al. |
| 2017/0247291 A1 | 8/2017 | Hatano et al. |

OTHER PUBLICATIONS

International Search Report and Written Opinion PCT/US2018/020413 dated Oct. 17, 2018, 18 Pgs.

* cited by examiner

ASYMMETRIC STRESS PROFILES FOR LOW WARP AND HIGH DAMAGE RESISTANCE GLASS ARTICLES

RELATED APPLICATIONS

The application claims the benefit of priority of U.S. Provisional Application Ser. No. 62/466,240 filed on Mar. 2, 2017, the content of which is relied upon and incorporated herein by reference in its entirety.

BACKGROUND

The disclosure relates to a glass article with an asymmetric stress profile. More particularly, the disclosure relates to chemically strengthened glass articles comprising an asymmetric stress profile with a low degree of warp.

Glass articles are widely used in electronic devices as cover plates or windows for portable or mobile electronic communication and entertainment devices, such as cellular phones, smart phones, tablets, video players, information terminal (IT) devices, laptop computers and the like, as well as in other applications. As glass articles become more widely used, it has become more important to develop strengthened glass articles having improved survivability, especially when subjected to tensile stresses and/or relatively deep flaws caused by contact with hard and/or sharp surfaces. Additionally, the predominant failure modes of the various surfaces of the glass articles are different, and thus different strengthening characteristics are appropriate for increasing the survivability of each surface of the glass article. To achieve such different chemical strengthening characteristics on surfaces of a glass article, an asymmetric stress profile is employed.

Asymmetric stress profiles of the type known in the art induce warp in the glass article. Warp in a glass article that exceeds a low degree renders the glass article unsuitable for use as a cover plate or window for portable or mobile electronic communication and entertainment devices. Thus, there is a need for a glass article with an asymmetric stress profile and a low degree of warp.

SUMMARY

The present disclosure provides in aspect (1), a glass article, comprising: a first surface; a second surface; an asymmetric stress profile extending from the first surface to the second surface; a Warpage Figure of Merit of the asymmetric stress profile of at least about 0.5 m; and an Asymmetry Figure of Merit of the asymmetric stress profile of at least about 0.05.

The present disclosure provides in aspect (2), a glass article, comprising: a first surface; a second surface; an asymmetric stress profile extending from the first surface to the second surface; a Warpage Tendency of the asymmetric stress profile of less than about one twelfth of a thickness of the glass article; and an Asymmetry Figure of Merit of the asymmetric stress profile of at least about 0.05.

The present disclosure provides in aspect (3), a glass article, comprising: a first surface; a second surface; an asymmetric stress profile extending from the first surface to the second surface; and an Asymmetry Figure of Merit of the asymmetric stress profile of at least about 0.05.

The present disclosure provides in aspect (4), a glass article, comprising: a first surface; a second surface; an asymmetric stress profile extending from the first surface to the second surface; and a Warpage Tendency of the asymmetric stress profile of less than about one twelfth of a thickness of the glass article.

The present disclosure provides in aspect (5), a glass article, comprising: a first surface; a second surface; an asymmetric stress profile extending from the first surface to the second surface; and a Warpage Figure of Merit of the asymmetric stress profile of at least about 0.5 m.

The present disclosure provides in aspect (6), the glass article of any of the preceding aspects, further comprising from about 2 mol % to about 20 mol % $B_2O_3$.

The present disclosure provides in aspect (7), the glass article of any of the preceding aspects, further comprising: 50-75 mol % $SiO_2$; 5-20 mol % $Al_2O_3$; 2-20 mol % $B_2O_3$; 0-10 mol % $P_2O_5$; 6-25 mol % $Li_2O+Na_2O+K_2O$; and 0-15 mol % $MgO+CaO+SrO+BaO+ZnO$.

The present disclosure provides in aspect (8), the glass article of any of the preceding aspects, wherein the Warpage Figure of Merit of the asymmetric stress profile is at least about 1 m.

The present disclosure provides in aspect (9), the glass article of any of the preceding aspects, wherein the Warpage Figure of Merit of the asymmetric stress profile is at least about 10 m.

The present disclosure provides in aspect (10), the glass article of any of the preceding aspects, wherein the Asymmetry Figure of Merit of the asymmetric stress profile is at least about 0.2.

The present disclosure provides in aspect (11), the glass article of any of the preceding aspects, wherein the Asymmetry Figure of Merit of the asymmetric stress profile is at least about 0.5.

The present disclosure provides in aspect (12), the glass article of any of the preceding aspects, further comprising a compressive stress at a depth of 10 μm below the second surface of at least about 500 MPa.

The present disclosure provides in aspect (13), the glass article of any of the preceding aspects, further comprising a compressive stress at a depth of 5 μm below the second surface of at least about 650 MPa.

The present disclosure provides in aspect (14), the glass article of any of the preceding aspects, further comprising a compressive stress at a depth below the first surface of 10% of the distance between the first surface and the second surface of at least about 40 MPa.

The present disclosure provides in aspect (15), the glass article of any of the preceding aspects, further comprising a compressive stress at a depth below the first surface of 15% of the distance between the first surface and the second surface of at least about 30 MPa.

The present disclosure provides in aspect (16), the glass article of any of the preceding aspects, further comprising a radius of curvature of at least about 12.5 m.

The present disclosure provides in aspect (17), the glass article of any of the preceding aspects, further comprising: a first compressive stress layer extending from the first surface to a first depth of compression in the glass article; a second compressive stress layer extending from the second surface to a second depth of compression in the glass article; a first maximum compressive stress in the first compressive stress layer; and a second maximum compressive stress in the second compressive stress layer, wherein the ratio of the first maximum compressive stress to the second maximum compressive stress is about 1:3 or less.

The present disclosure provides in aspect (18), the glass article of any of the preceding aspects, wherein the glass article has a Warpage Suppression Factor of less than about 0.3.

The present disclosure provides in aspect (19), the glass article of any of the preceding aspects, wherein the distance between the first surface and the second surface is less than about 1 mm.

The present disclosure provides in aspect (20), the glass article of any of the preceding aspects, wherein the glass article comprises a region with a second stress profile extending from the first surface to the second surface, and the second stress profile is different than the asymmetric stress profile.

The present disclosure provides in aspect (21), the glass article of aspect (20) wherein the difference between the Asymmetry Figure of Merit of the asymmetric stress profile and the Asymmetry Figure of Merit of the second stress profile is at least 0.2.

The present disclosure provides in aspect (22), the glass article of any of the preceding aspects, further comprising a glass ceramic.

The present disclosure provides in aspect (23), the glass article of any of the preceding aspects, wherein the glass article is a laminated structure comprising at least a first layer and a second layer, and the first layer and second layer each comprises a glass or glass ceramic.

The present disclosure provides in aspect (24), a consumer electronic product, comprising: a housing having a front surface, a back surface and side surfaces; electrical components provided at least partially within the housing, the electrical components including at least a controller, a memory, and a display, the display being provided at or adjacent the front surface of the housing; and a cover glass article disposed over the display, wherein at least one of a portion of the housing or the cover glass article comprises the glass article of any of the preceding aspects.

The present disclosure provides in aspect (25), a glass article, comprising: a first surface; a second surface; an asymmetric stress profile extending from the first surface to the second surface; a first compressive stress layer extending from the first surface to a first depth of compression in the glass article; a second compressive stress layer extending from the second surface to a second depth of compression in the glass article; and a warpage height, wherein a ratio of the first depth of compression to the second depth of compression is at least about 1.5:1, and the warpage height is less than about 1% of a maximum dimension of the glass article.

The present disclosure provides in aspect (26), the glass article of aspect (25), further comprising: a first maximum compressive stress in the first compressive stress layer; and a second maximum compressive stress in the second compressive stress layer, wherein the ratio of the first maximum compressive stress to the second maximum compressive stress is about 1:3 or less.

The present disclosure provides in aspect (27), the glass article of aspect (25) or (26), wherein the ratio of the first depth of compression to the second depth of compression is at least about 3:1.

The present disclosure provides in aspect (28), the glass article of any of aspects (25) to (27), wherein the warpage height is less than about 0.1% of the maximum dimension of the glass article.

The present disclosure provides in aspect (29), the glass article of any of aspects (25) to (28), wherein the glass article has an Asymmetry Figure of Merit of at least about 0.2.

The present disclosure provides in aspect (30), the glass article of any of aspects (25) to (29), wherein the glass article has a Warpage Figure of Merit of at least about 0.5 m.

The present disclosure provides in aspect (31), the glass article of any of aspects (25) to (30), wherein the glass article has a Warpage Suppression Factor of less than about 0.3.

The present disclosure provides in aspect (32), the glass article of any of aspects (25) to (31), further comprising a compressive stress at a depth of 10 μm below the second surface of at least about 500 MPa.

The present disclosure provides in aspect (33), the glass article of any of aspects (25) to (32), further comprising a compressive stress at a depth of 5 μm below the second surface of at least about 650 MPa.

The present disclosure provides in aspect (34), the glass article of any of aspects (25) to (33), further comprising a compressive stress at a depth below the first surface of 10% of the distance between the first surface and the second surface of at least about 40 MPa.

The present disclosure provides in aspect (35), the glass article of any of aspects (25) to (34), further comprising a compressive stress at a depth below the first surface of 15% of the distance between the first surface and the second surface of at least about 30 MPa.

The present disclosure provides in aspect (36), the glass article of any of aspects (25) to (35), wherein the distance between the first surface and the second surface is less than about 1 mm.

The present disclosure provides in aspect (37), the glass article of any of aspects (25) to (36), further comprising a radius of curvature of at least about 12.5 m.

The present disclosure provides in aspect (38), the glass article of any of aspects (25) to (37), further comprising a glass ceramic.

The present disclosure provides in aspect (39), the glass article of any of aspects (25) to (38), wherein the glass article is a laminated structure comprising at least a first layer and a second layer, and the first layer and second layer each comprises a glass or glass ceramic.

The present disclosure provides in aspect (40), a consumer electronic product, comprising: a housing having a front surface, a back surface and side surfaces; electrical components provided at least partially within the housing, the electrical components including at least a controller, a memory, and a display, the display being provided at or adjacent the front surface of the housing; and a cover glass article disposed over the display, wherein at least one of a portion of the housing or the cover glass article comprises the glass article of any of aspects (25) to (39).

The present disclosure provides in aspect (41), a method, comprising: ion exchanging a first surface of a glass article to form a first compressive stress layer extending from the first surface; ion exchanging a second surface of the glass article to form a second compressive stress layer extending from the second surface, wherein the glass article including the first compressive stress layer and the second compressive stress layer comprises a Warpage Figure of Merit of at least about 0.5 m, and an Asymmetry Figure of Merit of at least about 0.05.

The present disclosure provides in aspect (42), the method of aspect (41) further comprising heat treating the glass article.

The present disclosure provides in aspect (43), the method of aspect (41) or (42) wherein the first compressive stress layer and the second compressive stress layer are formed concurrently.

The present disclosure provides in aspect (44), the method of any of aspects (41) to (43), further comprising forming a blocking layer at the first surface of the glass article prior to ion exchanging the second surface.

The present disclosure provides in aspect (45), the method of aspect (44) wherein forming the blocking layer comprises ion exchanging the first surface with at least one of Cu, Ca, Mg, Zn, and Ti ions.

The present disclosure provides in aspect (46), the method of aspect (44) or (45) wherein the blocking layer has a depth of less than 1 μm.

The present disclosure provides in aspect (47), the method of any of aspects (44) to (46), further comprising removing the blocking layer from the glass article.

The present disclosure provides in aspect (48), the method of any of aspects (41) to (47), further comprising heat treating the glass article to form a curved glass article before ion exchanging the glass article.

The present disclosure provides in aspect (49), a method, comprising: disposing a salt on at least a portion of a first surface of a glass article; ion exchanging the glass article by heating the glass article and salt to an ion exchange temperature to produce a glass article with an asymmetric stress profile, wherein the salt comprises a solid component that is solid at the ion exchange temperature.

The present disclosure provides in aspect (50), the method of aspect (49), wherein the salt further comprises a liquid component that is liquid at the ion exchange temperature.

The present disclosure provides in aspect (51), the method of aspect (49) or (50), wherein the solid component comprises at least one of an alkali sulfate and an alkali phosphate.

The present disclosure provides in aspect (52), the method of any of aspects (49) to (51), wherein the solid component comprises at least one of tri-potassium phosphate, tri-sodium phosphate, potassium sulfate, and sodium sulfate.

The present disclosure provides in aspect (53), the method of any of aspects (49) to (52), wherein the liquid component comprises at least one alkali nitrate.

The present disclosure provides in aspect (54), the method of any of aspects (50) to (53), wherein the liquid component comprises at least one of $KNO_3$ and $NaNO_3$.

The present disclosure provides in aspect (55), the method of any of aspects (49) to (54), wherein the solid component is present in the salt in an amount of 5 wt % to 99.5 wt %.

The present disclosure provides in aspect (56), the method of any of aspects (49) to (55), wherein the solid component is present in the salt in an amount of 30 wt % to 98 wt %.

The present disclosure provides in aspect (57), the method of any of aspects (49) to (56), wherein the salt is disposed on the entirety of the first surface.

The present disclosure provides in aspect (58), the method of any of aspects (49) to (57), wherein the salt is not disposed on the center of the first surface.

The present disclosure provides in aspect (59), the method of any of aspects (49) to (58), wherein the salt is disposed only at the periphery of the first surface.

The present disclosure provides in aspect (60), the method of any of aspects (49) to (59), further comprising forming a blocking layer on a portion of the first surface prior to disposing the salt.

The present disclosure provides in aspect (61), the method of aspect (60), wherein the blocking layer comprises at least one of an alkali-free glass, $SiO_2$, and a metal.

The present disclosure provides in aspect (62), the method of aspect (60) or (61), further comprising removing the blocking layer after ion exchanging the glass article.

The present disclosure provides in aspect (63), the method of any of aspects (49) to (62), further comprising contacting the glass article with a molten salt bath.

The present disclosure provides in aspect (64), the method of aspect (63), further comprising contacting the glass article with a second molten salt bath.

The present disclosure provides in aspect (65), the method of any of aspects (49) to (64), wherein the asymmetric stress profile has an Asymmetry Figure of Merit of at least about 0.05

The present disclosure provides in aspect (66), the method of any of aspects (49) to (65), wherein the asymmetric stress profile has a Warpage Figure of Merit of at least about 0.5 m.

The present disclosure provides in aspect (67), the method of any of aspects (49) to (66), wherein the asymmetric stress profile has a Warpage Tendency of less than about one twelfth of a thickness of the glass article.

These and other aspects, advantages, and salient features will become apparent from the following detailed description, the accompanying drawings, and the appended claims.

DETAILED DESCRIPTION

Figure 1:
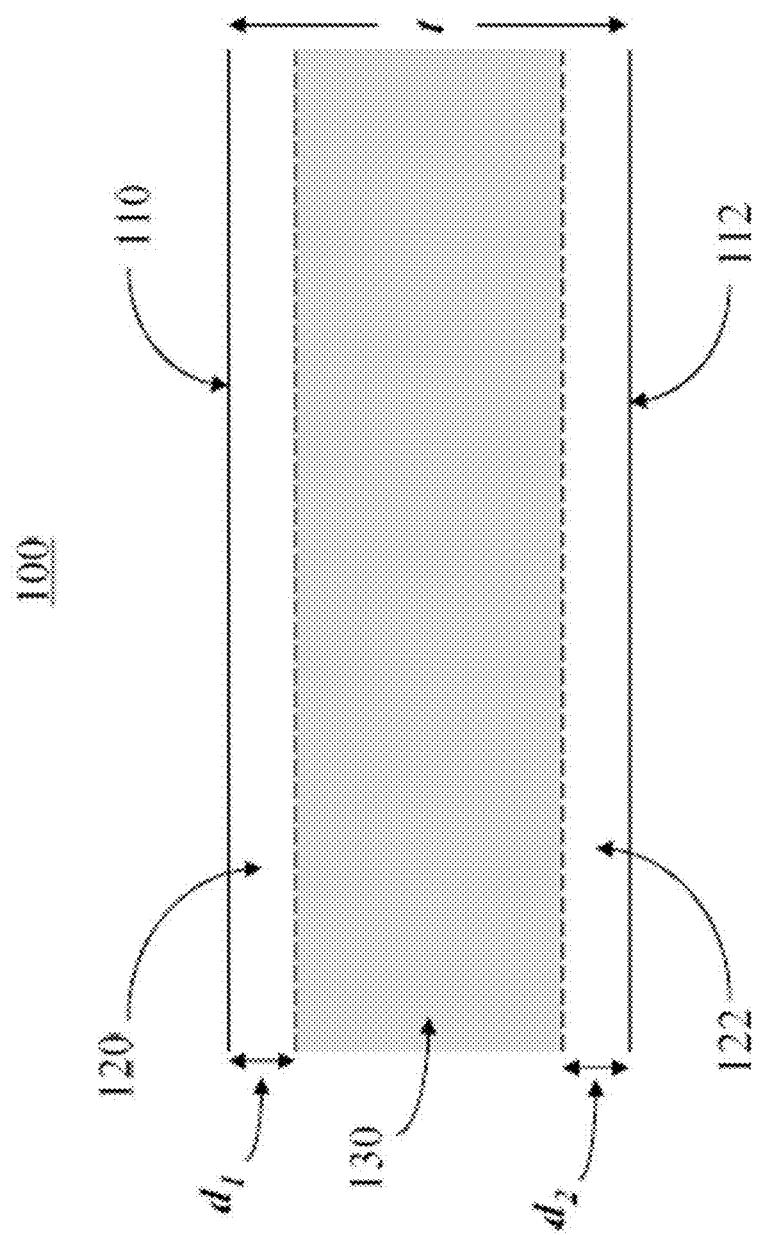
FIG. 1 is a schematic cross-sectional view of a glass article according to one or more embodiments.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. In addition, whenever a group is described as comprising at least one of a group of elements and combinations thereof, it is understood that the group may comprise, consist essentially of, or consist of any number of those elements recited, either individually or in combination with each other. Similarly, whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range as well as any ranges therebetween. As used herein, the indefinite articles "a," "an," and the corresponding definite article "the" mean "at least one" or "one or more," unless otherwise specified. It also is understood that the various features disclosed in the specification and the drawings can be used in any and all combinations.

As used herein, the term "glass article" is used in its broadest sense to include any object made wholly or partly of glass, including glass ceramics. Unless otherwise specified, all compositions of the glasses described herein are expressed in terms of mole percent (mol %), and the constituents are provided on an oxide basis. Unless otherwise specified, all temperatures are expressed in terms of degrees Celsius (° C.). The term "liquidus viscosity" refers to the viscosity of a molten glass at the liquidus temperature, wherein the liquidus temperature refers to the temperature at which crystals first appear as a molten glass cools down from the melting temperature, or the temperature at which the last crystals melt away as temperature is increased from room temperature.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. For example, a glass that is "substantially free of $K_2O$" is one in which $K_2O$ is not actively added or batched into the glass, but may be present in very small amounts as a contaminant.

The Young's modulus value recited in this disclosure refers to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

Coefficients of thermal expansion (CTE) are expressed in terms of parts per million (ppm)/° C. and represent a value measured over a temperature range from about 20° C. to about 300° C., unless otherwise specified. High temperature (or liquid) coefficients of thermal expansion (high temperature CTE) are also expressed in terms of part per million (ppm) per degree Celsius (ppm/° C.), and represent a value measured in the high temperature plateau region of the instantaneous coefficient of thermal expansion (CTE) vs. temperature curve. The high temperature CTE measures the volume change associated with heating or cooling of the glass through the transformation region. As used herein the term "softening point" refers to the temperature at which the viscosity of a glass is approximately $10^{7.6}$ poise (P), the term "anneal point" refers to the temperature at which the viscosity of a glass is approximately $10^{13.2}$ poise, the term "200 poise temperature ($T^{200P}$)" refers to the temperature at which the viscosity of a glass is approximately 200 poise, the term "$10^{11}$ poise temperature" refers to the temperature at which the viscosity of a glass is approximately $10^{11}$ poise, the term "35 kP temperature ($T^{35kP}$)" refers to the temperature at which the viscosity of a glass is approximately 35 kilopoise (kP), and the term "160 kP temperature ($T^{160kP}$)" refers to the temperature at which the viscosity of a glass is approximately 160 kP. As used herein, the term "zircon breakdown temperature" or "$T^{breakdown}$", refers to the temperature at which zircon—which is commonly used as a refractory material in glass processing and manufacture—breaks down to form zirconia and silica, and the term "zircon breakdown viscosity" refers to the viscosity of the glass at $T^{breakdown}$. The term "35 kP temperature" or "$T^{35kP}$" refers to the temperature at which the glass or glass melt has a viscosity of 35,000 Poise (P), or 35 kiloPoise (kP).

Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety. Maximum tensile stress or central tension (CT) values are measured using a scattered light polariscope (SCALP) technique known in the art.

As used herein, depth of compression (DOC) means the depth at which the stress in the chemically strengthened alkali aluminosilicate glass article described herein changes from compressive to tensile. DOC may be measured by FSM or a scattered light polariscope (SCALP) depending on the ion exchange treatment. Where the stress in the glass article is generated by exchanging potassium ions into the glass article, FSM is used to measure DOC. Where the stress is generated by exchanging sodium ions into the glass article, SCALP is used to measure DOC. Where the stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles is measured by FSM.

The depth of penetration of K+ ions ("Potassium DOL") is distinguished from DOC because it represents the depth of potassium penetration as a result of an ion exchange process. The Potassium DOL is typically less than the DOC for the articles described herein. Potassium DOL is measured using a surface stress meter such as the commercially available FSM-6000 surface stress meter, manufactured by Orihara Industrial Co., Ltd. (Japan), which relies on accurate measurement of the stress optical coefficient (SOC), as described above with reference to the CS measurement.

Referring to the drawings in general and to FIG. 1 in particular, it will be understood that the illustrations are for the purpose of describing particular embodiments and are not intended to limit the disclosure or appended claims thereto. The drawings are not necessarily to scale, and certain features and certain views of the drawings may be shown exaggerated in scale or in schematic in the interest of clarity and conciseness.

While the embodiment shown in FIG. 1 depicts a glass article 100 as a flat planar sheet or plate, the glass article may have other configurations, such as three dimensional shapes or non-planar configurations. The glass article 100 has a first surface 110 and a second surface 112 defining a thickness t. In one or more embodiments, (such as the embodiment shown in FIG. 1) the glass article is a sheet including first surface 110 and opposing second surface 112 defining thickness t. The glass article 100 has a first compressive layer 120 extending from first surface 110 to a depth of layer $d_1$ into the bulk of the glass article 100. In the embodiment shown in FIG. 1, the glass article 100 also has a second compressive layer 122 extending from second surface 112 to a second depth of layer dz. The glass article 100 also has a central region 330 that extends from $d_1$ to $d_2$. Central region 130 is under a tensile stress or central tension (CT), which balances or counteracts the compressive stresses of layers 120 and 122. The depth $d_1$, $d_2$ of first and second compressive layers 120, 122 protects the glass article 100 from the propagation of flaws introduced by sharp impact to first and second surfaces 110, 112 of the glass article 100, while the compressive stress minimizes the likelihood of a flaw penetrating through the depth $d_1$, $d_2$ of first and second compressive layers 120, 122. The depths d1 and d2 may be equal to one another or different from one another, and correlate to the depth of compression (DOC) of the compressive layers.

Figure 2:
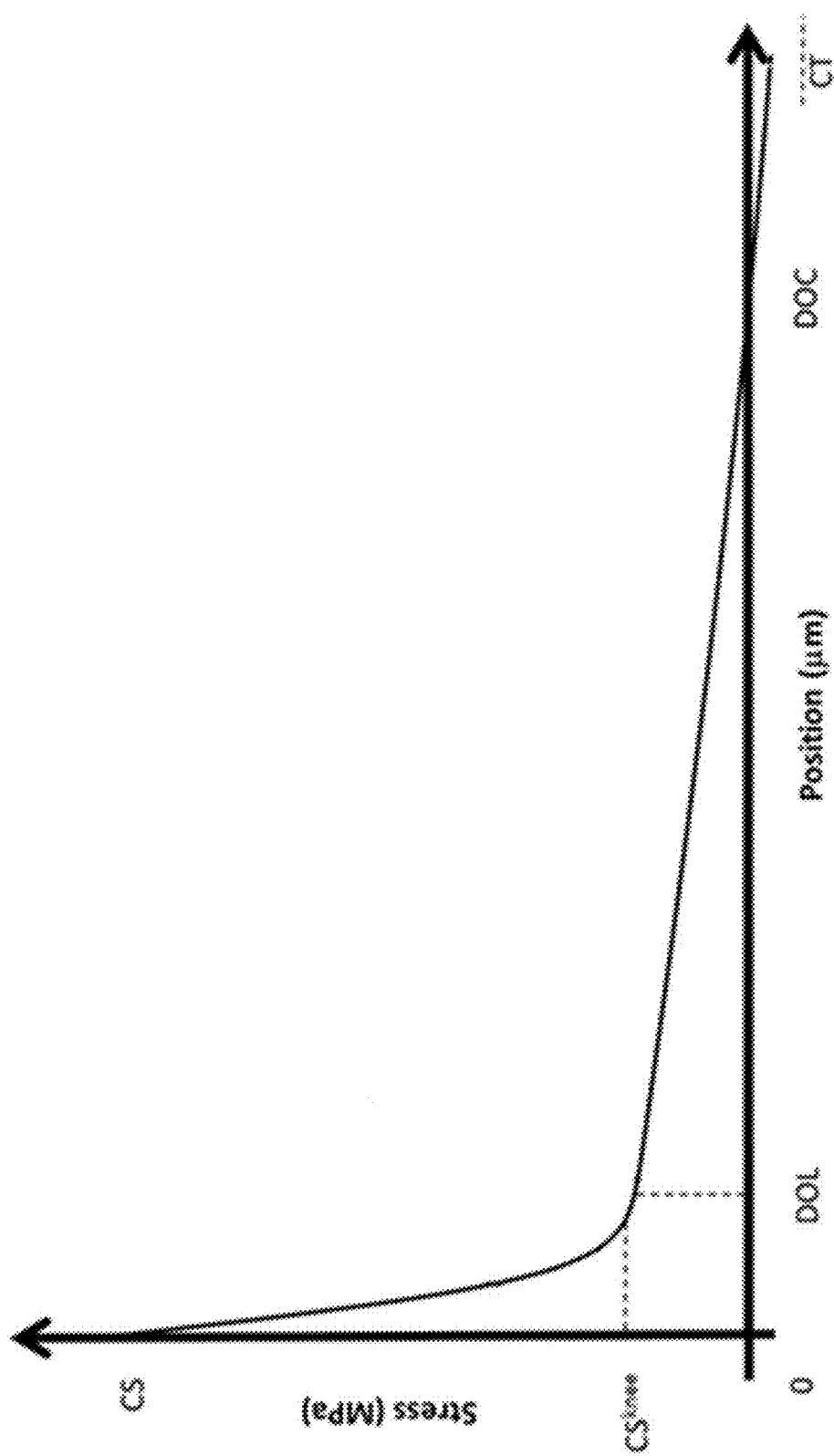
FIG. 2 is a representation of stress as a function of depth for a theoretical ion exchanged glass article.
Figure 9:
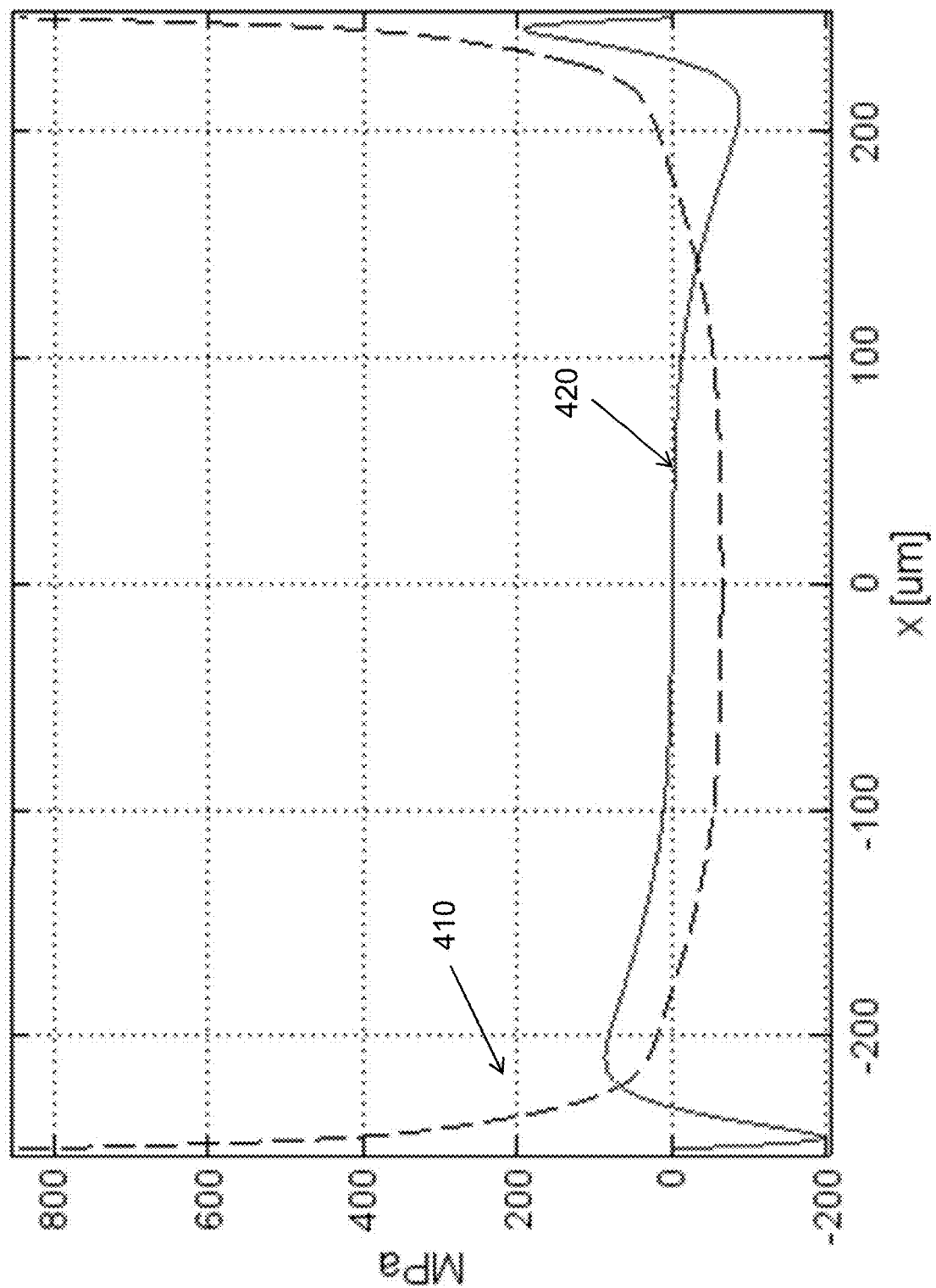
FIG. 9 is a representation of the symmetric and antisymmetric components of the free asymmetric stress profile of FIG. 6.

FIG. 2 illustrates a theoretical stress profile for a portion of an ion exchanged glass article. The illustrated stress profile in FIG. 2 includes a compressive stress spike at the surface and a deeper diffusion region. As shown in FIG. 2, compressive stress at a knee of the stress profile (CSk) is the compressive stress at the transition between the spike portion of a stress profile and the deeper diffusion region of the stress profile. The DOC and potassium DOL are also shown in FIG. 9, with the potassium DOL labeled simply as DOL.

Described herein are glass articles with asymmetric stress profiles that exhibit low degrees of warp after undergoing strengthening. The asymmetric stress profiles allow the surfaces of the glass article to exhibit different strengthening characteristics to address the predominant failure mode at each surface, while also minimizing undesired warp in the glass article.

As an example, a glass article that is employed as a cover glass on a consumer electronic device has a front surface (exposed surface), a back surface, and an edge surface. During use, the cover glass experiences different service stresses on the front surface, the back surface, and the edge surface.

The predominant failure mode on the front surface is typically failure due to the introduction of a deep flaw and the exposure of the deep flaw to tension. The deep flaw may be exposed to tension when the deep flaw extends to a depth of a tensile stress layer or by flexing of the glass article. The predominant failure mode on the front surface may be addressed by a deep depth of compression to prevent an introduced flaw from being subjected to tension.

The predominant failure mode on the back surface is typically overstressing a pre-existing shallow flaw. The shallow flaw is usually shallower than 10 μm, and most often shallower than 5 μm. The overstress often exceeds a tensile stress of several hundred megapascals (MPa), such as greater than about 500 MPa. The overstress may be the result of a flexing of the glass article during use. The predominant back surface failure mode may be addressed by a high compressive stress spike on the back surface, such as a spike having a compressive stress higher than about 500 MPa and a spike depth exceeding about 8 microns.

The edge surface of the cover glass is exposed in some applications, and in other applications is protected by a bezel. The edge surface may be subjected to very substantial stresses during a drop on a relatively hard surface. Thus, a high surface compressive stress and high compressive stress at depths of several microns may also reduce the probability of fractures originating from the edge surface of the cover glass.

Due to the difference in the strengthening characteristics that address the predominant failure modes of the front and back surface. The different strengthening characteristics may be imparted by forming an asymmetric stress profile across the thickness of the glass article, which provides improved performance when compared to a symmetric stress profile that does not fully address at least one of the front and back surface predominant failure modes. The asymmetric profile may have a higher depth of compression (DOC) and higher stress at large depths on the front surface, and a higher surface compressive stress (CS) and higher compressive stress in the first approximately 5-10 microns below the surface on the back surface. The edge of the cover glass may also have a higher surface compressive stress and a higher stress in the first approximately 10 microns below the surface.

An asymmetric stress profile may cause a glass article to warp, which is problematic for assembly, and also can result in stress changes during assembly that could negatively affect the strength of the glass article during use. A method is described herein that enables reduction of warp resulting from tempering or strengthening to negligible levels by proper design of an asymmetric stress profile that also provides the desired strengthening characteristics at the front surface and back surface of the glass article.

A tempered or chemically strengthened glass article that is in a steady mechanical state, not contracting or expanding, and not bending or warping, satisfies a force balance and a torque balance. A force balance requires the total of integrated compressive stress over the compression zones across the thickness equal the total of integrated tensile stress over the tension zones across the thickness, by absolute value, as illustrated in the following equation (1):

$$\left| \sum \int_{\sigma>0} \sigma dx \right| = \left| \sum \int_{\sigma<0} \sigma dx \right|$$

where σ is the stress and x is the position in the glass article along the thickness, with x=0 at the mid-plane (center) of the glass article. This is equivalent to setting the integral of the stress over the thickness equal to zero, as shown in the following equation (2):

$$\int_{-0.5t}^{0.5t} \sigma(x) dx = 0$$

A torque balance indicates that the stress profile of the glass article does not induce warp. A torque balance requires that the integral of local stress times local arm length across the thickness is zero, as illustrated in the following equation (3):

$$\int_{-0.5t}^{0.5t} x\sigma(x) dx = 0$$

In Eq. (3), x further represents the local arm length for calculating the specific torque per unit depth change produced by the local stress.

Stress profiles that are symmetric with respect to x do not cause profile induced warp. For example, in the ion exchange of flat specimens where the glass article is immersed in a molten salt and exchanged to the same surface compression and same depth of layer all around the article negligible warp usually results.

If the stress profile is asymmetric, it may satisfy force-balance Eq. (2) during and after ion exchange, but if the zero-torque condition is not satisfied then the glass article will undergo stress profile induced warp. Generally, the more asymmetric the stress profile, the greater the warp induced by the stress profile. At the same time, asymmetric profiles with a greater degree of asymmetry may produce greater benefits in terms of reduced probability of fracture by allowing for a more substantial increase in the DOC and stress at large compression depths on the front surface coupled with a larger compressive stress on the back surface.

To find a solution to this conflict, the generally asymmetric profile may be decomposed into two components—a symmetric component ($\sigma_s(x)$) and an anti-symmetric component ($\sigma_a(x)$) according to the following equation (4):

$$\sigma(x) = \sigma_s(x) + \sigma_a(x)$$

where $\sigma_s(x)$ is defined by the following equation (5):

$$\sigma_s(x) = \frac{1}{2}[\sigma(x) + \sigma(-x)]$$

and where $\sigma_a(X)$ is defined by the following equation (6):

$$\sigma_a(x) = \frac{1}{2}[\sigma(x) - \sigma(-x)]$$

The anti-symmetric component is responsible for tuning the properties on the front surface and the back surface toward the specific requirement for said front or back surface, using the symmetric profile as a starting point. An Asymmetry Figure of Merit (AFOM) for the asymmetric profile for the purposes of improved mechanical performance under asymmetric wear-and-tear service stresses is defined by using the integrals over the thickness of the absolute value of stress in the anti-symmetric and the symmetric component as shown in the following equation (7):

$$AFOM = \frac{\int_{-0.5t}^{0.5t} |\sigma_a(x)| dx}{\int_{-0.5t}^{0.5t} |\sigma_s(x)| dx}$$

A stress profile is considered substantially asymmetric if the AFOM is greater than about 0.05, such as greater than about 0.07, about 0.1, or more. Furthermore, substantially asymmetric profiles providing major advantages for improving strength simultaneously on both the front and the back surfaces of the glass (relative to the respective dominating failure modes on the front and the back surfaces) may have an AFOM greater than about 0.2, such as greater than about 0.3, about 0.4, about 0.5, about 0.6, or more.

The symmetric component of the stress profile does not contribute torque in Eq. (3), and does not cause profile induced warp. Hence, the entire warp problem accompanying the introduction of the asymmetric stress profile is related to the anti-symmetric component, which is also desirably large in order to reap the benefits of the substantially asymmetric profile. Preferable stress profiles which have a large anti-symmetric component, but which nevertheless do not cause significant stress profile induced warp may be defined as described below. An asymmetric stress profile with a large anti-symmetric component that does not produce significant stress profile induced warp is generally unexpected because the anti-symmetric component is entirely responsible for the occurrence of warp.

The bending moment of the symmetric component of the profile is zero, because it is equivalent to the integral of an anti-symmetric function (xσ (x)) in a symmetric interval. Thus, the 2-dimensional bending moment per unit width of the glass article is entirely due to the anti-symmetric component of the profile, as shown in the following equation (8):

$$M_{uw} = \int_{-0.5t}^{0.5t} x\sigma_a(x)dx = 2\int_0^{0.5t} x\sigma_a(x)dx$$

For the glass article to be perfectly flat, the bending moment of the anti-symmetric component is 0, which requires that the anti-symmetric profile component have both compressive and tensile stress regions in each half of the sample. Thus, in one embodiment, the stress profile has an anti-symmetric component that has regions of both compressive and tensile stress in each half of the thickness.

In pure bending in the 2-dimensional model (where bending is only allowed in 1-dimension), the bending moment (M) produces a radius of curvature (ρ) as shown in the following equation (9):

$$\rho = \frac{E}{M}\int_A x^2 dA = \frac{EI}{M}$$

where E is the Young's modulus of the glass article which may be provided in Pascals, A is the cross-sectional area of the article under bending which may be provided in m$^2$, and I is a moment of inertia which may be provided in m$^4$, such that the radius of curvature is provided in meters.

In the illustrative case of 2-dimensional bending of a glass article in sheet form, having a width (w) and a thickness (t), Eq. (9) evaluates to give the moment of inertia (I) as the following equation (10):

$$I = w\frac{(0.5t)^3 - (-0.5t)^3}{3} = \frac{wt^3}{12}$$

Hence the relationship between the radius of curvature (ρ) and the bending moment (M) is given by the following equation (11):

$$\rho = \frac{Ewt^3}{12M}$$

A glass article in sheet form having a length (L) of 100 mm may desirably have a warpage height (H) measured over the length (L) not exceeding 0.1 mm, and desirably will have a radius of curvature not less than 12.5 m, with the relationship further illustrated by the following equation (12):

$$\rho \geq \frac{L^2}{8H} 12500 \text{ mm} \equiv 12.5 \text{ m}$$

In some embodiments, L may be selected as the maximum dimension of the glass article. In other embodiments, L may be selected as the dimension along an edge of the glass article.

In practice, the warpage of the glass article may have a complicated shape, rather than a simple spherical or cylindrical shape, and a substantially smaller radius of curvature may be acceptable locally. Thus, a maximum acceptable radius of curvature that is induced by the asymmetric stress profile may be equal to 1 m (1,000 mm). In some embodiments, the peripheral region of the glass article within 3 mm of the edge may have a monotonically decreasing thickness moving toward the edge, which may be referred to as a 2.5D shape. In some embodiments, such as when the edge shape is asymmetric with respect to the mid-plane of the glass sheet, the presence of such a 2.5D edge may produce non-negligible warpage induced by an interaction of the asymmetric edge shape and the stress profile. The major component of such profile induced warpage may be selected to partially or substantially cancel the warpage introduced by using an asymmetric stress profile in the interior of the glass sheet. In such embodiments, an asymmetric profile that has a bending moment (M) that corresponds to an even smaller radius of curvature of 0.5 m may be acceptable.

In practice, some glass articles may have a designed-in curvature, and simply measuring the radius of curvature of the glass article may not represent the curvature introduced by the asymmetric stress profile. The curvature attributable to the introduction of the asymmetric stress profile may be added with the curvature present in the glass article prior to the introduction of the stress profile. The curvature present in the glass article prior to the introduction of the stress profile is the inverse of the radius of curvature (κ) for a glass article that is substantially warp free after the introduction of the stress profile, and the following equation (13) provides the inverse of the radius of curvature that may be cancelled out by the stress profile induced radius of curvature:

$$\kappa \leq \frac{8H}{L^2}$$

Asymmetric stress profiles having a corresponding curvature not exceeding 2 m$^{-1}$ are advantageous, particularly in cases when glass articles having a 2.5D or 3D shape are employed. Additionally, for easier assembly and higher process yields, it is preferable that the stress-profile-induced curvature not exceed 1 m$^{-1}$, such as not exceeding 0.5 m$^{-1}$, or not exceeding 0.1 m$^1$.

The 2-dimensional bending model allows these preferred ranges for stress profile induced curvature to be associated with approximate ranges for the bending moment of the stress profile. It is possible that actual warp of the sheet may exceed the warp calculated by the illustrative 2-dimensional model with bending in only 1-dimension, such as when the stress in the glass article is present in both dimensions in the plane of the sheet. However, the illustrative model allows the range of preferred stress profile parameters to be defined with relative simplicity.

Based on Eq. (11), the bending moment that causes a radius of curvature (ρ) for a glass article in sheet form is illustrated in the following equation (14):

$$M = \frac{Ewt^3}{12\rho} \equiv \frac{Ewt^3}{12}\kappa$$

Thus, the bending moment per unit width that produces a radius of curvature (ρ) or inverse radius of curvature (κ) is illustrated in the following equation (15):

$$M_{uw} = \frac{M}{w} = \frac{Et^3}{12\rho} \equiv \frac{Et^3}{12}\kappa$$

Further, a Warpage Figure of Merit (WFOM) is defined which is maximized when the warpage is minimized. For the sake of simplicity, the WFOM is defined in reference to a 2-dimensional bending model. The WFOM for the bending moment of the asymmetric stress profile can be associated with the radius of curvature produced by an asymmetric stress profile ($\rho_{asym}$) that induces a unit width bending moment in a 1-dimensional bending of a glass article in sheet form as illustrated in the following equation (16):

$$WFOM \equiv |\rho_{asym}| = \left|\frac{Et^3}{12M_{uw}}\right|$$

In some embodiments, the WFOM is greater than about 0.5 m, such as greater than about 1 m, about 2 m, about 10 m, or more. In some embodiments, the change in radius of curvature induced by the stress profile may be used as a direct estimate of the WFOM.

By further evaluating Eq. (16) the bending moment per unit width may be defined as illustrated in the following equation (17):

$$|M_{uw}| = 2\int_0^{0.5t} x\sigma_a(x)dx \leq \frac{Et^3}{12|\rho_{asym}|} \equiv \frac{Et^3}{12WFOM}$$

The ideal avoidance of stress profile induced warpage, when edge effects are ignored, occurs when WFOM is infinite. Thus, an ideal condition for minimizing warpage would be where the following equation (18) is true:

$$\int_0^{0.5t} x\sigma_a(x)dx = 0$$

Stated differently, the anti-symmetric component of the stress profile is moment-balanced on either side of the mid-plane. For minimizing warpage and operational complexity, asymmetric profiles having a substantially internally balanced anti-symmetric component have advantages described by the following equation (19):

$$\left|\int_0^{0.5t} x\sigma_a(x)dx\right| \leq WSF\int_0^{0.5t} x|\sigma_a(x)|dx$$

where WSF is a Warpage Suppression Factor. In some embodiments, the WSF is less than about 0.3, such as less than about 0.2, about 0.1, about 0.05, or less.

Acknowledging that a thicker glass article requires a larger moment to produce warp, Eq. (17) may be employed to define a range of preferred asymmetric stress profiles that produce similar low levels of warp for different thicknesses. A thickness independent dimensionless Warping Tendency (WT) is defined by the following equation (20):

$$WT = \frac{1}{ET^2}\int_0^{0.5t} x\sigma_a(x)dx \leq \frac{t}{24|\rho_{asym}|} \equiv \frac{t}{24WFOM}$$

In some embodiments, WT is less than about $$\frac{t}{12},$$

wherein the thickness (t) of the glass article is given in meters. In some embodiments, WT is less than about $$\frac{t}{24},$$

such as less than about $$\frac{t}{48},$$

about $$\frac{t}{240},$$

or less.

Figure 3:
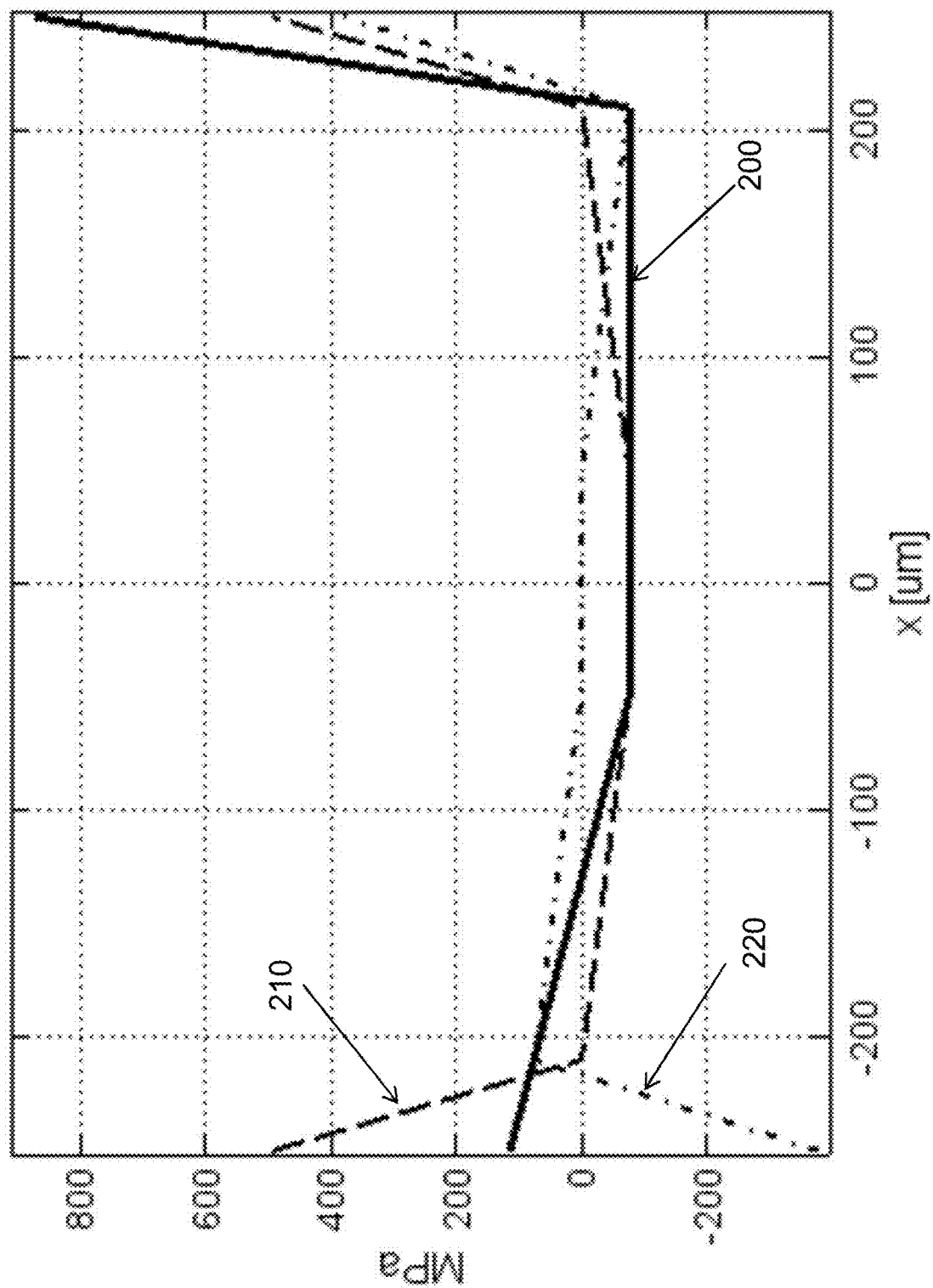
FIG. 3 is a representation of stress as a function of depth for a theoretical ion exchanged glass article with an asymmetric stress profile.

To further illustrate the above described concepts, an exemplary asymmetric stress profile is depicted in FIG. 3. In the example illustrated in FIG. 3, the thickness of the glass article is 0.5 mm, but the profile can be scaled horizontally to any thickness. The stress profile may also be scaled vertically to any stress, as long as the entire profile is multiplied by a non-zero constant. FIG. 3 also provides a clear depiction of the decomposition of the asymmetric stress profile 200 into a symmetric component 210 and anti-symmetric component 220. The asymmetric stress profile 200 has a substantially different front depth of compression ($DOC_f$=120 microns) than back depth of compression ($DOC_b$=37 microns), a substantially higher back-side compressive strength ($CS_b$=874 MPa) than front side compressive stress ($CS_f$=114 MPa). The glass article with asymmetric stress profile 200 has no stress profile induced warp, with the WFOM approaching infinity. The front-side potassium depth of layer ($DOL_f$=200 m, 40% of t) is 5 times greater than the back-side potassium depth of layer ($DOL_b$=40 μm, 8% of t). The AFOM of the asymmetric stress profile 200 of FIG. 3 is 0.64, and the WFOM is substantially infinite (e.g., on the order of $10^{17}$ m).

The asymmetric stress profile 200 may be obtained by ion exchanging K for Na in an alkali aluminosilicate glass including $Na_2O$ and substantially no $K_2O$ in the base glass composition. The front surface may be exchanged at high temperature (450-460° C.) in a bath having $NaNO_3$ and $KNO_3$, where the $NaNO_3$ concentration exceeds the $KNO_3$ concentration. For example, the bath may contain about 80 wt % $NaNO_3$ and about 20 wt % $KNO_3$. In one embodiment, the front surface may be ion exchanged by spray-coating $KNO_3$ on the front surface of the glass and then ion exchanging for a long time (10-48 hours) at a temperature of greater than 440° C., with no $KNO_3$ on the back side. In another embodiment, the back surface is blocked from ion exchange during the ion exchange of the front surface using an alkali-free coating that resists alkali penetration, such as spin-on glass or sputtered $SiO_2$. After the ion exchange of the front surface, the the back surface is ion exchanged in pure $KNO_3$ at 420° C. for about 2 hours to achieve a potassium DOL of about 40 um (as measured by FSM- 6000), while the front side does not undergo substantial ion exchange. To prevent substantial ion exchange of the front surface, blocking on the front side can be partial, such as by using a blocking layer that is either very thin or that has a small amount of alkali that allows for a limited flux of alkali through the coating, or substantially complete. In one embodiment, the blocking layer may be a spin-on glass having less than about 2 mol % alkali oxide, such as less than about 1.5 mol % alkali oxide. The profile on the front side changes only slightly during this second step, because of the relatively low temperature and short time.

As shown in FIG. 3, the compression depth on the front surface is very high, about 24% of the thickness. This deep depth of compression on the front surface of the advantages of the asymmetric stress profile. The asymmetric stress profile has a relatively narrow tension zone and a limited center tension that make the glass article non-frangible. Another advantage of the asymmetric stress profile 200 is that the stress at depth of 10 μm from the back surface is very high, exceeding 600 MPa, and the stress at a depth of 5 μm on from the back surface exceeds 700 MPa. In comparison, pre-existing symmetric dual ion exchange (DIOX) stress profiles in glass articles have a stress at 5 μm that is less than 450 MPa, or less than 350 MPa. Another benefit of the asymmetric stress profile 200 is a substantial level of compressive stress (66 MPa) at a large depth (50 μm, 10% of t) from the front surface, and a substantial level of compressive stress (43 MPa) at an even larger depth (75 μm, 5% of t).

Figure 4:
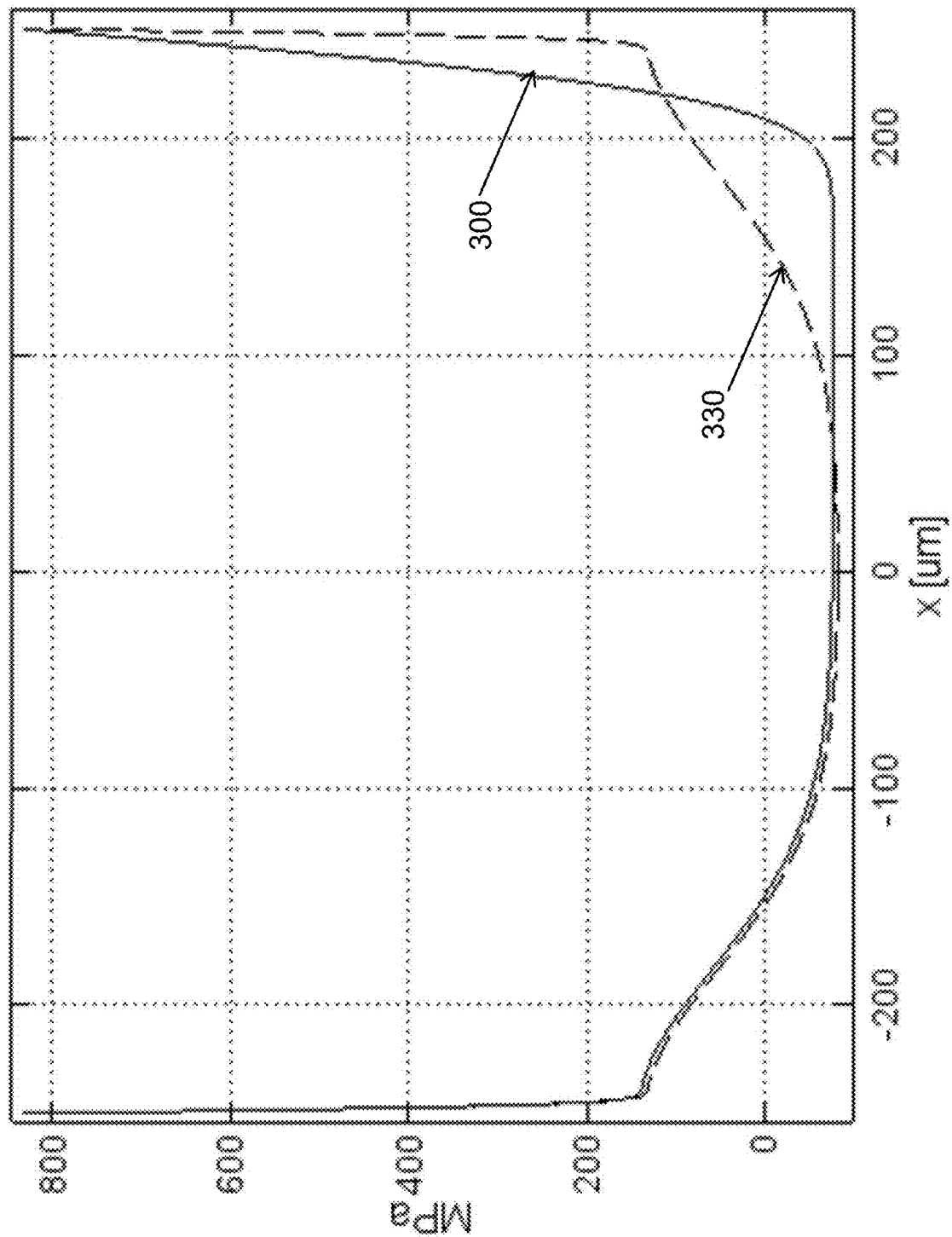
FIG. 4 is a representation of stress as a function of depth for a theoretical ion exchanged glass article with a warp free asymmetric stress profile.

A second exemplary asymmetric stress profile 300 is shown in FIG. 4. The asymmetric stress profile includes a deep compressive-stress layer extending between the bottom of a surface compression spike and a depth of compression (DOC) on the front surface, and a back surface stress profile that is characteristic of single-step ion-exchange profiles. The asymmetric stress profile 300 was selected by a numerical simulation of a multi-step ion-exchange and selected to produce a force balance.

The asymmetric stress profile 300 was obtained in a 0.5 mm thick glass article by front surface deep K ion exchange, a subsequent heat treatment, followed by a back surface ion exchange of concentrated K, and then a both surface short ion exchange of concentrated K to produce a compressive stress spike. The front surface was ion exchanged at 450° C. for about 12 hours in a bath having 38±3 wt % NaNO$_3$, the rest being KNO$_3$, resulting in a surface compressive stress of about 300 MPa and a FSM-reported DOL of about 125 μm. Then the sample was subjected to a heat treatment at 450° C. for about 4 hours, resulting in a half-bell-shaped profile on the front surface, with the front surface CS undergoing a reduction to about 150-170 MPa. In the next step, the back surface was ion exchanged in a bath containing 99-100 wt % KNO$_3$ and 0-1 wt % NaNO$_3$ at 420° C. for about 2 hours. At the same time the front surface experiences additional diffusion due to the associated thermal cycle, further reducing the front surface CS to about 140 MPa. Finally, the entire glass article was immersed in a bath containing 0-1 wt % NaNO$_3$ and 99-100 wt % KNO$_3$ at 390° C. for about 3-6 minutes to form a shallow compressive stress spike on the front surface, while at the same time producing a minor increase in the back surface DOL. In some embodiments, a deeper front spike may also be achieved, such as by using a longer spike time, and also increasing the duration of the heat treatment step after the initial front surface ion exchange to help maintain flatness when using a deeper compressive stress spike.

A symmetric stress profile 330 is also shown in FIG. 4. The symmetric stress profile 330 was obtained by subjecting the entire glass article (both front and back surfaces) to the same ion exchange and thermal treatment steps as the front surface of the asymmetric profile. As shown in FIG. 4, the back surface and the edge of a sample having the asymmetric profile will be protected by a layer having high surface compressive stress of about 830 MPa, an FSM-reported DOL of about 47 um, and a back surface DOC of 41.8 μm. The rate of decrease of compressive stress as a function of depth on the back surface is a relatively low 29 MPa/μm, despite the high CS, allowing for a high compressive stress of greater than about 650 MPa at a depth of 5 μm, and greater than about 500 MPa at a depth of 10 μm. This high level of compressive stress below the back surface renders the back surface and the edge of the glass article very strong against fracture initiated from relatively shallow flaws, such as those less than about 10 μm deep. This feature of the asymmetric 300 renders the glass article better protected against overstress failures in comparison with a glass article having the symmetric profile 330. The front surface of the asymmetric stress profile 300 has a 4% higher front DOC than the symmetric stress profile 330, and a compressive stress that is about 8 MPa higher over the entire compression zone. This represents a compressive stress increase of 6% at the depth of the bottom of the front surface spike (about 10 um), and a progressively higher percentage of compression stress increase at larger depths up to the front surface DOC.

Figure 5:
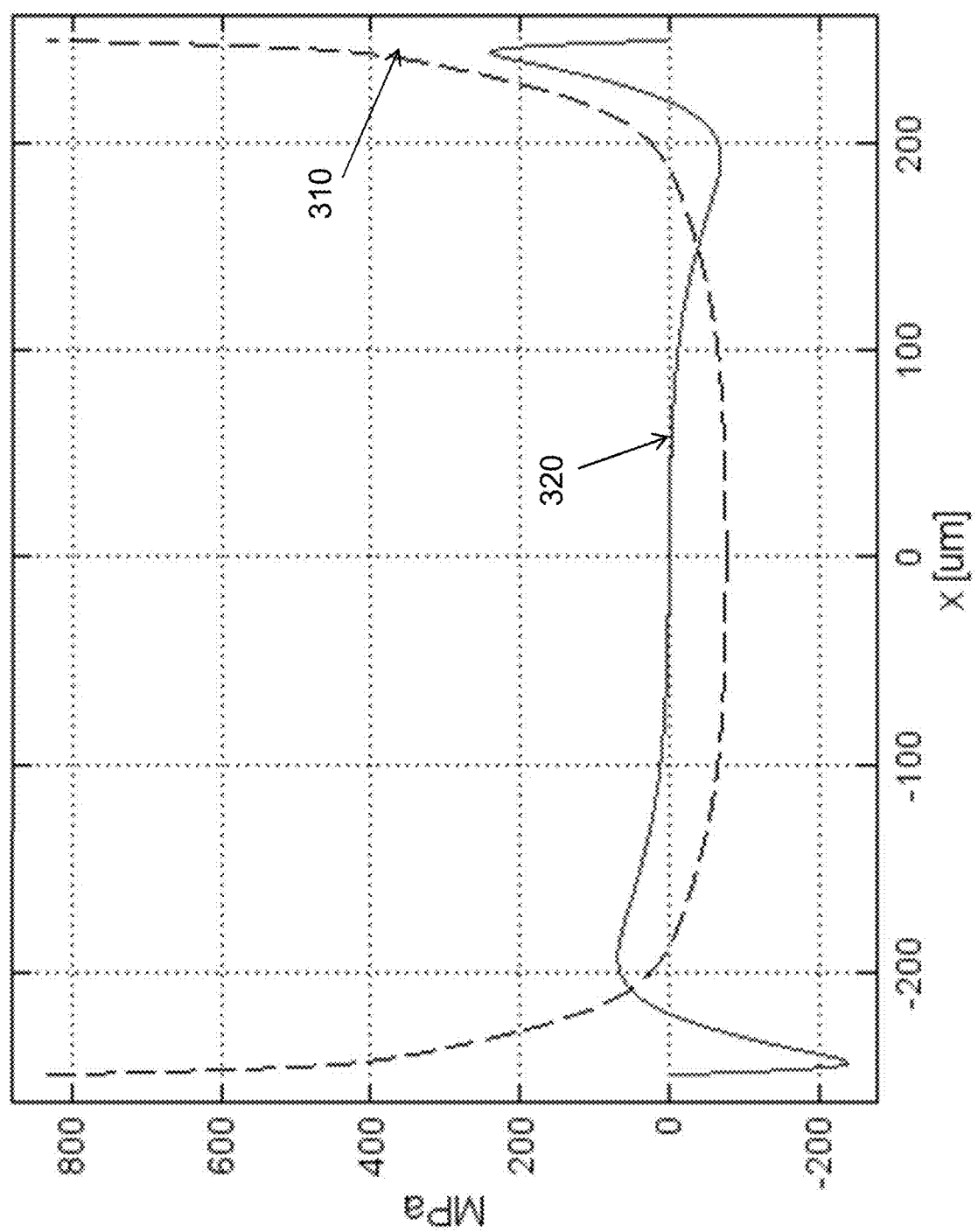
FIG. 5 is a representation of the symmetric and antisymmetric components of the warp free asymmetric stress profile of FIG. 4.

The symmetric component 310 and the anti-symmetric component 320 of the moment-balanced asymmetric stress profile 300 are shown in FIG. 5. The AFOM for the asymmetric stress profile 300 calculated from Eq. (7) is 0.41. In this specific numerical example, the bending moment per unit width M$_{uw}$ is calculated to be −3.35e$^{-4}$ mm$^2$ MPa, the Young's modulus is 68 GPa (68,000 MPa), and from Eq. (16) the WFOM is:

$$WFOM = \left|\frac{Et^3}{12M_{uw}}\right| = \left|\frac{68 \times 10^3 \times 0.5^3}{12 \times (-3.35e^{-4})}\right| = 2.1 \times 10^6 \text{ mm} \equiv 2{,}100 \text{ mm}$$

The asymmetric stress profile 300 has a dimensionless Warping Tendency:

$$WT = \frac{0.5 \times 10^{-3}}{24 * 2{,}100} = 9.9 \times 10^{-9}$$

Figure 6:
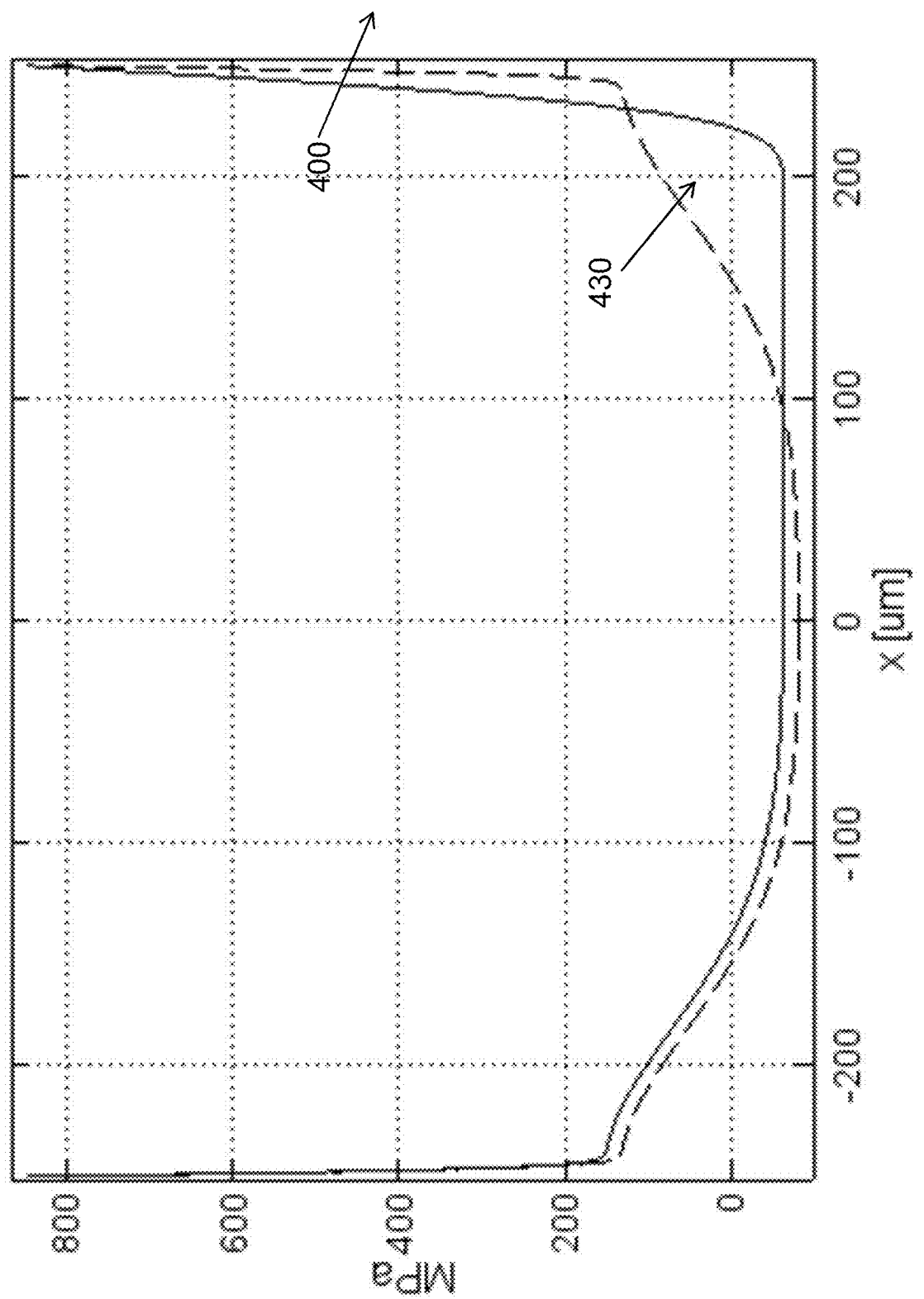
FIG. 6 is a representation of stress as a function of depth for a theoretical ion exchanged glass article with an asymmetric stress profile to which a spherical curvature was imparted prior to ion exchange.

An asymmetric stress profile 400 is illustrated in FIG. 6 with the aid of a numerical simulation. The asymmetric stress profile includes an additional, auxiliary anti-symmetric component that provides a separate contribution to the AFOM. This auxiliary anti-symmetric component is achieved by imparting a warp to the shape of the glass sheet prior to the ion exchange process, where the imparted warp is measured relative to the final desired shape of the glass article. For example, if the final desired shape of the sheet is substantially flat (e.g., having a radius of curvature exceeding several meters, ideally exceeding ten or fifteen meters), then the auxiliary anti-symmetric component is obtained by warping the sample prior to ion exchange in a manner that produces an anti-symmetric component whose first moment as described in Eq. (8) has the same magnitude and opposite sign as the first moment of the anti-symmetric component of the ion exchange induced stress when the glass article is constrained to be flat. Similarly, the imparted pre-ion exchange warp has an opposite sign and about the same magnitude as the warp that the part would acquire if provided the asymmetric profile due to ion exchange alone and was allowed to change shape.

The auxiliary anti-symmetric component of the stress profile was obtained by imparting a spherical curvature to the glass article by heat-treatment in a mold with spherical curvature at a temperature above 500° C. (for example, 560° C. for 5 hours), such that the front surface of the article has a concave curvature. The front surface of the stress profile is obtained using deep ion exchange (potassium DOL=125 um, as measured by FSM-6000), followed by a heat treatment, a second heat treatment conducted simultaneously with a high concentration ion exchange of the back surface, and then a two-sided concentrated ion exchange to form a 6 um deep spike on the front surface. The back surface stress profile has a total potassium DOL of 30 um (as measured by FSM-DOL) and a high surface CS of 847 MPa. A symmetric stress profile 430 obtained using a two-sided ion exchange under the same conditions as the front surface of the asymmetric stress profile sample, then a heat treatment having the same total diffusion as the two heat treatments of the front surface of the asymmetric stress profile sample, and finally the same spike having a 6 um DOL. Compared to the symmetric stress profile 430, the asymmetric stress profile 400 has a substantially deeper region of high compression (>400 MPa) on the back surface, a substantially higher front surface depth of compression (a gain of 13 um or 13%), and a higher compressive stress in the front surface compression zone between the compressive stress spike and the DOC (a gain of 19 MPa or >14%). As a result of this increase, the knee compressive stress (CSk) at the bottom of the compressive stress spike on the front surface is increased from about 131 MPa for the symmetric stress profile 430 to about 150 MPa for the asymmetric stress profile 400.

Figure 7:
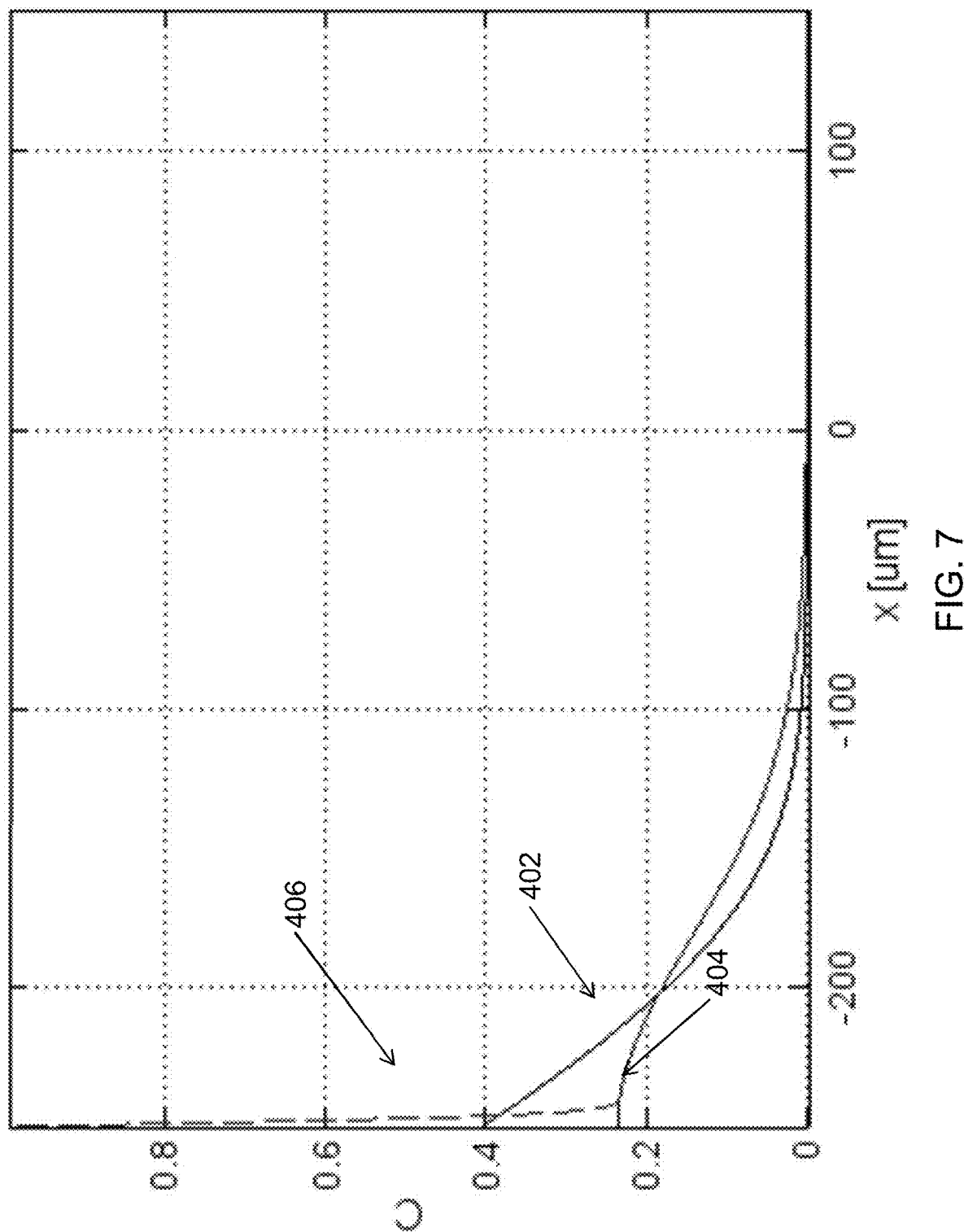
FIG. 7 is a representation of the evolution of the normalized concentration profile of the theoretical ion exchanged glass article of FIG. 6 at various steps in the ion exchange process.

FIG. 7 illustrates the evolution of the front surface normalized concentration profiles during the ion exchange process. Note that concentration is normalized in this example such that ion exchange induced stress when the part is constrained to a flat geometry post-ion exchange is 1,000 MPa when the normalized concentration is 1, and the stress is assumed to be proportional to the local value of the normalized concentration. The concentration profile is not restricted to any particular pair of inter-diffusing ions. In one embodiment, the concentration profile may be obtained by exchanging sodium ions from the glass for potassium ions. As shown in FIG. 7, following the front surface ion exchange step the front surface stress profile 402 extends from the front surface at with C=0.403 and has an FSM DOL of 125 um. The stress profile 404 of the front surface after the combined heat treatment steps extends from the front surface at C=0.235, and the stress profile 406 after the application of the two-sided compressive stress spike are also shown in FIG. 7. The concentration profile developed on the back side is not shown.

Figure 8:
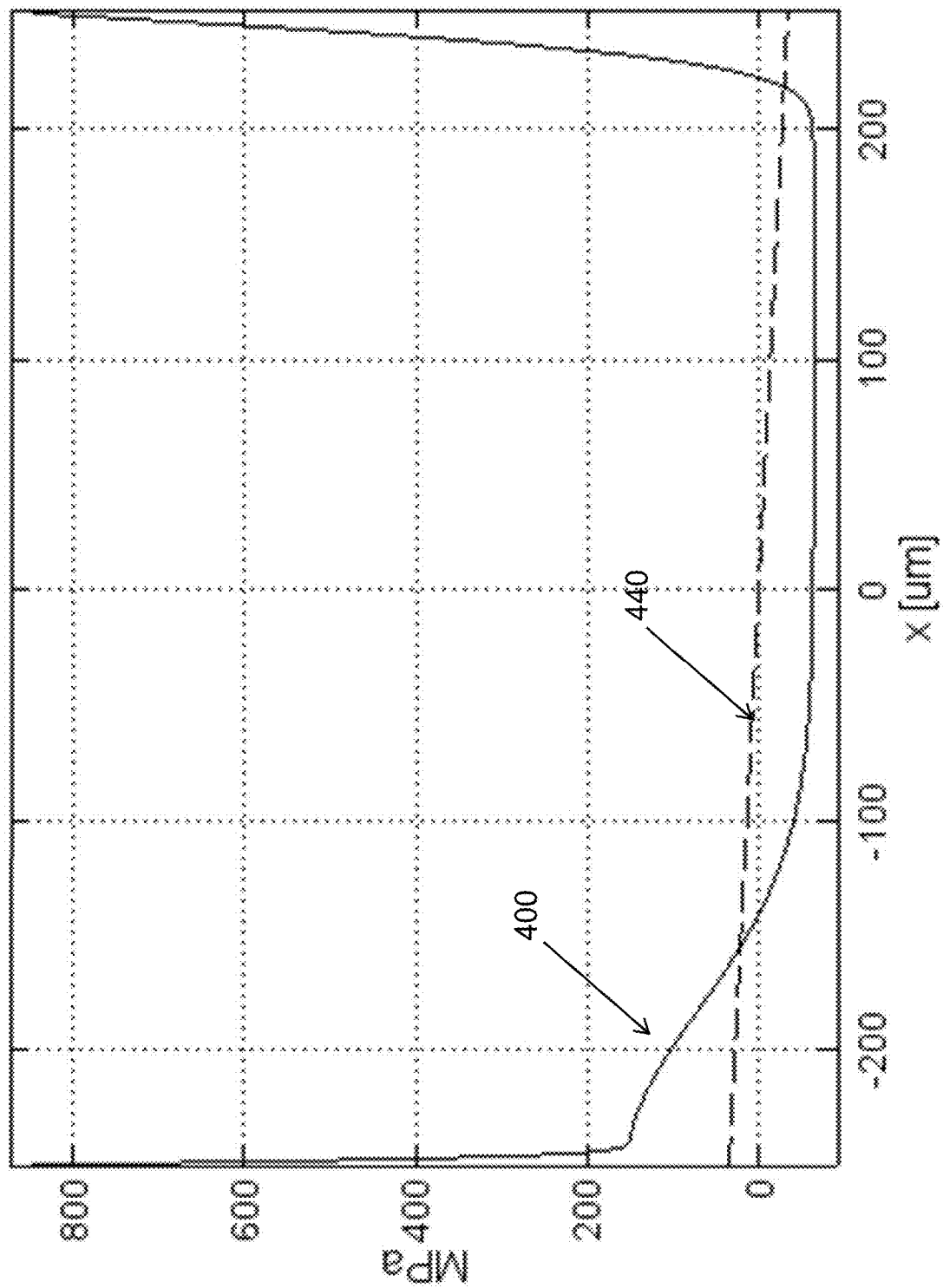
FIG. 8 is a representation of the anti-symmetric component of the asymmetric stress profile of FIG. 6 and the incorporated auxiliary component obtained by imparting a spherical curvature to the glass article prior to ion exchange.

The asymmetric profile 400 of FIG. 4, along with the auxiliary anti-symmetric component obtained by pre-warping the sample 440 is shown in FIG. 8. FIG. 9 illustrates the symmetric component 410 and the anti-symmetric component 420 of the asymmetric profile 400. The exemplary stress profiles shown in FIGS. 3-9 may be realized for the glass composition described in Example 1 below.

The warpage height of a glass article may be measured by profilometer or flatmaster system. The warpage height is the height to which the glass article extends from a flat plane, as measured along the maximum dimension of the glass article. For example, the maximum dimension of a square article may be a diagonal line extending along a major surface of the glass article between two corners of the glass article. In some embodiments, the glass article has a warpage height of less than 1% of the maximum dimension of the glass article, such as less than 0.1% of the maximum dimension of the glass article.

In some embodiments, the glass article may have a ratio of a front depth of compression to a back surface depth of compression of at least about 1.5:1, such as at least about 2:1, about 2.5:1, about 3:1, about 3.2:1, or more. In some embodiments, the glass article may have a front surface potassium depth of layer to back surface potassium depth of layer of at least about 3:1, such as at least about 3.5:1, about 4:1, about 4.5:1, about 5:1, or more. In some embodiments, the glass article may have a front surface maximum compressive stress to a back surface maximum compressive stress ratio of less than about 1:3, such as less than about 1:4, about 1:5, about 1:6, about 1:7, or less.

In another embodiment, an auxiliary anti-symmetric component is provided by disposing a coating layer on the glass article. The coating may be a hard coating having a high modulus, such as aluminium oxy-nitride (AlON). The coating may be applied over the front (outer) surface of the glass article after completion of the ion exchange. Prior to application of the coating the stress profile of the glass article may be similar to asymmetric stress profile 300 shown in FIG. 4, but with a larger DOL and/or CS on the back surface, or a smaller CS and/or DOC on the front surface, such that the glass article acquires a concave warp on the surface where the DOC is higher. The deposition conditions of the coating are then chosen in such a way that the film is formed in compression. In one embodiment, the coating thickness may be about 2 um and the film compressive stress may be between about 100 MPa and about 2,000 MPa. The application of the coating imparts both a small additional symmetric component and an anti-symmetric auxiliary component to the stress profile of the ion exchanged glass article. The auxiliary anti-symmetric component imparted by the coating will combine with the anti-symmetric component of the ion exchange induced stress profile to reduce the warp of the glass article compared to the warp prior to the application of the hard coating.

In some embodiments, an asymmetric stress profile in the glass article is obtained by an initial symmetric ion exchange of a Na-containing glass by immersion in a bath containing a mixture of NaNO$_3$ and KNO$_3$, where the Na on the surface of the glass article is at least partially replaced by K. In one embodiment, about 40% of the Na in the outermost 2 μm of the glass article is replaced by K. An optional heat treatment step may then be performed, preferably between about 300° C. and about 500° C., to increase the depth of the K$_2$O distribution in the glass, and thus the DOC. In one embodiment, the glass article is then ion exchanged in a bath having mostly KNO$_3$ and typically less than about 5 wt % NaNO$_3$ for a short amount of time, producing a surface spike of K$_2$O concentration such that over 80% of the Na in the outermost 2 μm is replaced by K. The spike may preferably have a depth in the range of about 5-25 μm, over which the compressive stress is substantially higher than the compressive stress prior to the addition of the spike. In a subsequent step, a portion of the spike on the front surface may be removed, such as by polishing or etching, while the spike on the back (inner) surface of the glass article is intact or polished substantially less. The resulting stress profile is asymmetric and causes the substrate to warp in a direction where the front surface becomes concave. A coating (such as AlON) is then deposited on the outer surface under conditions that put the coating in compression, causing the glass article with the coating to flatten.

In another embodiment, a coated glass article is formed wherein after the first symmetric ion exchange and the optional heat treatment, the back surface of the article is ion exchanged to form a spike. To form the spike a coating of $KNO_3$ may be applied by spray-coating a $KNO_3$ water solution over the pre-heated glass article, and then the ion exchange is performed by heating the glass article, preferably to a temperature above about 300° C. or above about 360° C., for a period of time between about 3 minutes and 10 hours. The desired spike depth on the back surface is preferably in the range of about 3 µm to about 25 µm. A shallower spike is then formed on the front surface, either by using the same coating process as for the back surface spike, or by a short double-sided ion exchange in a mostly or entirely $KNO_3$ bath. The front surface spike may have a depth ranging between about 3 µm and 15 µm, while the back surface spike has a greater depth. This asymmetry of the stress profile will produce warpage of the glass article such that the front surface will become concave. A coating is then applied to the front surface using conditions that cause it to be in compression, and the coated cover glass becomes substantially flat.

In some embodiments, the stress profile of both the front and back surfaces of the glass article comprises a deep portion of moderate compressive stress and a relatively shallow portion of high compressive stress. The concentration profile may be adequately approximated as a linear superposition of error function (erfc) based solutions of the diffusion equation, diffusing in from the two surfaces, and each surface having a characteristic deep diffusion length for the deep portion of the profile and a shallow (spike) diffusion length for the shallow portion. Profiles of this type may be obtained in Na-containing glasses by using separate steps for the deep and the shallow (spike) portions. The deep portion may be obtained by employing long ion exchange times (on the order of hours) and/or high ion exchange temperatures above 400° C. The spikes may be obtained using short ion exchange times (on the order of minutes to hours), and lower ion exchange temperatures between about 300° C. and about 400° C. These types of profiles may also be obtained in glasses containing Li or Li and Na, where the deep components of the profile are obtained by exchanging Li ions with Na ions or Ag ions or both, and the spikes are obtained by exchanging K for any of Li, Na, or Ag.

In an exemplary process for Li-containing glasses, the back surface is first subjected to a coating of $KNO_3$ and a heat treatment such that a K-rich spike with a depth of several microns up to about 20 µm is formed. The substrate is then cleaned, and subjected to an ion exchange in a bath containing both $KNO_3$ and $NaNO_3$, which forms a deep component of the profile by Na exchange for Li, and a shallow spike of K on both the front and the back, where the spike on the front is shallower than the spike on the back, due to the previously formed K spike on the back surface. At the same time, it may be arranged that the deep Na profiles exchanged from the two surfaces, while having the same diffusion length, do not have the same concentration and the same level of compressive stress at depths exceeding the corresponding spike depth. The asymmetry of the deep component of the profile and the asymmetry of the spike can be selected together to increase the AFOM but decrease the WFOM of the stress profile.

Considering a deep component and a spike component of the stress profile Eq. (8) may produce the following equation (21):

$$\frac{t}{\rho} \approx 3 \frac{z_{deep}}{t} \frac{(\sigma_{deep}^b - \sigma_{deep}^f)}{E} \left( \frac{2}{\sqrt{\pi}} - \frac{z_{deep}}{t} \mathrm{erf}\left(\frac{t}{z_{deep}}\right) \right) + 3 \frac{\Delta CS_{sp}}{E} \frac{(z_{sp}^b - z_{sp}^f)}{t} \left( \frac{2}{\sqrt{\pi}} - \frac{z_{sp}^b + z_{sp}^f}{t} \right)$$

wherein t is the thickness, $z_{deep}$ is the diffusion length of the deep profile (in this example assumed equal from both sides), $\sigma_{deep}^b$ is the contribution of the back surface deep component the back surface stress, $\sigma_{deep}^f$ is the contribution of the front deep component to the front surface stress, E is the Young's modulus of the glass article, $\Delta CS_{sp}$ is the contribution of the spike to surface compressive stress (this contribution assumed equal for the front and back surface in this example), and $z_{sp}^b$ and $z_{sp}^f$, are the diffusion lengths of the spike on the back surface and the front surface, respectfully.

Based on Eq. (21), the WFOM is then given by the following equation (22):

$$WFOM \approx \frac{t}{3} \left\{ \frac{z_{deep}}{t} \frac{(\sigma_{deep}^b - \sigma_{deep}^f)}{E} \left( \frac{2}{\sqrt{\pi}} - \frac{z_{deep}}{t} \mathrm{erf}\left(\frac{t}{z_{deep}}\right) \right) + 3 \frac{\Delta CS_{sp}}{E} \frac{(z_{sp}^b - z_{sp}^f)}{t} \left( \frac{2}{\sqrt{\pi}} - \frac{z_{sp}^b + z_{sp}^f}{t} \right) \right\}^{-1}$$

When an erfc-shaped spike is measured and processed using the FSM-6000 machine, the stress-measurement software assumes a linear profile of the spike. In this case, when only the optical modes that are confined to the spike (sparse modes) are included in the calculation of a corresponding spike "Depth of Layer", or $DOL_{sp}$, the latter equals approximately $1.38 z_{sp}$. Thus, on the front surface of the glass article $DOL_{sp}^f \approx 1.38\, z_{sp}^f$, and on the back surface $DOL_{sp}^b \approx 1.38 z_{sp}^b$.

Furthermore, to obtain simpler expressions that help obtain a clearer picture of how the warpage is related to the parameters of this double-feature asymmetric spiked profile, a slightly cruder approximation can be used, usually accurate to within 2% to 3%, which is appropriate when the model is only approximate (actual profiles are rarely exactly erfc-shaped). When $z_{deep} < 0.6t$, the relationship $$0.98 \le \mathrm{erf}\left(\frac{t}{z_{deep}}\right) \le 1 \text{ holds, so } \mathrm{erf}\left(\frac{t}{z_{deep}}\right)$$

can be replaced with 1. When $z_{deep} < 0.5t$, the relationship $0.995 \le$ $$\mathrm{erf}\left(\frac{t}{z_{deep}}\right) \le 1 \text{ holds,}$$

such that $$\mathrm{erf}\left(\frac{t}{z_{deep}}\right)$$

can be replaced with 1. It is noted that when $z_{deep} = 0.5t$, each of the front and back surfaces contributes 0.157 of the surface concentration to the center, producing a center concentration equal to 0.31 of the surface concentration. Usually $$\frac{z_{sp}^b + z_{sp}^f}{t} \le 0.04$$

(for a 400 um thick glass article), and $$\frac{z_{sp}^b + z_{sp}^f}{t} \le 0.03$$

for an 800 um thick glass article. Thus, the corresponding term can be neglected in comparison to the term $$\frac{2}{\sqrt{pi}} = 1.1284,$$

or may simply be assigned an average value of 0.022, to round the entire expression in the last parentheses to 1.15. A simpler expression is then obtained and described by the following equation (23):

$$\frac{t}{p} \approx 3 \frac{z_{deep}}{t} \frac{(\sigma_{deep}^b - \sigma_{deep}^f)}{E} \left(\frac{2}{\sqrt{\pi}} - \frac{z_{deep}}{t}\right) + 3.45 \frac{\Delta CS_{sp}}{E} \frac{(z_{sp}^b + z_{sp}^f)}{t}$$

When a preferred condition $$\frac{z_{deep}}{t} \approx 0.4$$

is selected(m which case the center concentration will become 15.5% of the surface concentration, with a 7.7% contribution from each side), the following equation (24) results:

$$\frac{t}{p} \approx 0.874 \frac{(\sigma_{deep}^b - \sigma_{deep}^f)}{E} \left\{1 - 3.95 \frac{\Delta CS_{sp}}{(\sigma_{deep}^b - \sigma_{deep}^f)} \frac{(z_{sp}^b + z_{sp}^f)}{t}\right\}$$

Furthermore, if the spikes are expressed in terms of FSM-measured $DOL_{sp}$, using the relationship $DOL_{sp} = 1.3824 \cdot z_{sp}$, the following equation (25) results:

$$\frac{t}{p} \approx 0.874 \frac{(\sigma_{deep}^b - \sigma_{deep}^f)}{E} \left\{1 - 2.86 \frac{\Delta CS_{sp}}{(\sigma_{deep}^b - \sigma_{deep}^f)} \frac{(DOL_{sp}^f - DOL_{sp}^b)}{t}\right\} \equiv$$

$$0.874 \frac{(\sigma_{deep}^b - \sigma_{deep}^f)}{E} \left\{1 - 2.86 \frac{\Delta CS_{sp}}{(\sigma_{deep}^b - \sigma_{deep}^f)} \frac{\Delta DOL_{sp}^{f-b}}{t}\right\}$$

where $\Delta DOL_{sp}^{f-b} = DOL_{sp}^f - DOL_{sp}^b$.

One approach to avoid warp is to require that the expression in the curly brackets evaluate close to 0. For example, requiring the following equation (26):

$$\left|1 - 2.86 \frac{\Delta CS_{sp}}{(\sigma_{deep}^b - \sigma_{deep}^f)} \frac{\Delta DOL_{sp}^{f-b}}{t}\right| \le 0.1$$

would guarantee that the effect of asymmetry of the auxiliary deep profile is reduced at least 10-fold by the counteracting effect of the asymmetry of the spike. The above expressions evaluate to the following equation (27):

$$0.315 \le \frac{\Delta CS_{sp}}{(\sigma_{deep}^b - \sigma_{deep}^f)} \frac{\Delta DOL_{sp}^{f-b}}{t} \le 0.385$$

Where the limitations on the curvature are not as strict, the less restrictive relationship given by the following equation (28) may be used:

$$\left|1 - 2.86 \frac{\Delta CS_{sp}}{(\sigma_{deep}^b - \sigma_{deep}^f)} \frac{\Delta DOL_{sp}^{f-b}}{t}\right| \le 0.5$$

which then evaluates to the following equation (29):

$$0.175 \le \frac{\Delta CS_{sp}}{(\sigma_{deep}^b - \sigma_{deep}^f)} \frac{\Delta DOL_{sp}^{f-b}}{t} \le 0.525$$

In most cases, an intermediate restriction given by the following equation (30) would be appropriate:

$$0.25 \le \frac{\Delta CS_{sp}}{(\sigma_{deep}^b - \sigma_{deep}^f)} \frac{\Delta DOL_{sp}^{f-b}}{t} \le 0.45$$

The asymmetric nature of the stress profiles described herein may also be characterized based on the concentration profile of ions in the substrate as compared to a based concentration in the glass article, where stress relaxation during or after the ion exchange is negligible or moderate. The concentration profile $C_0(x)$ as a function of position (x) in the glass article is given by the following equation (31):

$$C_0(x) = C(x) - \min(C(x))$$

In the case when K is exchanged for Na in a Li-free glass, only the K concentration need be considered. In this sense, the zero-offset K concentration profile $C_0(x)$ can be obtained relative to the minimum concentration of K across the thickness, then this profile can be decomposed into a symmetric component ($C_s(x)$) as given by the following equation (32):

$$C_s(x) = \frac{1}{2}[C_0(x) + C_o(-x)]$$

and an anti-symmetric component ($C_a(x)$) as given by the following equation (33):

$$C_a(x) = \frac{1}{2}[C_0(x) + C_0(-x)]$$

The same AFOM definition described above for the stress profile may be used for the concentration profile by replacing $\sigma_s$ and $\sigma_a$ in the definition with the symmetric and anti-symmetric component of the concentration profile. Note that the symmetric and anti-symmetric component of the zero-offset concentration profile need not be non-negative over the entire thickness, even though the zero-offset profile $C_0(x)$ may be non-negative at every point x. AFOM in terms of the concentration profile is then given by the following equation (34):

$$AFOM = \frac{\int_{-0.5t}^{0.5t} |C_a(x)| dx}{\int_{-0.5t}^{0.5t} |C_s(x)| dx}$$

The same definition for a zero-offset concentration profile and symmetric and anti-symmetric concentration component may be used for Li-containing glasses by defining the zero-offset concentration according to the following equation (35):

$$C_0(x) = C^{Na}(x) - \min(C^{Na}(x)) + 2C^K(x) - 2\min(C^K(x))$$

wherein $C^{Na}(x)$ and $C^K(x)$ refer to the concentration profiles of Na and K, respectively, as a function of position.

The factor of 2 that multiplies the terms of the potassium $C^K(x)$ reflects the observation that potassium ions produce approximately twice as much stress when replacing Li-ions in a Li-containing glass, when compared to Na-ions replacing Li-ions. Hence, the glass articles described herein may comprise a zero-offset concentration profile that has an AFOM that is greater than 0.05, such as greater than 0.07, 0.1, 0.2, or more. Concentration profiles with most substantial benefit of better addressing reliability issues on the front and back side of the glass article may have AFOM exceeding 0.3 or even 0.4.

The method by which the stress profiles of the glass articles are measured may vary based on the composition of the glass articles. In some embodiments, stress profiles obtained in Li-free glasses by ion exchange of potassium for sodium, the preferred method for extracting the stress profile is the IWKB method of extraction when the potassium concentration is a monotonically decreasing function of depth from both sides of the glass substrate. The IWKB method extracts the profile to a depth at which the profile practically stops changing, due to negligible further decrease of K-concentration with depth. The deepest parts of the profiles extracted from the two sides of the substrate can then be connected with a straight line of constant stress, and the stress level of that constant-stress line may be finely adjusted such that the integral of stress over the tension zone equal the integral of stress over the front and back compression zones. After that the full profile is fully recovered and force-balanced, and the calculations of the AFOM and WFOM are relatively accurate. It is important that the coupling spectra (FSM-spectra) of TM and TE waves be extracted without substantial offset (such as caused by tilt of the fringes or wedge of the polarizers of the instrument), to avoid substantial error in the AFOM and WFOM.

In general, when stress relaxation is relatively low, the stress profile in Li-free glasses obtained by ion exchanging K for Na is directly related to the K concentration distribution, and the technique for obtaining a symmetric and anti-symmetric component of the stress profile can be directly applied to the K distribution. The lowest K concentration from across the thickness can be first subtracted from the entire K profile, then the residual K profile has a minimum concentration of 0. It can then be decomposed into a symmetric and anti-symmetric component, and an AFOM can be calculated in the same way, where instead of integrating the anti-symmetric and symmetric stress components, the absolute values of the anti-symmetric and symmetric components of the K-concentration-profile are integrated and the ratio of the integrals is taken as the AFOM. Alternatively, one can assume that for each 1 mol % of $K_2O$, a stress of 60±10 MPa is produced, where larger values (e.g., 70 MPa/mol %) correspond to annealed glasses, intermediate values (60-65 MPa/mol %) correspond to fusion sheet glasses, and lower values (50-60 MPa/mol %) correspond to cases with moderate and acceptable level of stress relaxation. The $K_2O$ concentration distribution that has been shifted to a 0 minimum is converted to a stress distribution (with a 0 minimum), and may be force-balanced by subtracting a constant-stress value until the integral of negative stress become equal to the integral of positive stress. Finally, the profile can be decomposed to a symmetric and anti-symmetric component, and the AFOM can be calculated. Furthermore, with the so prepared stress profile, the WFOM and warping tendency can also be calculated.

The method of using concentration for estimating the AFOM and WFOM of the profile can be extended to Li-containing glasses strengthened with Na and K, Na only, or K only. In particular, the $K_2O$ profile and $Na_2O$ profile may be extracted by GDOES (glow-discharge optical emission spectroscopy) or EMP (electron micro-probe), or other analytical methods known in the art. The slowly-varying portions of the concentration profiles should be substantially de-noised in the case of EMP which is often more noisy. Then the minimum concentration of each profile is subtracted from the entire spatial distribution for that particular species, to obtain profile with 0 minimum. Then each 1 mol % of $Na_2O$ is replaced by 60±10 MPa of stress, while each 1 mol % of $K_2O$ is replaced by 120±20 MPa of stress, where higher values correspond to annealed glasses or glasses having twice or more molar concentration of $Li_2O$ than $Na_2O$ in the mid-plane of the glass sheet, intermediate values are applied to fusion-drawn glasses and glasses having similar molar concentrations of $Li_2O$ and $Na_2O$ in the mid-plane of the substrate, or where $Na_2O$ is higher than $Li_2O$. Finally, the bottom half of the ranges are applicable to glasses in which there is moderate level of stress relaxation. With this conversion, a stress profile with a minimum stress of 0 is obtained from the summation of the stress components corresponding to the $Na_2O$ and $K_2O$ profiles. Finally, the profile can be shifted to force balance and its symmetric and anti-symmetric component can be calculated. Note that for the purposes of calculating the anti-symmetric portion of the profiles, the application of force balance is not a necessary step (e.g., applying force-balance is optional).

A method of extracting $CS_k$ of chemically strengthened Li-containing glasses by using prism coupling measurements can also be employed to estimate the properties of asymmetric profiles. Note that for accurate estimate of $CS_k$ from the prism-coupling spectra in FSM-6000 or similar instruments, the wavelength must be such that the upper (TM) and lower (TE) spectra are in a "sweet spot" for measurement of the position of the critical angle. In the case of Li-containing glasses strengthened in mixed baths having both Na and K salts, the mode spectra obtained by prism-coupling methods only provide information about the surface CS and the DOL of the relatively shallow potassium spike, and the "compressive knee stress" $CS_k$ at the bottom of the potassium spike. When the Na profile is deep enough such that the spatially varying parts of the Na profile extending from both surfaces connect in the interior of the substrate without a significant region of constant Na concentration (e.g, any region of constant-Na concentration near the mid-plane of the substrate has a width that is less than about 20%, preferably less than about 15% of the substrate thickness), then the differences in the measured parameters of surface CS, spike DOL, and $CS_k$ between the front and the back of the cover-glass sheet can be used to determine whether the article falls in a range characterized by a high AFOM and high WFOM, as defined in the present disclosure. Furthermore, center tension (CT) can be measured by scattered-light polarimeter (SCALP), and used as needed to verify consistency among different parameters of the profile.

Refracted-near field measurements (RNF) have been successfully employed to extract the difference between the front and back side of an asymmetric profile (0.5 mm sample M3B from the examples in the present disclosure, employing an auxiliary anti-symmetric component). For the purposes of establishing whether the profile is asymmetric, the sample needs to be scanned starting from one side, then scanned again starting from the other side, and the two scans are to be cut at the depth of the mid-plain of the substrate. Then they are shifted vertically to a common stress value at the connection point (mid-plane). Force balance may be applied at that point, if desired. The symmetric and anti-symmetric component of the so-spliced full profile can be calculated by the provided equations, and the AFOM and WFOM can be calculated.

Figure 32:
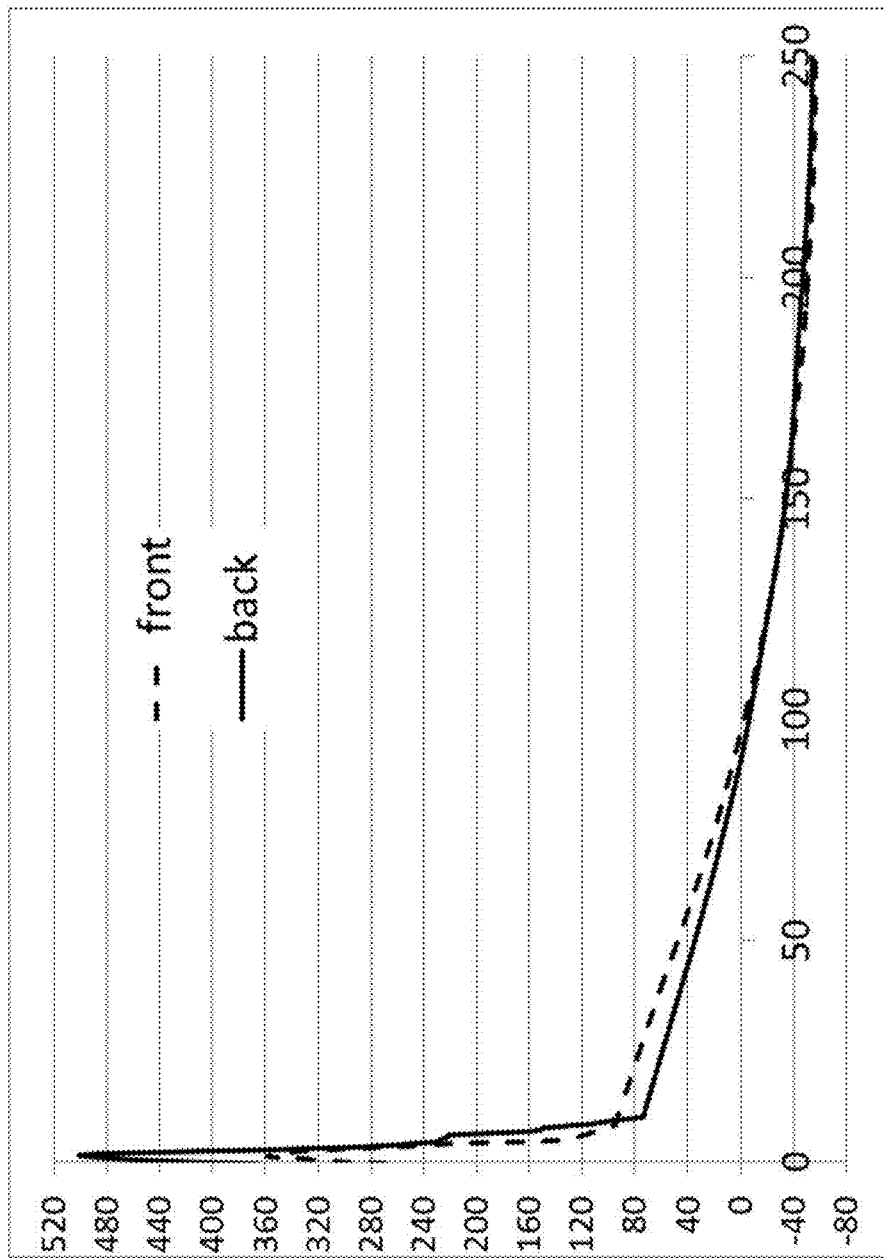
FIG. 32 is a plot of stress as a function of distance from a surface of an ion exchanged glass article.

In FIG. 32, the asymmetric profile was obtained by pre-warping a 0.5 mm substrate at 570° C. for 3 hours to develop a concave warp on the front side of the sheet with a radius of curvature of about 1,500 mm. Then, the back side was ion exchanged in a shallow bath having 1 wt % $LiNO_3$ and 99 wt % $KNO_3$ for 60 minutes at 390° C., then a full-immersion ion exchange was applied in a bath having 49% $NaNO_3$ and 51% $KNO_3$ by weight for 1.25 hours at 380° C., and finally a full-immersion final ion exchange was performed in a bath having 4% $NaNO_3$ and 96% $KNO_3$ by weight at 380° C. for 20 min. The RNF profile obtained by using the above-described procedure shows that the front side knee stress ($CS_k^f$) is greater than the back-side knee stress ($CS_k^b$) by 18±2 MPa, and the front-side depth of compression ($DOC_f$) is greater than the back-side depth of compression ($DOC_b$) by about 6-7 microns. The prism-coupling stress measurement after the first IOX step on the back side reported a surface CS of about 860 MPa, and DOL of 6.4 microns. After the second ion-exchange step the back-side CS was about 530 MPa and DOL was 10.5 microns. Finally, after the third IOX step the back side read CS=815 MPa and $DOL_b$=10.65 µm, while the front side had readings $CS_f$=838 MPa and $DOL_f$=7.8 µm. Note that the CS values are slightly under-estimated by the traditional FSM-6000 measurement which is not optimally designed for measuring steep stress spikes shallower than 20 microns. The actual values of surface CS are closer to 950 MPa in the present case. A more accurate measurement for surface CS in the case of such shallow spikes uses the linear-spike approximation where the surface index at each polarization is calculated by adding to the index of lowest-order mode 1.3 times the difference between the index of the lowest-order mode and the next mode. In FSM-6000 only 0.9 of the difference is added, usually under-estimating the surface index for shallow spikes.

The RNF profile does not provide an accurate surface-CS measurement due to limited resolution, so parameters such as CS and DOL of the front and back K-spike are more precisely measured by FSM.

Another stress-measurement method that can be employed to evaluate stress profiles is the measurement of DOC by using a polarized microscope. It may be used to try to measure the difference in front and back side DOC on a sample.

In the cases of asymmetric stress profiles employing a substantial auxiliary anti-symmetric component obtained by pre-warping the glass sheet (e.g., a pre-warp radius of curvature<1,000 mm), the calculation of WFOM from the concentration profiles may not match very closely the final inverse radius of curvature of the glass sheet. In such cases the inverse radius of curvature of the sheet may be used as a direct estimate of the WFOM, while the AFOM may still be estimated either from an optically measured stress profile or from a stress profile obtained by conversion of measured concentration profiles to stress.

It has been shown that profiles having a surface spike with high CS (e.g., >650 MPa) may help improve resistance to scratching of the glass. Many of the embodiments of the present disclosure seek to have a substantially shallow stress spike on the front side, or no spike at all on the front surface, in order to maximize the front-side compression depth ($DOC_f$). In some embodiments, such asymmetric profiles may be utilized in glass articles having a substantial concentration of $B_2O_3$ preferably exceeding 1 mol %, 1.5 mol %, or 2 mol %, and preferably not exceeding 40 mol %, 30 mol %, 25 mol %, 20 mol %, 15 mol %, 10 mol %, or 7 mol %. This recommendation for $B_2O_3$ content is particularly recommended for asymmetric profiles having no spike on the front surface, or having a shallower front-side spike than the back-side spike, or having CS on the front surface that is at least 50 MPa lower than the back surface, or having front-surface CS below 600 MPa. Similarly, it may be recommended that glass articles comprising asymmetric profiles with the aforementioned CS properties, contain at least 1 mol %, 1.5 mol %, or 2 mol % $P_2O_5$, and preferably not more than 15 mol %, 10 mol %, or 7 mol % of $P_2O_5$.

In another embodiment of the invention, a final polish may be applied to one of both surfaces of the ion exchanged glass article having the asymmetric stress profile, to remove cosmetic defects, or to eliminate any undesired residual warp relative to the target final shape, e.g., variable residual warpage caused by fluctuations in heating or cooling conditions, salt concentrations during ion exchange, or uniformity of the coating sources of K and Na ions. As a result, the CS on the front surface may be different from the CS on the back surface by 30 MPa or more, even if the final ion-exchange step produced substantially identical surface compression on the front and back surface before the final cosmetic polish.

In another embodiment of the present invention, the inventive glass article has a front-side knee stress ($CS_k^f$) that is higher than the back-side knee stress ($CS_k^b$) by more than 4 MPa, preferably by more than 6 MPa, and ideally by more than 8 MPa, and the article is substantially flat (having a radius of curvature exceeding 500 mm). The aforementioned 0.5 mm Li-containing glass article with the measured asymmetric experimental profile is an example of such an inventive glass article. In a particular embodiment, the glass article may be a Li-containing glass, but the same type of asymmetric profile may be obtained in a Li-free glass as well, usually by longer ion-exchange process if the thickness is the same. The difference in $CS_K$ between the front and back surface of the glass article changes negligibly (usually by less than 1 MPa) when a light cosmetic polish is applied to one or both large surfaces of the glass sheet representing the article, hence a substantial difference in $CS_k$ between the front and back side of the glass article is a relatively robust way to establish the asymmetric property of the glass article, and gauge the AFOM.

In some embodiments, the glass articles described herein are formable by down-draw processes that are known in the art, such as slot-draw and fusion-draw processes. The fusion draw process is an industrial technique that has been used for the large-scale manufacture of thin glass sheets. Compared to other flat glass manufacturing techniques, such as the float or slot draw processes, the fusion draw process yields thin glass sheets with superior flatness and surface quality. As a result, the fusion draw process has become the dominant manufacturing technique in the fabrication of thin glass substrates for liquid crystal displays, as well as for cover glass for personal electronic devices such as notebooks, entertainment devices, tables, laptops, mobile phones, and the like.

The fusion draw process involves the flow of molten glass over a trough known as an "isopipe," which is typically made of zircon or another refractory material. The molten glass overflows the top of the isopipe from both sides, meeting at the bottom of the isopipe to form a single sheet where only the interior of the final sheet has made direct contact with the isopipe. Since neither exposed surface of the final glass sheet has made contact with the isopipe material during the draw process, both outer surfaces of the glass are of pristine quality and do not require subsequent finishing.

In order to be fusion drawable, a glass composition must have a sufficiently high liquidus viscosity (i.e., the viscosity of a molten glass at the liquidus temperature). In some embodiments, compositions used to form the glass articles described herein have a liquidus viscosity of at least about 50 kilopoise (kP), such as at least about 100 kP, about 200 kP, about 300 kP, about 400 kP, about 500 kP, about 600 kP, or more.

In some embodiments, the glass articles may be a laminated glass article. The laminated glass article may include at least 2 glass article layers, such as at least 3 layers, 4 layers, 5 layers, or more. The glass article layers may be selected to have different coefficients of thermal expansion, such that a stress profile is created in the laminated glass article. The stress profile produced in the laminated glass article by the difference in properties between the glass article layers may be combined with the asymmetric stress profiles described above. In some other embodiments, the glass article layers may be selected to have different ion diffusivity properties, such that the same ion exchange conditions produce different degrees of ion diffusion in the glass article layers. The laminated glass article may be formed by bonding separately formed glass article layers, or by forming the glass article layers concurrently.

The glass articles may be any appropriate composition. In some embodiments, the glass articles are aluminosilicate glasses, such as alkali aluminosilicate glasses. In some embodiments, the glass articles contain lithium. In some embodiments, the glass articles may include $B_2O_3$ in an amount of about 2 mol % to about 20 mol %. The glass articles may have a composition including: 50-75 mol % $SiO_2$, 5-20 mol % $Al_2O_3$, 2-20 mol % $B_2O_3$, 0-10 mol % $P_2O_5$, 6-25 mol % $Li_2O+Na_2O+K_2O$, and 0-15 mol % $MgO+CaO+SrO+BaO+ZnO$.

After the glass articles are formed, the glass article is chemically strengthened. Ion exchange is widely used to chemically strengthen glasses. In one particular example, alkali cations within a source of such cations (e.g., a molten salt, or "ion exchange," bath) are exchanged with smaller alkali cations within the glass to achieve a layer that is under a compressive stress near the surface of the glass article. The compressive layer extends from the surface to a DOC within the glass article. In the glass articles described herein, for example, potassium ions from the cation source are exchanged for sodium ions within the glass during ion exchange by immersing the glass in a molten salt bath comprising a potassium salt such as, but not limited to, potassium nitrate ($KNO_3$). Other potassium salts that may be used in the ion exchange process include, but are not limited to, potassium chloride (KCl), potassium sulfate ($K_2SO_4$), combinations thereof, and the like. The ion exchange baths described herein may contain alkali ions other than potassium and the corresponding salts. For example, the ion exchange bath may also include sodium salts such as sodium nitrate ($NaNO_3$), sodium sulfate, sodium chloride, or the like. In one or more embodiments, a mixture of two different salts may be utilized. For example, the glass articles may be immersed in a salt bath of $KNO_3$ and $NaNO_3$. In some embodiments, more than one bath may be used with the glass being immersed in one bath followed by another, successively. The baths may have the same or different compositions, temperatures and/or may be used for different immersion times.

The ion exchange baths described herein may have a temperature in the range from about 320° C. to about 520° C., such as from about 320° C. to about 450° C. Immersion time in the bath may vary from about 15 minutes to about 48 hours, such as from about 15 minutes to about 16 hours.

The asymmetric profiles described herein may be produced by any appropriate ion exchange process. In some embodiments, the front and back surfaces may be ion exchanged in separate processes. This may be achieved by contacting only the desired ion exchange surface with a salt containing the ions to be exchanged. In some embodiments, selective contact with the ion exchange salt may include applying a solution or paste containing the ion exchange salt to the desired surface, without contacting other surfaces of the glass article. In some other embodiments, a blocking layer may be applied over the surfaces of the glass article that are not desired to be subjected to the ion exchange process. The blocking layer may completely block ion diffusion, or in some embodiments may allow partial ion diffusion such that the surface on which the blocking layer is disposed is ion exchanged to a lesser degree than surfaces that do not have the blocking layer. An exemplary blocking layer may be spun glass or silica.

The blocking layer may be formed of any appropriate material by any appropriate process. In some embodiments, the blocking layer may be formed from an alkali-free spin on glass (SOG), sputtered $SiO_2$, or an evaporated or sputtered metal coating. In some embodiments, the blocking layer may be a sputtered $SiO_2$ layer. The sputtered layer may have a thickness of about 40 nm to about 70 nm. In some embodiments, the blocking layer may be a metal coating, such as a coating containing tantalum, molybdenum, or aluminum.

In some embodiments, the blocking layer may be an alkali-free spin on glass, and may be deposited by spin-coating at a speed of 3000 to 6000 rpm before curing the coated glass at about 400° C. for about 1 hour. The thickness of the cured SOG layer may be about 50 nm to about 200 nm. The SOG layer may be removed after ion exchange by etching in a buffered oxide etch (BOE), such as a BOE containing hydrofluoric acid or ammonium fluoride. The etching may extend for a period of about 15 seconds to about 3 minutes at room temperature. The dilute nature of the etchant in BOE solution allows for the removal of the SOG blocking layer with minimal removal, on the order of nanometers, of the ion exchanged glass. The BOE process may also be employed to remove a sputtered $SiO_2$ blocking layer.

In some other embodiments, the blocking layer may be formed by ion exchanging at least one divalent metal ion into the glass article. The divalent metal ions may be at least one of Cu, Ca, Mg, Zn, and Ti. In some embodiments, a mixture of more than one divalent cations may be employed in the salt, which may increase the effectiveness of the blocking layer in suppressing the subsequent ion exchange for a longer period of time. The divalent metal ions may be achieved using a nitrate salt of the divalent metal ions, such as $Cu(NO_3)_2$ or $Ca(NO_3)_2$. The salts may be spray coated on the surface to be exchanged in the manner described below. The ion exchange may be carried out by heating the salt-coated substrate at a temperature of about 400° C. to about 500° C. for a time of about 5 minutes to about 3 hours, such as at a temperature of about 420° C. for about 2 hours. The divalent metal ions may be exchanged to a depth of layer of less than about 1 μm. The salt is washed away after the ion exchange. In some embodiments, the blocking layer may be removed by chemical or mechanical processes, such as acid washing or mechanical polishing. The glass article after removal of the blocking layer may be subjected to additional ion exchange steps.

In some embodiments, the glass article may be ion exchanged to form a compressive stress spike at one or both surfaces. In some embodiments where a compressive stress spike is formed on both the front and back surfaces, the spike may have a similar compressive stress value on each surface. In some embodiments with a compressive stress spike formed on both surfaces of the glass article, the values of the compressive stress on the front and back surfaces may be substantially different despite being subjected to the same spike ion exchange conditions. Such a difference in compressive stress spike values may be due at least in part to differing previous ion exchange treatments of the surfaces, which alter the ion diffusivity of the glass article.

The ion exchange of the glass article may be combined with one or more heat treatments. The heat treatments may allow the ions that have been exchanged into the glass article through previous ion exchange treatments to further diffuse throughout the glass article, which may increase the depth of compression and potassium depth of layer. A heat treatment may also be employed to impart a pre-warp shape to the glass article, such as from a mold, prior to ion exchange. In some embodiments, the pre-warped glass article is free of stress prior to ion exchange. The degree of pre-warp imparted to the glass article may be selected to counteract a warp that will be induced by the formation of an asymmetric stress profile during ion exchange.

The DOC on either surface of the glass article may be described as a fraction of the thickness t. For example, in one or more embodiments, the DOC on either the front or back surface may be equal to or greater than about 0.1t, equal to or greater than about 0.11t, equal to or greater than about 0.12t, equal to or greater than about 0.13t, equal to or greater than about 0.14t, equal to or greater than about 0.15t, equal to or greater than about 0.16t, equal to or greater than about 0.17t, equal to or greater than about 0.18t, equal to or greater than about 0.19t, equal to or greater than about 0.2t, equal to or greater than about 0.21t. In some embodiments, the DOC on the front or back surface of the glass article may be in a range from about 0.08t to about 0.25t, from about 0.09t to about 0.24t, from about 0.10t to about 0.23t, from about 0.11t to about 0.22t, from about 0.12t to about 0.21t, from about 0.13t to about 0.20t, from about 0.14t to about 0.19t, from about 0.15t to about 0.18t, from about 0.16t to about 0.19t, or any sub-ranges contained therein or formed from any of these endpoints. In some instances, the DOC of the front or back surface may be about 20 μm or less. In one or more embodiments, the DOC of the front or back surface of the glass article may be about 40 μm or greater, such as from about 40 μm to about 300 μm, from about 50 μm to about 280 μm, from about 60 μm to about 260 μm, from about 70 μm to about 240 μm, from about 80 μm to about 220 μm, from about 90 μm to about 200 μm, from about 100 μm to about 190 μm, from about 110 μm to about 180 μm, from about 120 μm to about 170 μm, from about 140 μm to about 160 μm, from about 150 μm to about 300 μm, or any sub-ranges contained therein or formed from any of these endpoints.

In one or more embodiments, the strengthened alkali aluminosilicate glass article may have a maximum compressive stress at the front or back surface (which may be found at the surface or a depth within the glass article) of about 400 MPa or greater, about 500 MPa or greater, about 600 MPa or greater, about 700 MPa or greater, about 800 MPa or greater, about 900 MPa or greater, about 930 MPa or greater, about 1,000 MPa or greater, or about 1,050 MPa or greater.

In one or more embodiments, the strengthened alkali aluminosilicate glass article may have a maximum tensile stress or central tension (CT) of about 40 MPa or greater; such as about 45 MPa or greater, about 50 MPa or greater, about 60 MPa or greater, about 70 MPa or greater, about 75 MPa or greater, about 80 MPa or greater, or about 85 MPa or greater. In some embodiments, the maximum tensile stress or central tension (CT) may be in a range from about 40 MPa to about 100 MPa.

In some embodiments, the glass article may include portions with different stress profiles. For example, a first region of the glass article may include a first stress profile and a second region of the glass article may include a second glass article, where at least one of the first stress profile and the second stress profile is an asymmetric stress profile. The glass articles may include a mixture of asymmetric and symmetric stress profiles. In some embodiments, the stress profiles in regions of the glass article may be selected to address common failure modes when the glass article is in use. For example, the corners and/or edges of the glass article may exhibit increased strengthening when compared to the center regions of glass articles that will be used in consumer electronic devices, where the corners and edges are more likely to be subjected to an impact, such as a drop onto a hard surface. Additionally, by including multiple stress profiles in the glass article stress profiles with greater degrees of asymmetry may be included in the areas of the glass articles where such profiles provide increased performance while including stress profiles with lower asymmetry in other regions, such that the benefit of the higher asymmetry may be realized with a low degree of warp. The warp resulting from a localized asymmetric stress profile may be generally constrained to the regions exhibiting the asymmetric stress profile, such that glass articles with a localized asymmetric stress profile may exhibit less warp than glass articles with a single asymmetric stress profile across the entirety of the glass article.

In some embodiments, the glass articles may include stress profiles with a difference in an AFOM of greater than about 0.2, such as greater than about 0.3, about 0.4, about 0.5, about 0.6, about 0.7, or more. In some embodiments, the AFOM of the asymmetric stress profiles in locally strengthened areas, such as the corners or edges of the glass article, may have an AFOM of greater than about 0.2, such as greater than about 0.3, about 0.4, about 0.5, about 0.6, about 0.7, or more. The glass articles may include a region with an area exceeding about 2 cm$^2$ where a radius of curvature due to the stress profile in that region exceeds about 10 m, and a second region with a WFOM of less than about 5 m, such as less than about 3 m, about 1 m, about 0.6 m, about 0.4 m, or less. Additionally, the second region may have an AFOM of at least about 0.2, such as at least about 0.3, about 0.4, about 0.5, about 0.6, or more. In general, the regions of the glass article may be characterized by stress profiles of any type described herein.

In some embodiments, the ion exchanged glass articles may include large ions, such as silver, copper, cesium, or rubidium. The content of these large ions in the ion exchanged glass article may be up to about 5 mol %, such as up to about 3 mol %.

In some embodiments, the glass articles may be produced by disposing a salt containing a solid component on at least a portion of a first surface of the glass article. The glass article is then ion exchanged by heating the glass article to an ion exchange temperature to produce an asymmetric stress profile. The solid component is selected to be solid at the ion exchange temperature. In some embodiments, the salt may additionally include a liquid component that is selected to be a liquid at the ion exchange temperature.

The solid component may be a sulfate or phosphate. In some embodiments, the solid component may be an alkali sulfate or alkali phosphate, such as tri-potassium phosphate (TKP), tri-sodium phosphate (TSP), potassium sulfate, or sodium sulfate. The solid component may include more than one sulfate or phosphate, such as mixtures of phosphates and/or sulfates. The solid component may be present in the salt in an amount of about 5 wt % to about 99.5 wt %, such as from about 15 wt % to about 99.5 wt %, from about 30 wt % to about 98 wt %, or any sub-ranges contained therein. The amount of solid component in the salt may be selected based on the desired effect of including the solid component, as described further below. In embodiments where the solid component is present in the salt in an amount of about 30 wt % to about 98 wt %, suppression of the spreading of the salt during ion exchange, prevention of poisoning, and easy surface-stress measurements are achieved.

The liquid component may be a salt commonly employed in a molten state for ion exchange processes. In some embodiments, the liquid component may be an alkali nitrate, such as $KNO_3$ or $NaNO_3$. The liquid component may include more than one alkali nitrate, such as mixtures of $KNO_3$ and $NaNO_3$. The similar densities of TKP and TSP and $KNO_3$ and $NaNO_3$ indicate that any salt mixture including TKP, TSP, $KNO_3$, and $NaNO_3$ is expected to produce similar results when the weight fraction of the solid component and the liquid component are the similar.

The solid component in the salt prevents wicking of the salt during the ion exchange, even in embodiments where the salt also contains a liquid component. The prevention of wicking allows the salt to be disposed on the surface of the glass article in areas where ion exchange is desired, and for the desired patterning of the salt to be maintained during the ion exchange process. The reduction in wicking may be due at least in part to the attraction between the liquid component of the salt and the surface area of the solid component. By way of comparison, when salts are utilized that do not contain a solid component of the type described herein, the salt may wick or spread when heated during the ion exchange process, which may result in the salt migrating to areas of the glass article where ion exchange is not desired. The suppression of spreading of the salt may be achieved when the solid content in the salt is about 15 wt % to about 99.5 wt %.

In some embodiments, the solid component may also act as a getter for poisoning ions that may be exchanged out of the glass article. For example, $Li^+$ is a poisoning ion for Li-containing glasses and $Na^+$ is a poisoning ion for Na-containing glasses. The solid component may then prevent the poisoning ions from participating in a reverse ion exchange process at the glass article surface, suppressing the poisoning effect. The suppression of the poisoning effect allows for the desired surface concentration of the exchanging ions to be achieved. The suppression of the poisoning effect may be observed when the solid component is present in the salt in an amount of about 5 wt % to about 99.5 wt %.

The salt may be disposed on the first surface through any appropriate process. In some embodiments, a solution containing the desired salts may be spray coated onto the glass article. The salt mixture is then dried to remove the solvent, leaving behind a dry salt coating on the glass article. In some embodiments, the solvent may be water, such as deionized water. In other embodiments, the salt may be deposited by other methods known in the art, such as ink jet printing, screen printing, or rolling.

The salt may be disposed on the first surface in a pattern, such that regions of the first surface are not in contact with the salt. This allows for the creation of areas of the first surface that are not ion exchanged when the glass article is heated to the ion exchange temperature. The resulting glass article may then have regions with different stress profiles. For example, the salt may be deposited at the periphery of the first surface but not at the center of the first surface, resulting in ion exchange of the corners without ion exchanging the center of the first surface. This local ion exchange allows preferential ion exchange of areas of the glass article where additional strengthening is desired, such as the corners and edges that are more likely to be subjected to impacts when in use. In other embodiments, the salt may be disposed over the entirety of the first surface of the glass article.

The salt pattern on the first surface may be produced by any appropriate process. In some embodiments, a mask may be used to block areas of the first surface that will not be ion exchanged. The mask may be removed before the glass article is heated to the ion exchange temperature. The mask may be formed from any appropriate material, such as a polymer, glass, or metal.

The salt layer is removed after ion exchanging the glass article. The salt layer may be removed by any appropriate process, such as by washing with a solvent. In some embodiments, the salt is removed by washing the glass article with water. The glass article may also be cleaned with an acid wash to remove staining produced by the ion exchange process. In some embodiments, the glass article may be washed with acetic acid to remove staining from the first surface of the glass article.

The cleaned ion exchanged glass article may subsequently be subjected to additional ion exchange processes. In some embodiments, the cleaned glass article may be ion exchanged by submerging the glass article in molten salt baths of the type commonly used in the art. The first and second surfaces may both be ion exchanged during the additional ion exchange processes. In some embodiments, the cleaned ion exchange article may be subjected to two additional ion exchange processes with different salt bath compositions.

In some embodiments, a blocking layer may be disposed on at least a portion of the glass article prior to the deposition of the salt. The blocking layer may be formed of any appropriate material by any appropriate process, such as those described above. In some embodiments, the blocking layer may be formed from an alkali-free spin on glass (SOG), sputtered $SiO_2$, or an evaporated or sputtered metal coating. In some other embodiments, the blocking layer may be formed by ion exchanging at least one divalent metal ion into the glass article. The divalent metal ions may be at least one of Cu, Ca, Mg, Zn, and Ti. The blocking layer may be removed after ion exchange by any appropriate process. In some embodiments, the blocking layer is removed by an acid wash or mechanical polishing process.

In some embodiments, a blocking layer may be formed at a first surface of a glass article before immersing the glass article in a molten salt bath. The molten salt bath may contain about 40 wt % $NaNO_3$ and about 50 wt % $KNO_3$ at a temperature of about 460° C. The glass article may be immersed in the molten salt bath for a time of about 14 hours. In some other embodiments, the molten salt bath may contain $KNO_3$ and from about 5 wt % to about 60 wt % $NaNO_3$. In some embodiments, the glass article may be submerged in the molten salt bath at a temperature of about 450° C. to about 460° C. for a time of about 6 hours to about 30 hours. The potassium depth of layer produced by this first ion exchange step may be about 60 μm to about 250 μm, or about 200 μm to about 400 μm. The glass article is cleaned after removal from the molten salt bath and the blocking layer is removed. The non-ion exchanged portions of the cleaned and blocking layer free glass article may then be subjected to an ion exchange treatment, such as by coating the ion exchanged portion with a blocking layer or by ion exchanging the non-ion exchanged portions with a salt containing a solid component of the type described above. In some embodiments, the ion exchanged surface of the glass article may be coated with a blocking layer of the type disclosed above. The ion exchanged glass article with the blocking layer may then be submerged in a molten salt bath. The molten salt bath contains primarily $KNO_3$, such as a molten salt bath containing less than 5 wt % $NaNO_3$, or being free of $NaNO_3$. The ion exchange in the molten salt bath may be conducted for any appropriate time and temperature, such as about 2 hours at 420° C. The resulting compressive stress layer may have a depth of about 40° m and a surface compressive stress of about 800 MPa to about 900 MPa. The submersion in the molten salt bath may also decrease the surface compressive stress in the previously ion exchanged region of the glass article, due to the heat treatment experienced by submersion in the molten salt bath. After removal from the molten salt bath, the blocking layer may be removed by chemical etching or mechanical polishing. Additionally, a compressive surface stress "spike" may be applied to the glass article by immersing the glass article after removal of the blocking layer in a molten salt bath. The "spike" molten salt bath contains primarily $KNO_3$, such as less than 5 wt % $NaNO_3$, or being free of $NaNO_3$. The "spike" ion exchange may take place for about 10 to about 15 minutes at about 390° C.

In some embodiments, a salt may be disposed on the non-ion exchanged surface of the glass article. The salt may include a solid component of the type described herein, and may be applied in a spray coating process as described herein. The glass article is then ion exchanged by heating the glass article to an ion exchange temperature. The compressive stress layer formed by the ion exchange may have a depth of about 4 μm to about 50 μm and a surface compressive stress of about 900 MPa. The ion exchange may take place for about 2 hours at an ion exchange temperature of about 420° C. The salt layer may then be removed from the glass article, such as by washing. Additionally, a compressive surface stress "spike" may be applied to the glass article by immersing the glass article after removal of the blocking layer in a molten salt bath. The "spike" molten salt bath contains primarily $KNO_3$, such as less than 5 wt % $NaNO_3$, or being free of $NaNO_3$. The "spike" ion exchange may take place for about 10 to about 15 minutes at about 390° C. After the "spike" treatment the first side of the glass article may exhibit a shallow layer enriched in $K^+$, where the $K_2O$ concentration decreases from about 14 mol % to about 16 mol % at the surface to less than 5 mol % over a distance of a few microns, such as about 6 μm to about 12 μm. The second side of the glass article, the surface ion exchanged with the spray coated salt, exhibits an increased potassium depth of layer. The second side may have a potassium depth of layer of about 40 μm to about 50 μm when the glass article has a thickness of about 0.8 mm. The potassium depth of layer of the second side may be thinner when the thickness of the glass article is less to avoid undesired frangible behavior, such as about 30 μm to about 42 μm for a thickness of about 0.5 mm.

In some embodiments, the use of the blocking layer process and the solid containing salt process described herein may be utilized together in any combination and in any order to achieve the desired stress profiles.

Figure 10:
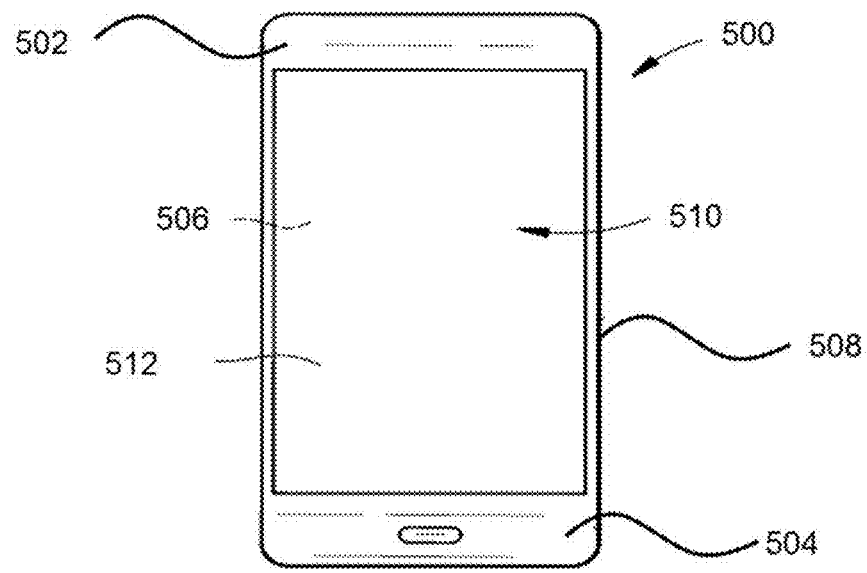
FIG. 10 is schematic, front plan view of a consumer electronic product including one or more embodiments of the alkali aluminosilicate glass articles described herein.
Figure 11:
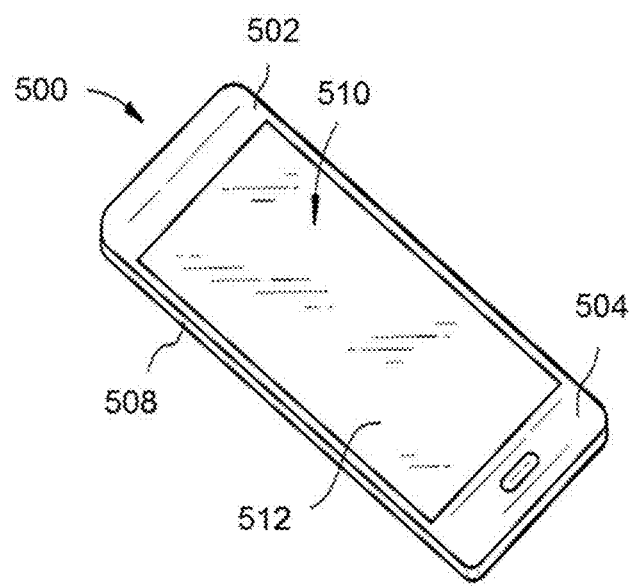
FIG. 11 is a schematic, prospective view of the consumer electronic product of FIG. 10.

In some embodiments, the glass articles described herein form a portion of a consumer electronic product, such as a cellular phone or smart phone, laptop computers, tablets, or the like. A schematic view of a consumer electronic product (e.g., a smart phone) is shown in FIGS. 10 and 11. A consumer electronic device 500 including a housing 502 having front 504, back 506, and side surfaces 508; electrical components (not shown) that are at least partially inside or entirely within the housing and including at least a controller, a memory, and a display 510 at or adjacent to the front surface of the housing; and a cover substrate 512 at or over the front surface of the housing such that it is over the display. In some embodiments, the cover substrate 512 and/or housing may include any of the glass articles disclosed herein.

EXEMPLARY EMBODIMENTS

Example 1

Glass article samples having a composition of 57.43 mol % $SiO_2$, 16.10 mol % $Al_2O_3$, 17.05 mol % $Na_2O$, 2.81 mol % MgO, 0.003 mol % $TiO_2$, 0.07 mol % $SnO_2$, and 6.54 mol % $P_2O_5$. The samples were in the form of flat 2 inch by 2 inch square sheets, with thicknesses of 0.4 mm, 0.5 mm, or 0.8 mm.

The samples were washed with deionized (DI) water and weighed with a high precision scale. The samples were then placed on a hot plate set at 200° C., to ensure that the salt solution that is sprayed on the surface of the sample dried quickly and that no residual water was present in the resulting salt deposit. The temperature of the sample was presumed to be between about 80° C. and 150° C. The number of actual sprays applied to the surface of the sample depended on the weight of salt desired on the sample. The number of spray applications was from 15 to 30. After the spray application was complete, the sample was weighed again to determine the total weight gain of salt. The total weight of salt on the sample is was between 0.07 g and 0.15 g, depending on which salt composition was employed. The sample was then placed in an oven at 460° C. with the spray coated side facing up for 8 hrs when the thickness of the sample was 0.4 mm and 14 hrs when the thickness of the sample was either 0.5 mm or 0.8 mm. The sample was also covered with a glass petri dish lid that did not make contact with the surface of the sample when placed in the oven. The surface of the sample that was coated is designated as the "back" surface with a negative warp and convex shape. Table 1 below reports the conditions used for the 1st IOX step.

The total volume of salt by weight employed in the spray coating process was 58 g dissolved in 200 mL of DI water. Four different salt solutions were prepared for use in the first IOX step, including: 100% KNO$_3$, 10% NaNO$_3$/90% KNO$_3$, 40% NaNO$_3$/60% KNO$_3$, and 50% NaNO$_3$/50% KNO$_3$. These salt solutions were prepared in separate containers, and the salt was allowed to dissolve before being strained into a spray bottle to remove large contamination particles.

The samples were characterized after the first IOX step by washing the samples with DI water to remove any residual salt, measuring warp with a profilometer, measuring weight using a high precision scale, and performing prism coupling measurements to determine the compressive stress, knee compressive stress, and depth of layer.

The second step in the IOX process was a spray coating on the opposite side of the sample from the first IOX step. This opposite side is designated as the "front" surface and has a negative warp and concave shape. The process employed 100% KNO$_3$ salt with approximately 0.18 g to 0.2 g of salt by weight. The surface in the second IOX step was coated in the same way as the first, using the hot plate. Once the sample was coated it was placed in the oven, with the salt facing up for 1.5 hrs to 2 hrs total at 420° C. and was again covered in the same manner as the first IOX step.

The third IOX step was a two sided ion exchange bath where both sides of the sample were spiked with a 99.5% KNO$_3$/0.5% NaNO$_3$ solution. The samples were preheated at 250° C. for 5 minutes and then 380° C. for 5 minutes. The samples were then ion exchanged in the salt bath for either 8 minutes or 11 minutes at 390° C. All of the samples reported in Table I below had a third IOX step in the 99.5% KNO$_3$/0.5% NaNO$_3$ salt bath for 8 minutes.

Characterization after second and third IOX steps included washing the samples with DI water to remove any residual salt, measuring warp with a profilometer, measuring warp with a flatmaster system, measuring weight with a high precision scale, measuring center tension with SCALP, and performing prism coupling measurements to determine the compressive stress, knee stress and depth of layer. The overall stress profile and mechanical properties for each of the samples were then calculated.

TABLE I

| | Pre Warp | | | 1st step IOX at 460° C. on Front Surface | | | 2nd step IOX at 100% K/420° C. on Back Surface | | Final Warp | |
|---|---|---|---|---|---|---|---|---|---|---|
| ID | Cross (μm) | Diag (μm) | t (mm) | % NaNO$_3$ | Salt Mass (g/cm$^2$) | IOX time (hr) | Salt Mass (g/cm$^2$) | ix time (hr) | Cross (μm) | Diag (μm) |
| F3I | 539 | 525 | 0.5 | 40 | 0.0028 | 14 | 0.0072 | 1.5 | 15 | 43 |
| F3J | 546 | 1076 | 0.5 | 40 | 0.0028 | 14 | 0.0072 | | 29 | 97 |
| F3L | 663 | 1342 | 0.4 | 40 | 0.0028 | 8 | 0.0072 | | 197 | 436 |
| F3M | 610 | 1238 | 0.4 | 50 | 0.004 | 8 | 0.0072 | | 156 | 265 |
| F3N | 548 | 1116 | 0.5 | 50 | 0.004 | 14 | 0.0072 | | 95 | 189 |
| F3O | 534 | 1051 | 0.5 | 50 | 0.004 | 14 | 0.0072 | 2 | 21 | 56 |

The cross warp was measured along a line with a length equivalent to the length of an edge of the sample and extending through the center of a major surface of the sample and parallel to an edge of the major surface and is the difference between the maximum and minimum height of the sample surface along this line. The diagonal warp was measured along a line extending diagonally between two corners and passing through a center of a major surface of the sample and is the difference between the maximum and minimum height of the sample surface along this line. Pre warp refers to the warp of the sample prior to the IOX treatment, and the final warp refers to the warp of the sample after the completion of the IOX treatment.

Figure 12:
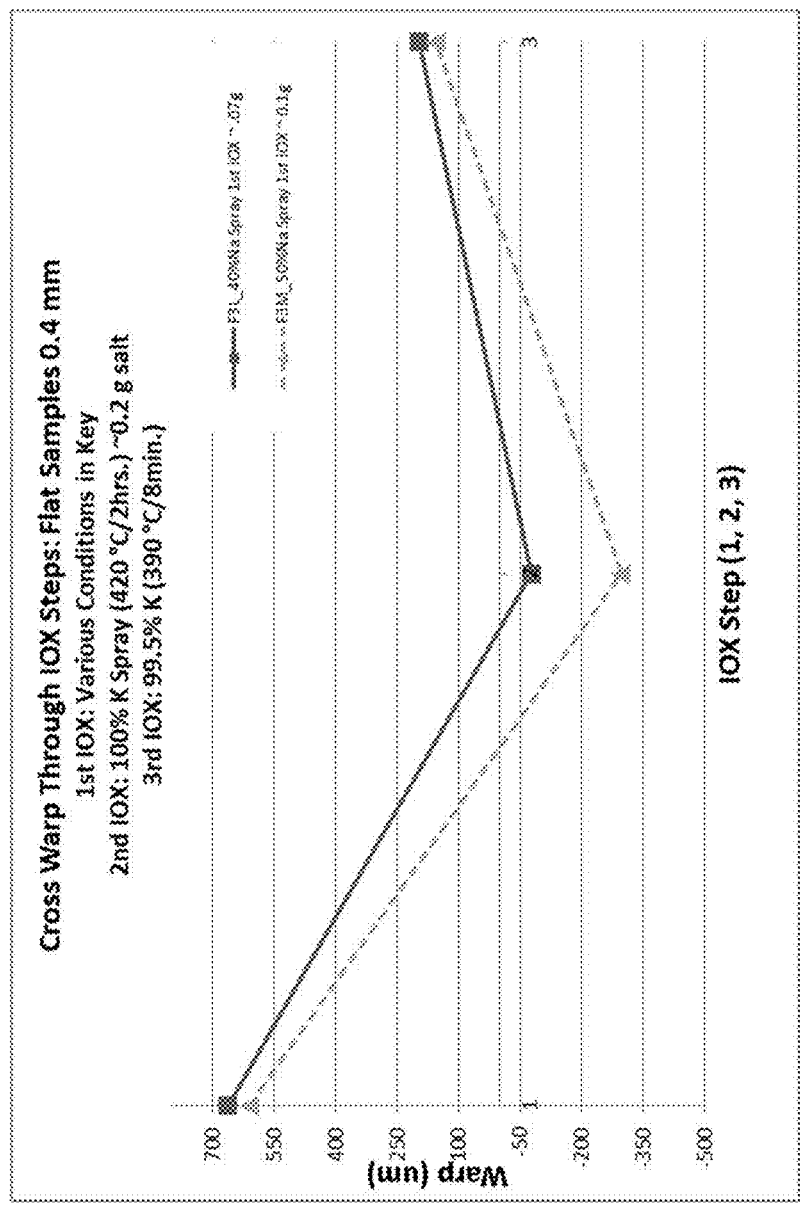
FIG. 12 is a plot of cross warp for samples at various stages in an ion exchange process.
Figure 13:
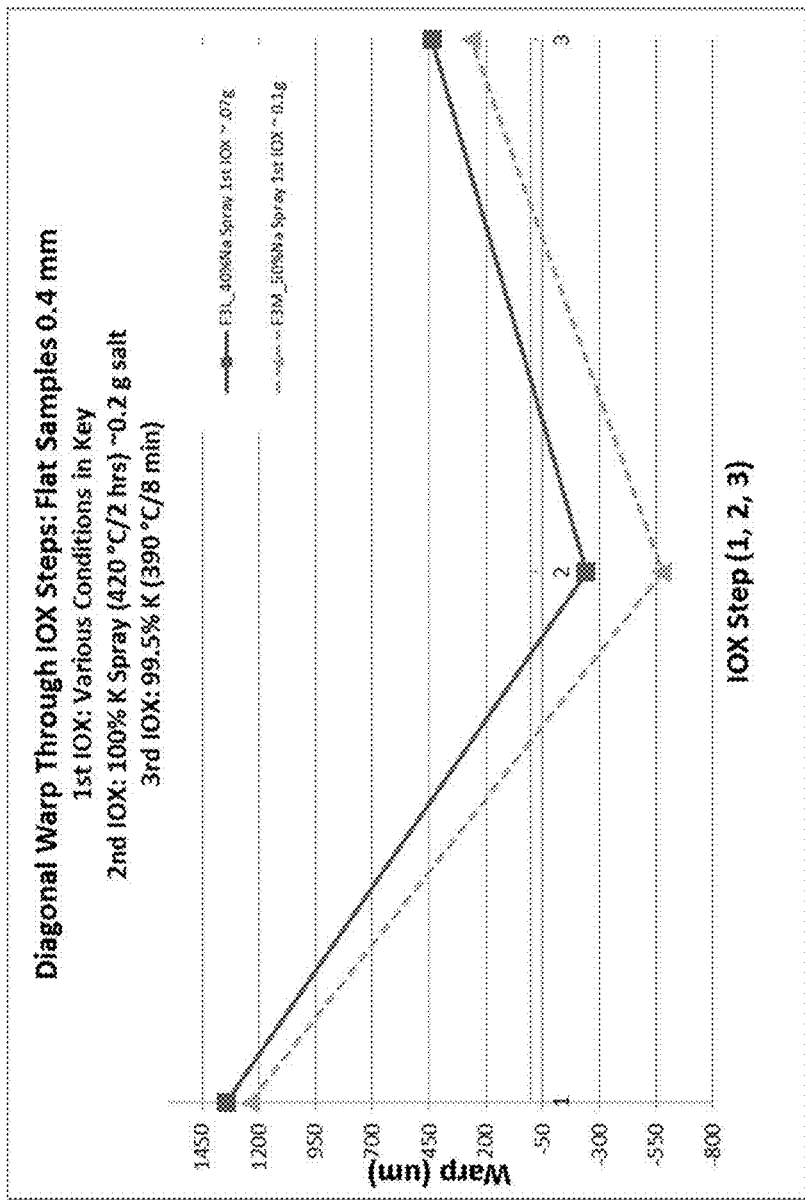
FIG. 13 is a plot of diagonal warp for the samples of FIG. 12 at various stages in an ion exchange process.

FIGS. 12 and 13 depict the cross warp and diagonal warp, respectively, for 0.4 mm thick samples after each step in the IOX process, with two different salt compositions employed for the first IOX step. The salt concentrations employed in the first IOX step were 40% NaNO$_3$/60% KNO$_3$ and 50% NaNO$_3$/50% KNO$_3$, with total salt weight of about 0.07 g and about 0.1 g, respectively. The second IOX step was conducted with 100% KNO$_3$ at a temperature of 420° C. for a time of 2 hours with a total salt weight of about 0.2 g. The third IOX step was conducted with 99.5% KNO$_3$ at a temperature of 390° C. for a time of 8 minutes.

Figure 14:
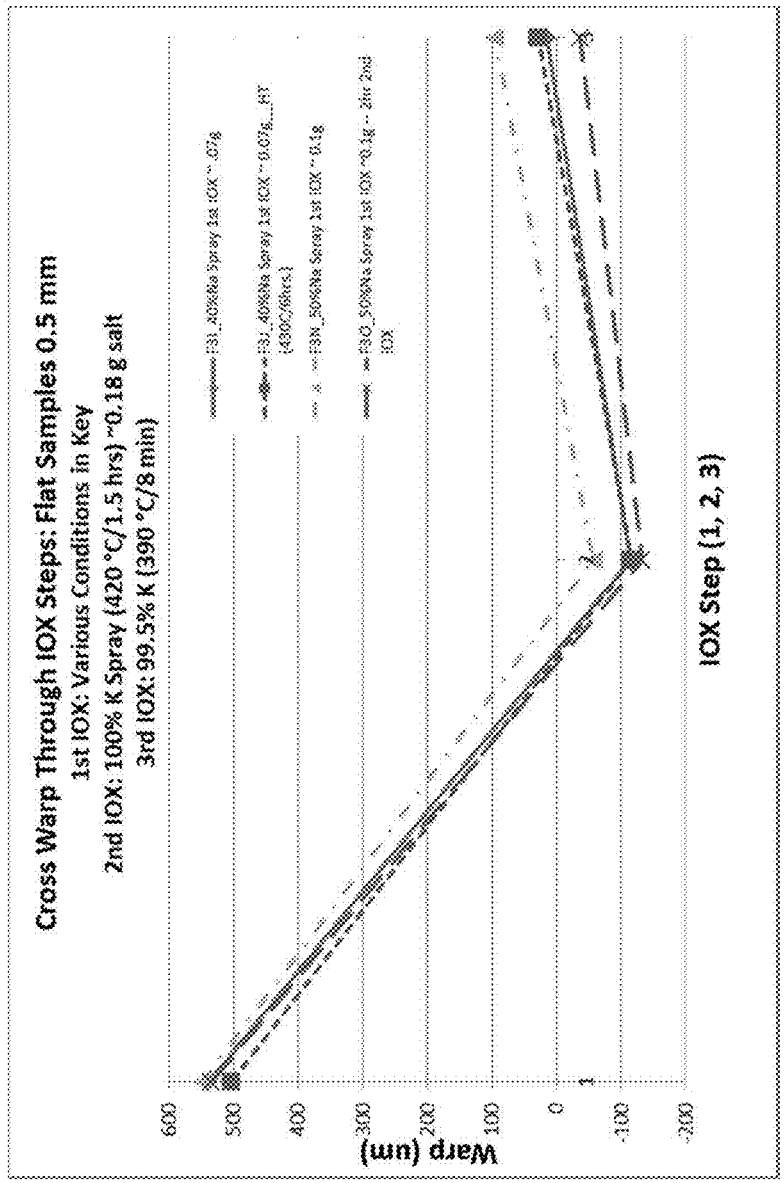
FIG. 14 is a plot of cross warp for samples at various stages in an ion exchange process.
Figure 15:
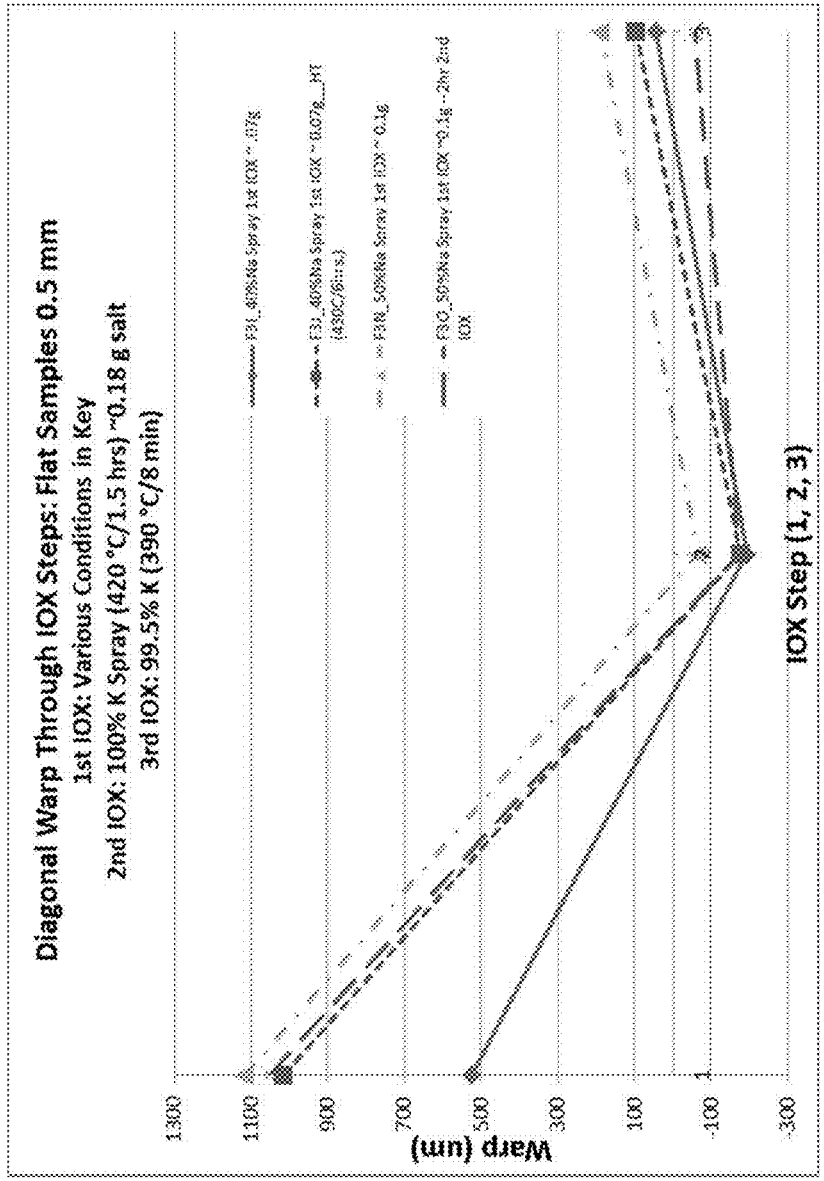
FIG. 15 is a plot of diagonal warp for the samples of FIG. 14 at various stages in an ion exchange process.

FIGS. 14 and 15 depict the cross warp and diagonal warp, respectively, for 0.5 mm thick samples after each step in the IOX process, with different first IOX conditions. The salt concentrations employed in the first IOX step were 40% NaNO$_3$/60% KNO$_3$ and 50% NaNO$_3$/50% KNO$_3$, with total salt weight of about 0.07 g and about 0.1 g, respectively. The second IOX step was conducted with 100% KNO$_3$ at a temperature of 420° C. for a time of 1.5 hours with a total salt weight of about 0.18 g, with the exception of sample F3O which had a second IOX step time of 2 hours. The third IOX step was conducted with 99.5% KNO$_3$ at a temperature of 390° C. for a time of 8 minutes. Sample F3J additionally included a heat treatment between the first and second IOX steps at 430° C. for 6 hours.

Example 2

Glass article samples having a composition of 63.60 mol % SiO$_2$, 15.67 mol % Al$_2$O$_3$, 10.81 mol % Na$_2$O, 1.16 mol % ZnO, 6.24 mol % Li$_2$O, 0.04 mol % SnO$_2$, and 2.48 mol % $P_2O_5$. The samples were in the form of flat 2 inch by 2 inch square sheets, with thicknesses of 0.5 mm or 0.8 mm.

The process employed for making asymmetric stress profiles with initially flat samples consisted of a three step ion exchange. The samples were washed with deionized (DI) water and weighed with a high precision scale. The samples were then placed on a hot plate set at 200° C., to ensure that the salt solution that is sprayed on the surface of the sample dried quickly and that no residual water was present in the resulting salt deposit. The temperature of the sample was presumed to be between about 80° C. and 150° C. The number of actual sprays applied to the surface of the sample depended on the weight of salt desired on the sample. The number of spray applications was from 15 to 30. After the spray application was complete, the sample was weighed again to determine the total weight gain of salt. The total weight of salt on the sample was between 0.07 g and 0.15 g, depending on which salt composition was employed. The sample was then placed in the oven with the coated side facing up for 0.5 hrs to 1 hr at a temperature 370° C. If the oven temperature was 390° C., the time was 1 hr to 2 hrs. The sample was also covered with a glass petri dish lid that did not make contact with the surface of the sample when placed in the oven. The surface of the sample that was coated is designated as the "back" surface with a negative warp and convex shape.

The second IOX step in the process was a two sided ion exchange. The second IOX step was performed at various times with various salt compositions. The salt compositions employed were 25% $NaNO_3$/75% $KNO_3$, 70% $NaNO_3$/30% $KNO_3$ and 49% NaNO3/51% $KNO_3$. The various times employed were 1.5 hrs, 2 hrs, 2.5 hrs, 3.17 hrs, 3.5 hrs, and 3.67 hrs. The samples were preheated inside the chamber alongside the bath at the same temperature of the bath for a total of 10 minutes. The samples were then submerged into the salt bath.

The third IOX step in the process is an ion exchange bath where both sides of the glass are spiked with a 94% $KNO_3$/6% $NaNO_3$ solution at 380° C. for 30 minutes to 36 minutes. The samples were preheated inside the chamber alongside the bath at the same temperature of the bath for a total of 10 minutes.

Characterization after the second and third IOX steps included washing the samples with DI water to remove any residual salt, measuring warp with a profilometer, measuring warp with a flatmaster system, measuring weight with a high precision scale, measuring center tension with SCALP, and performing prism coupling measurements to determine the compressive stress, knee stress and depth of layer. The overall stress profile and mechanical properties for each of the samples were then calculated. Results for the samples are reported in Table II.

TABLE II

| | | Pre Warp | | | | 1st step IOX at 100% $KNO_3$ on Back Surface | | | 2nd step double sided IOX at 380° C. | | 3rd step Spike 6% $NaNO_3$ at 380° C. | Final Warp | |
|---|---|---|---|---|---|---|---|---|---|---|---|---|---|
| | | | | | Salt | IOX | IOX | | IOX | IOX | | | |
| Sample | Heat Treat | Cross (μm) | Diag (μm) | t (mm) | Mass (g/cm²) | temp (° C.) | time (hr) | % $NaNO_3$ | time (hr) | time (hr) | | Cross (μm) | Diag (μm) |
| F1A | N | 58 | 106 | 0.8 | 0.005 | 370 | 0.5 | 49 | 3.67 | 0.6 | | 13 | 22 |
| F1B | N | 52 | 95 | 0.8 | 0.005 | 370 | 0.5 | 49 | 2.05 | 0.6 | | 15 | 30 |
| F1D | N | 47 | 87 | 0.8 | 0.005 | 370 | 0.5 | 70 | 3.17 | 0.6 | | 16 | 29 |
| F1I | Y | 129 | 243 | 0.8 | 0.006 | 390 | 2 | 49 | 2 | 0.5 | | 84 | 161 |
| F1J | N | 142 | 266 | 0.8 | 0.006 | 390 | 2 | 49 | 2 | 0.5 | | 68 | 126 |
| F1M | Y | 203 | 373 | 0.5 | 0.006 | 390 | 1 | 49 | 2.5 | 0.5 | | 94 | 169 |
| F1N | N | 225 | 436 | 0.5 | 0.006 | 390 | 1 | 49 | 2.5 | 0.5 | | 106 | 201 |
| F1S | Y | 237 | 427 | 0.5 | 0.006 | 390 | 1 | 49 | 1.5 | 0.5 | | 103 | 195 |
| F1T | N | 253 | 452 | 0.5 | 0.006 | 390 | 1 | 49 | 1.5 | 0.5 | | 104 | 189 |

The spray coating solution included 100% $KNO_3$ in DI water. The total volume of salt by weight employed was 58 g dissolved in 200 mL of DI water. The salt solution was prepared in a separate container, and the salt was allowed to dissolve before being strained into a spray bottle to remove large contamination particles.

A heat treatment was also employed after the first IOX step. The heat treatment was performed for times of 1 hr, 1.5 hrs, and 2 hrs at 390° C. The heat treatment produced some change in warp depending on which conditions were employed. The heat treatment served to increase the depth of compression.

Characterization after the first IOX step included washing the samples with DI water to remove any residual salt, measuring warp using a profilometer, measuring weight using a high precision scale, and performing prism coupling measurements to determine the compressive stress, knee stress and depth of layer.

Figure 16:
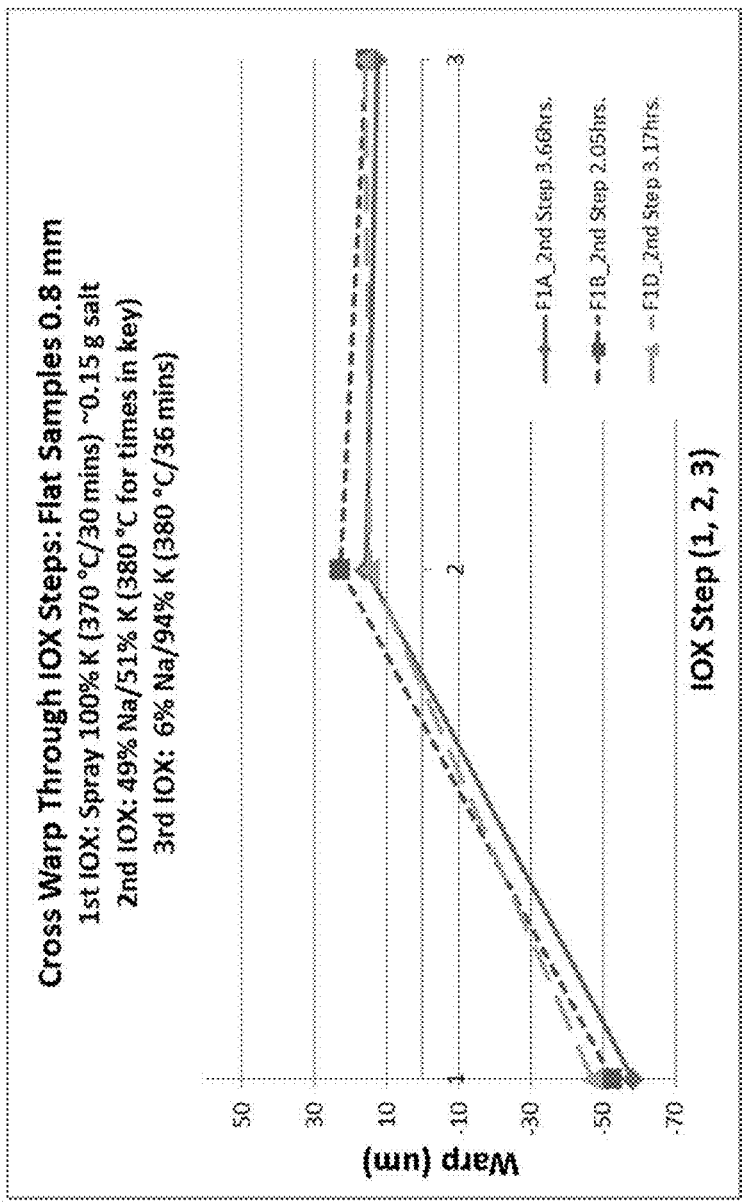
FIG. 16 is a plot of cross warp for samples at various stages in an ion exchange process.
Figure 17:
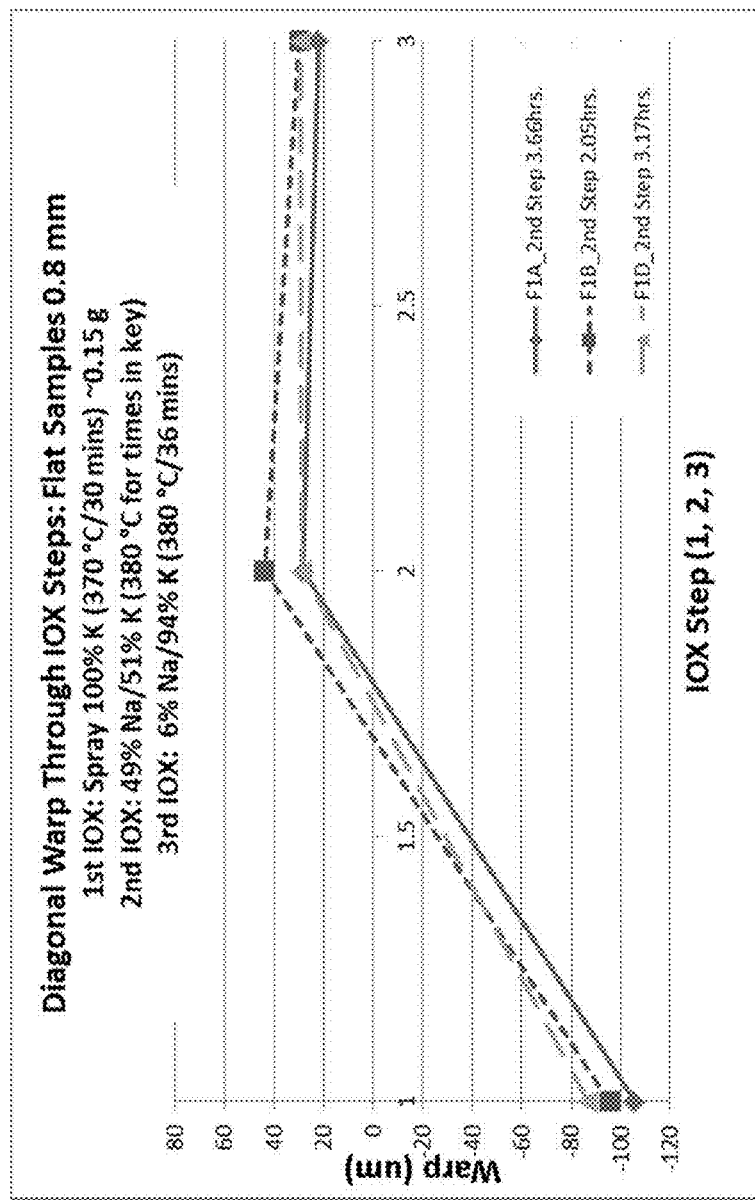
FIG. 17 is a plot of diagonal warp for the samples of FIG. 16 at various stages in an ion exchange process.

FIGS. 16 and 17 depict the cross warp and diagonal warp, respectively, for 0.8 mm thick samples after each step in the IOX process, with different second IOX step times. The salt concentration employed in the first IOX step was 100% $KNO_3$ at a temperature of 370° C. for a time of 30 minutes with a total salt weight of about 0.15 g. The second IOX step utilized a salt concentration of 49% $NaNO_3$/51% $KNO_3$ at a temperature of 380° C. for a time of 2.05 hours, 3.17 hours, and 3.66 hours. The third IOX step was conducted with 6% $NaNO_3$/94% $KNO_3$ at a temperature of 380° C. for a time of 36 minutes.

Figure 18:
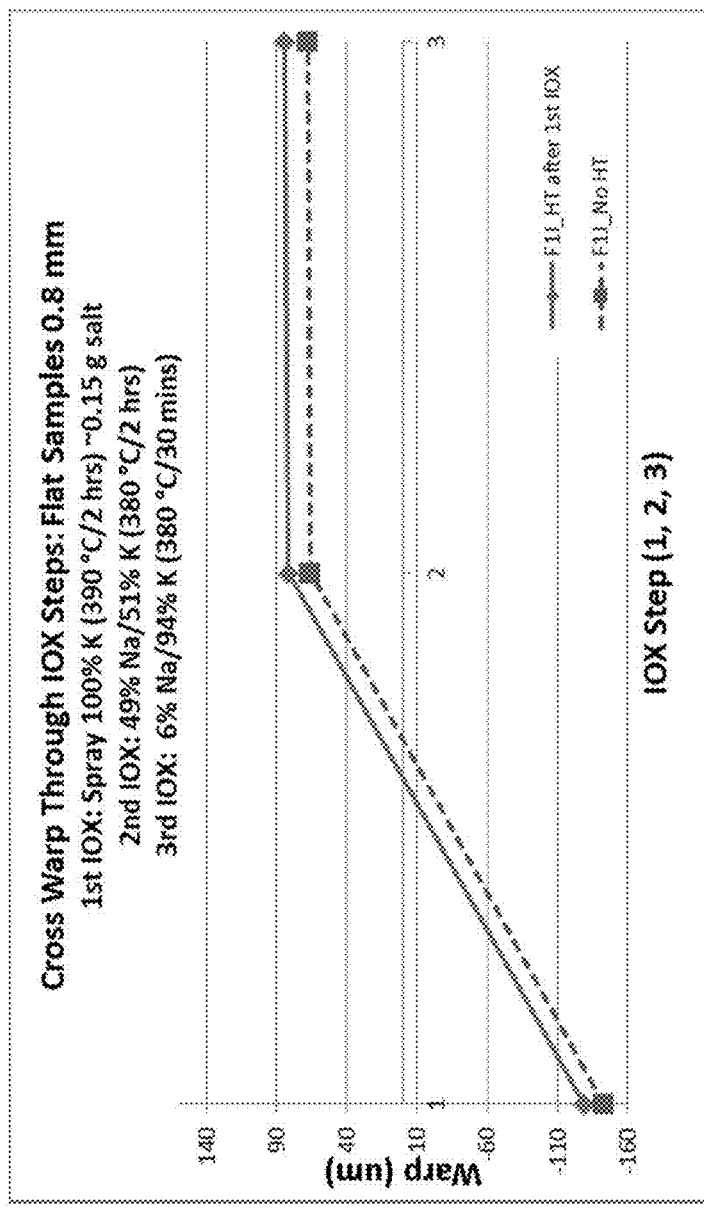
FIG. 18 is a plot of cross warp for samples at various stages in an ion exchange process.
Figure 19:
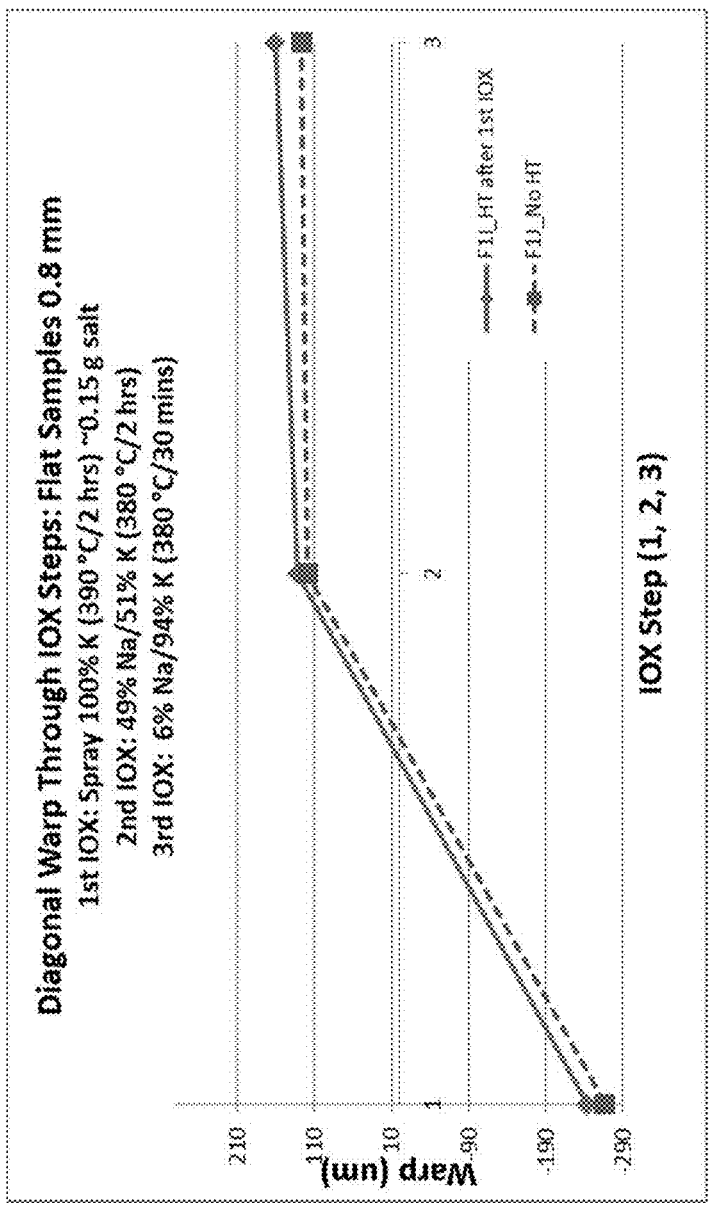
FIG. 19 is a plot of diagonal warp for the samples of FIG. 18 at various stages in an ion exchange process.

FIGS. 18 and 19 depict the cross warp and diagonal warp, respectively, for 0.8 mm thick samples after each step in the IOX process. The salt concentration employed in the first IOX step was 100% $KNO_3$ at a temperature of 390° C. for a time of 2 hours with a total salt weight of about 0.15 g. The second IOX step utilized a salt concentration of 49% $NaNO_3$/51% $KNO_3$ at a temperature of 380° C. for a time of 2 hours. The third IOX step was conducted with 6% NaNO$_3$/ 94% KNO$_3$ at a temperature of 380° C. for a time of 30 minutes. Sample F1I additionally included a heat treatment between the first and second IOX steps.

Figure 20:
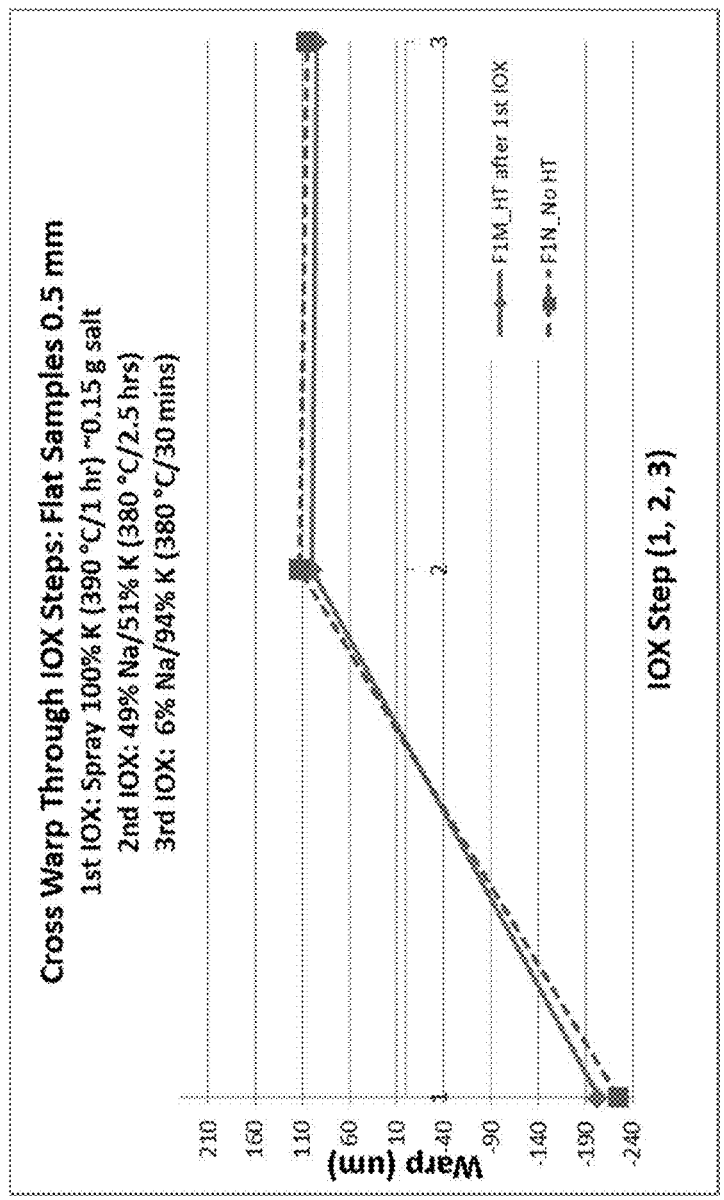
FIG. 20 is a plot of cross warp for samples at various stages in an ion exchange process.
Figure 21:
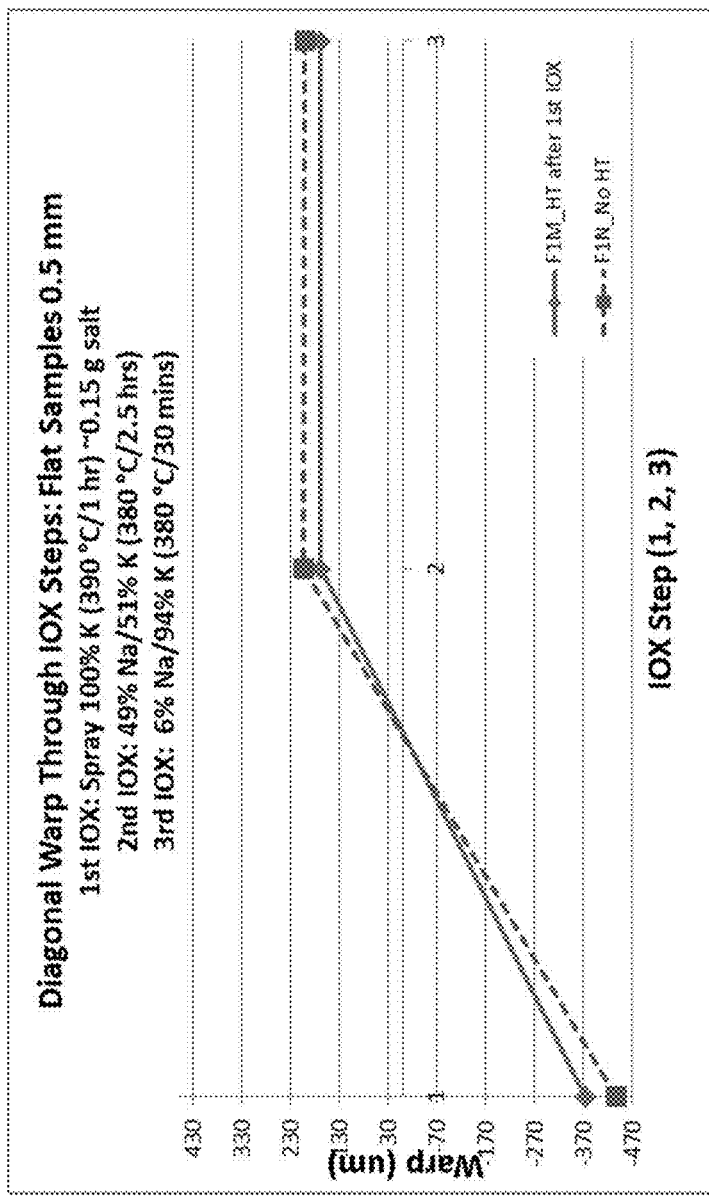
FIG. 21 is a plot of diagonal warp for the samples of FIG. 20 at various stages in an ion exchange process.

FIGS. 20 and 21 depict the cross warp and diagonal warp, respectively, for 0.5 mm thick samples after each step in the IOX process. The salt concentration employed in the first IOX step was 100% KNO$_3$ at a temperature of 390° C. for a time of 1 hour with a total salt weight of about 0.15 g. The second IOX step utilized a salt concentration of 49% NaNO$_3$/51% KNO$_3$ at a temperature of 380° C. for a time of 2.5 hours. The third IOX step was conducted with 6% NaNO$_3$/94% KNO$_3$ at a temperature of 380° C. for a time of 30 minutes. Sample F1M additionally included a heat treatment between the first and second IOX steps.

Figure 22:
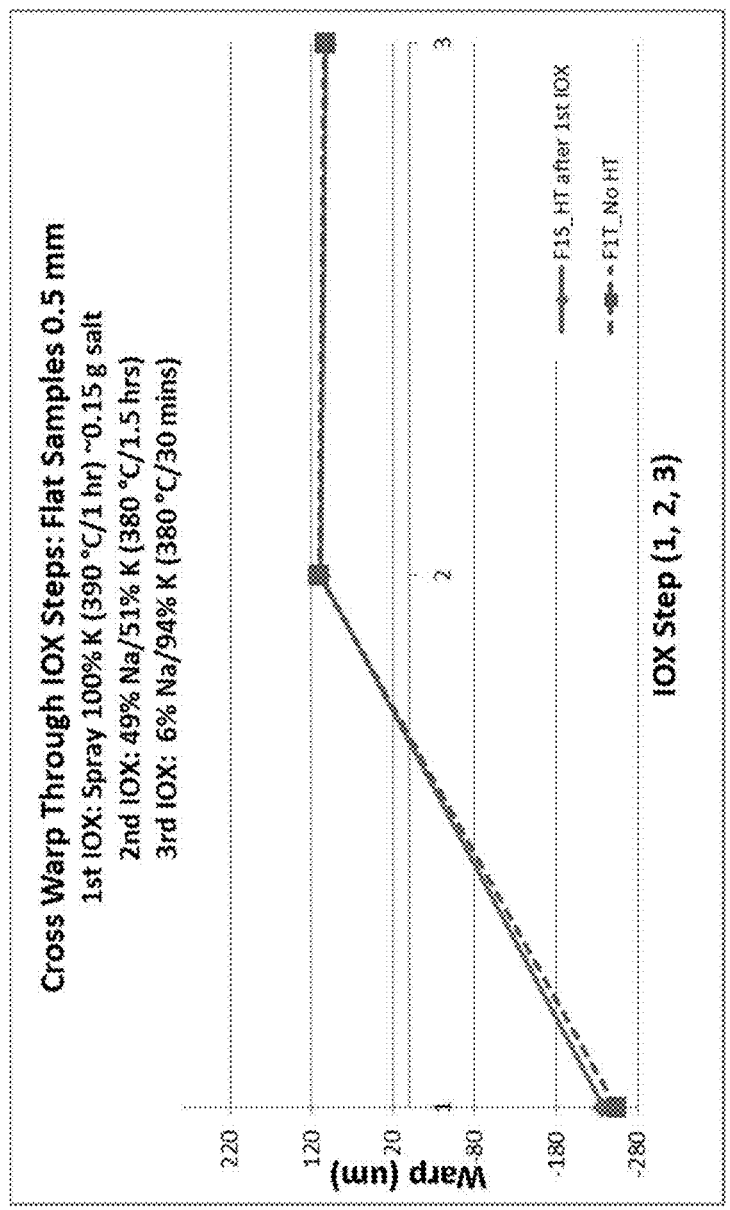
FIG. 22 is a plot of cross warp for samples at various stages in an ion exchange process.
Figure 23:
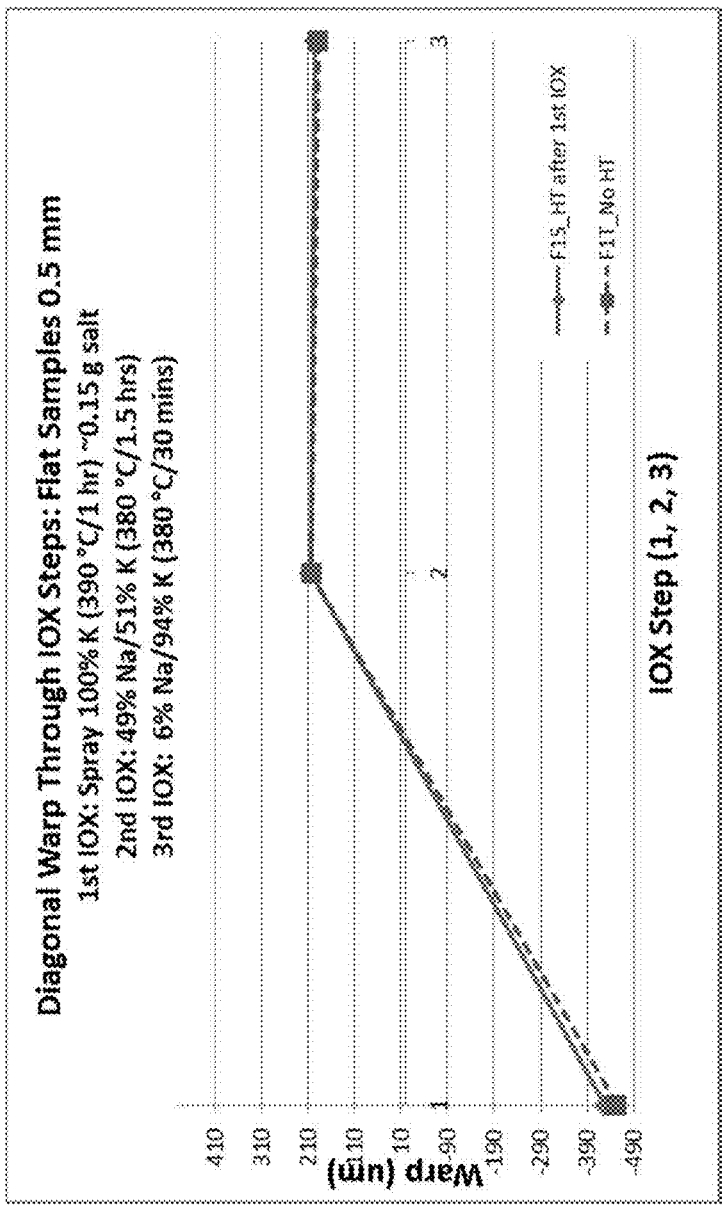
FIG. 23 is a plot of diagonal warp for the samples of FIG. 22 at various stages in an ion exchange process.

FIGS. 22 and 23 depict the cross warp and diagonal warp, respectively, for 0.5 mm thick samples after each step in the IOX process. The salt concentration employed in the first IOX step was 100% KNO$_3$ at a temperature of 390° C. for a time of 1 hour with a total salt weight of about 0.15 g. The second IOX step utilized a salt concentration of 49% NaNO$_3$/51% KNO$_3$ at a temperature of 380° C. for a time of 1.5 hours. The third IOX step was conducted with 6% NaNO$_3$/94% KNO$_3$ at a temperature of 380° C. for a time of 30 minutes. Sample F1S additionally included a heat treatment between the first and second IOX steps.

Example 3

Glass article samples having a composition of 63.60 mol % SiO$_2$, 15.67 mol % Al$_2$O$_3$, 10.81 mol % Na$_2$O, 1.16 mol % ZnO, 6.24 mol % Li$_2$O, 0.04 mol % SnO$_2$, and 2.48 mol % P$_2$O$_5$. The samples were in the form of flat 2 inch by 2 inch square sheets, with thicknesses of 0.5 mm.

The samples were pre warped in a large aluminum mold. The heat treatment process in the oven is a ramp rate of 20° C./minute to 570° C., and then the samples are maintained at that temperature for either 3 hrs or 5 hrs. Both temperatures were used in different processes. Up to seven samples were placed fit in the mold at a time. A carbon suspension was used to protect the mold from any puncture damage that the samples could cause to the soft aluminum. The samples were also shaped to round out and smooth the edges to further protect the mold. Once the samples were pre warped, they were characterized by weight using a high precision scale and warp measurements were taken using a profilometer. The convex side of the sample will be designated as the "back" side.

A two-step IOX process was applied to the samples. The two-step ion exchange process for making asymmetric profiles with initially warped samples started with an initial one-sided bath with a certain concentration of salt. Both a 1% LiNO$_3$/99% KNO$_3$ and a 2% LiNO$_3$/98% KNO$_3$ bath were employed in a one-sided IOX step carried out at 390° C. The bath was made in a shallow and circular stainless steel container. The sample was washed, weighed, and measured for warp before the start of the IOX. The convex side of the pre-warped sample is placed down into the bath using a small piece of metal mesh and flat tweezers. The salt only contacts the convex side of the sample. The time for the first IOX step varied, including: 40 minutes, 50 minutes, 60 minutes, 72 minutes, and 90 minutes.

Characterization after the first IOX step included: washing the samples with DI water to remove any residual salt, measuring warp using a profilometer, measuring weight using a high precision scale, and performing prism coupling measurements to determine the compressive stress, knee stress and depth of layer.

The second IOX step was a double sided exchange performed on both sides of the sample. Prior to the second ion exchange the samples were preheated in the oven in a secondary container for 10 minutes at the same temperature as the ion exchange bath, 350° C. There are two different bath concentrations used in this process which include a 15% NaNO$_3$/85% KNO$_3$ and a 25% NaNO$_3$/75% KNO$_3$. For both of the second IOX step bath conditions multiple times were employed, varying from 1 hr to 4 hrs.

Characterization after the second IOX step included: washing the samples with DI water to remove any residual salt, measuring warp using a profilometer and a flatmaster system, measuring weight using a high precision scale, measuring center tension with SCALP, and performing prism coupling measurements to determine the compressive stress, knee stress and depth of layer. All measurements are used to determine the overall stress profile and mechanical properties for each of the samples.

Figure 24:
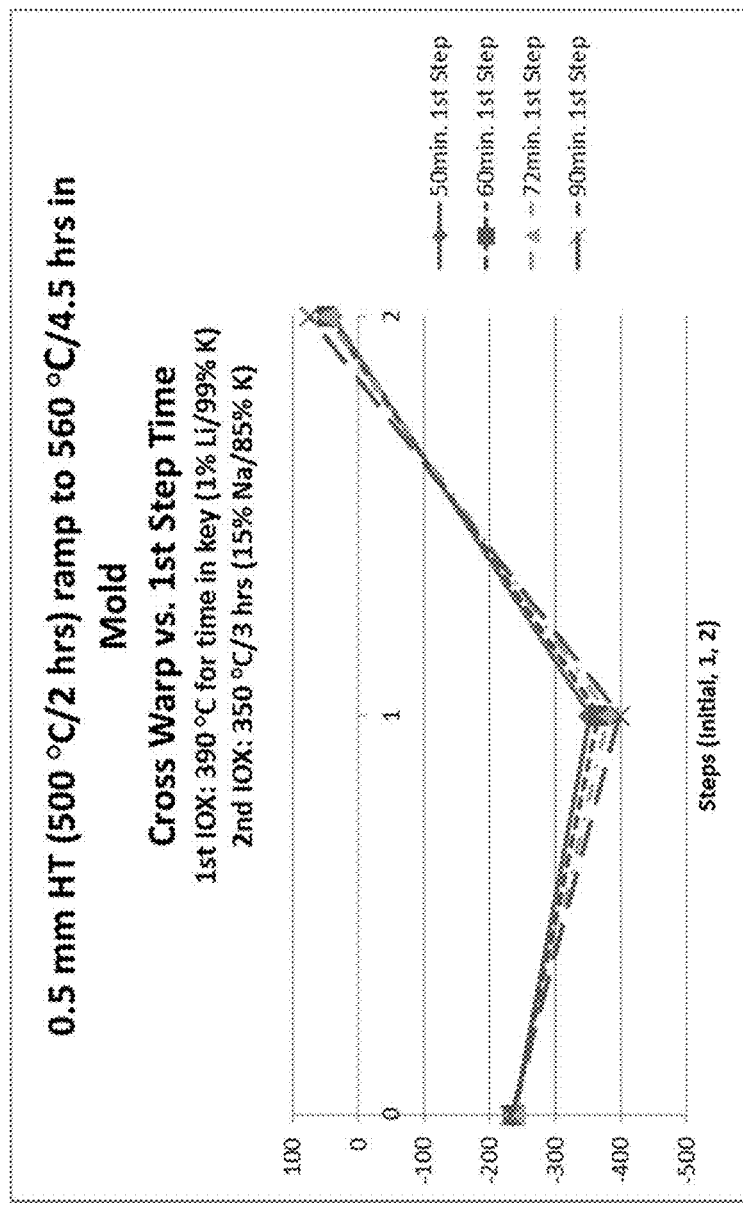
FIG. 24 is a plot of cross warp for samples at various stages in an ion exchange process.
Figure 25:
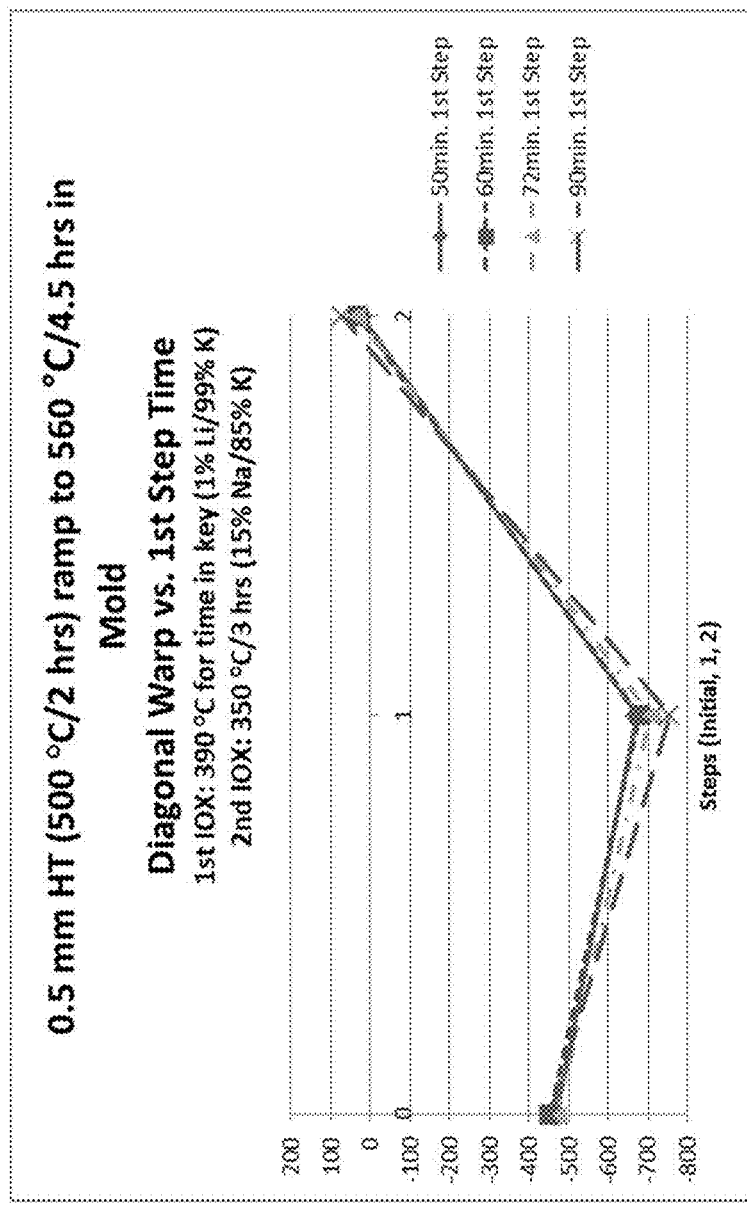
FIG. 25 is a plot of diagonal warp for the samples of FIG. 24 at various stages in an ion exchange process.

FIGS. 24 and 25 depict the cross warp and diagonal warp, respectively, for 0.5 mm thick pre warped samples after each step in an IOX process. The samples were pre warped by heat treatment in a spherical mold at a temperature of 500° C. for 2 hours and then ramped up to a temperature of 560° C. and treated for 4.5 hours. The salt concentration employed in the first IOX step was 1% LiNO$_3$ and 99% KNO$_3$ at a temperature of 390° C. for times of 50 minutes, 60 minutes, 72 minutes, and 90 minutes. The second IOX step utilized a salt concentration of 15% NaNO$_3$/85% KNO$_3$ at a temperature of 350° C. for a time of 3 hours. The initial condition shown in FIGS. 24 and 25 is the pre warped glass article.

Figure 26:
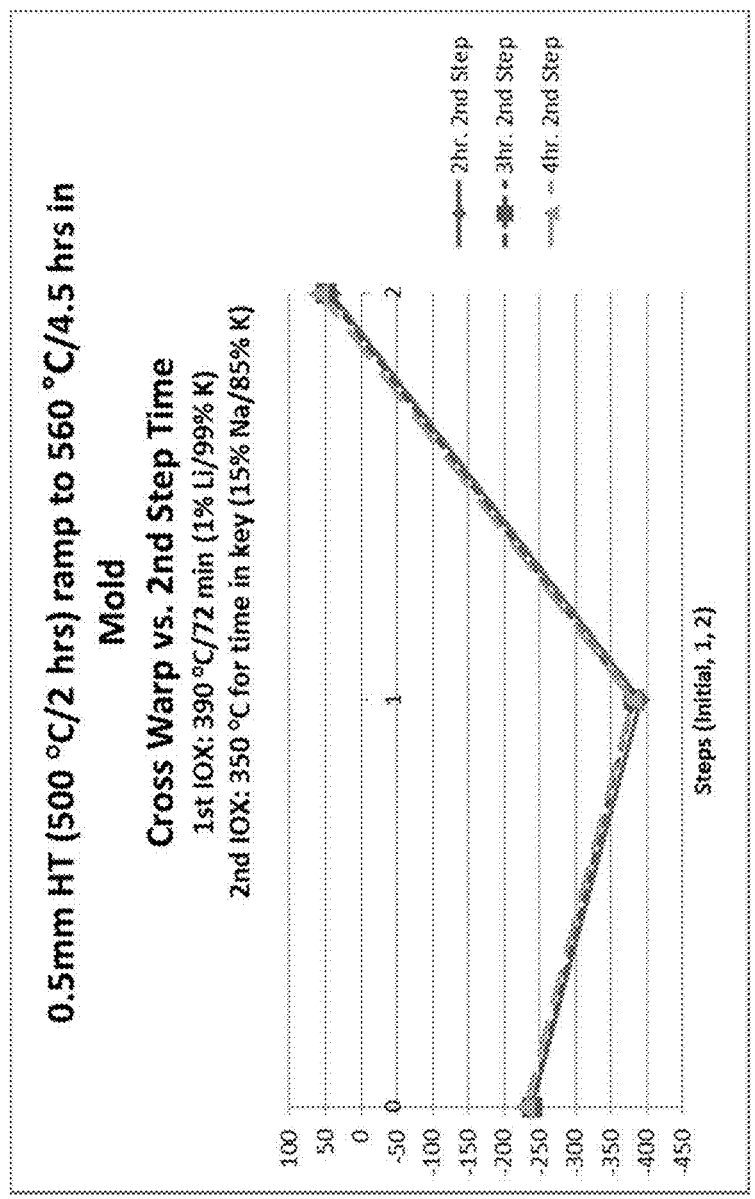
FIG. 26 is a plot of cross warp for samples at various stages in an ion exchange process.
Figure 27:
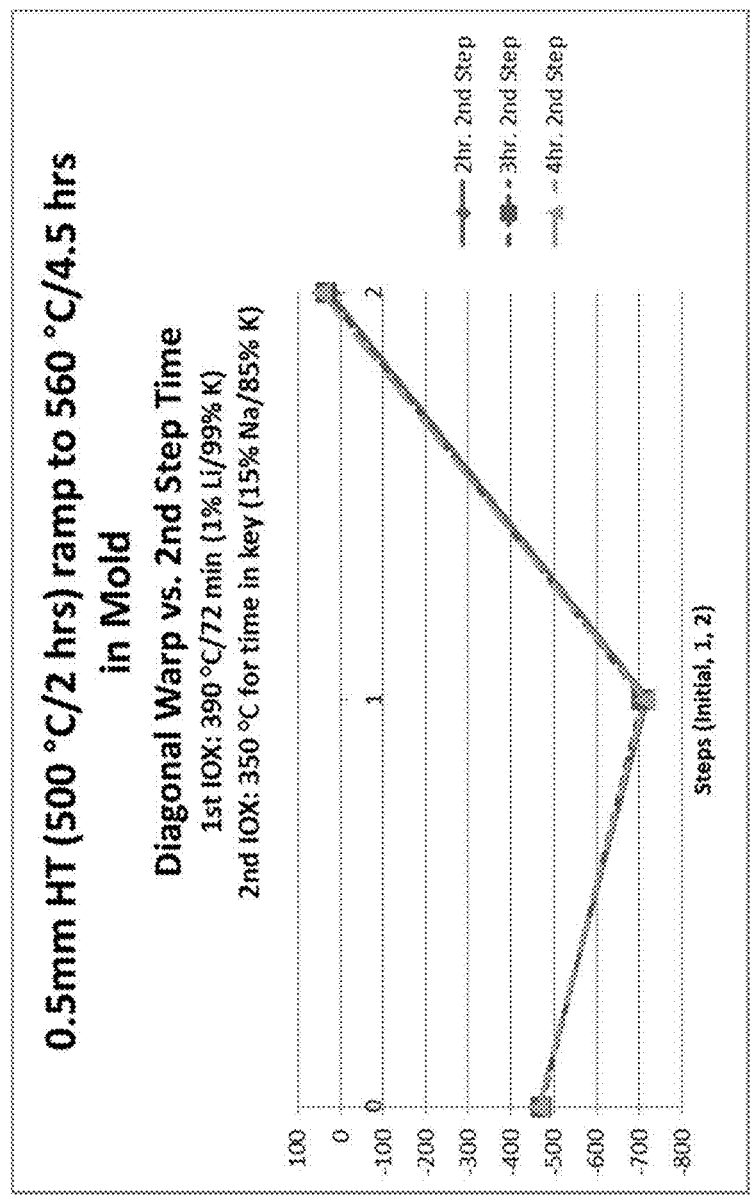
FIG. 27 is a plot of diagonal warp for the samples of FIG. 26 at various stages in an ion exchange process.

FIGS. 26 and 27 depict the cross warp and diagonal warp, respectively, for 0.5 mm thick pre warped samples after each step in an IOX process. The samples were pre warped by heat treatment in a spherical mold at a temperature of 500° C. for 2 hours and then ramped up to a temperature of 560° C. and treated for 4.5 hours. The salt concentration employed in the first IOX step was 1% LiNO$_3$ and 99% KNO$_3$ at a temperature of 390° C. for a time of 72 minutes. The second IOX step utilized a salt concentration of 15% NaNO$_3$/85% KNO$_3$ at a temperature of 350° C. for a time of 2 hours, 3 hours, and 4 hours. The initial condition shown in FIGS. 26 and 27 is the pre warped glass article.

Example 4

Glass article samples having a composition of 63.60 mol % SiO$_2$, 15.67 mol % Al$_2$O$_3$, 10.81 mol % Na$_2$O, 1.16 mol % ZnO, 6.24 mol % Li$_2$O, 0.04 mol % SnO$_2$, and 2.48 mol % P$_2$O$_5$. The samples were in the form of flat 2 inch by 2 inch square sheets, with thicknesses of 0.5 mm.

The first IOX step of Example 3 and the pre warp of the samples in the mold was performed. The first IOX step was carried out for a time of 40 minutes, 50 minutes, or 60 minutes.

A second IOX step was performed as a double sided exchange on both sides of the samples. The bath concentration used in the second IOX step was 49% $NaNO_3$/51% $KNO_3$. Two different ion exchange times were used, 1.25 hrs and 1.67 hrs. Prior to the second IOX step the samples are preheated in an oven in a secondary container for 10 minutes at the same temperature of the ion exchange, 380° C.

A third IOX step that imparted a compressive stress spike on both sides of the samples was also employed. The third IOX step employed a 4% $NaNO_3$/96% $KNO_3$ salt solution for a time of 20 minutes at a temperature of 380° C. Prior to the third IOX step the samples were preheated in an oven in a secondary container for 5 minutes at the same temperature as the ion exchange, 380° C.

Characterization after the second and third IOX step included: washing the samples with DI water to remove any residual salt, measuring warp using a profilometer and a flatmaster system, measuring weight using a high precision scale, measuring center tension with SCALP, and performing prism coupling measurements to determine the compressive stress, knee stress and depth of layer. All measurements are used to determine the overall stress profile and mechanical properties for each of the samples.

Figure 28:
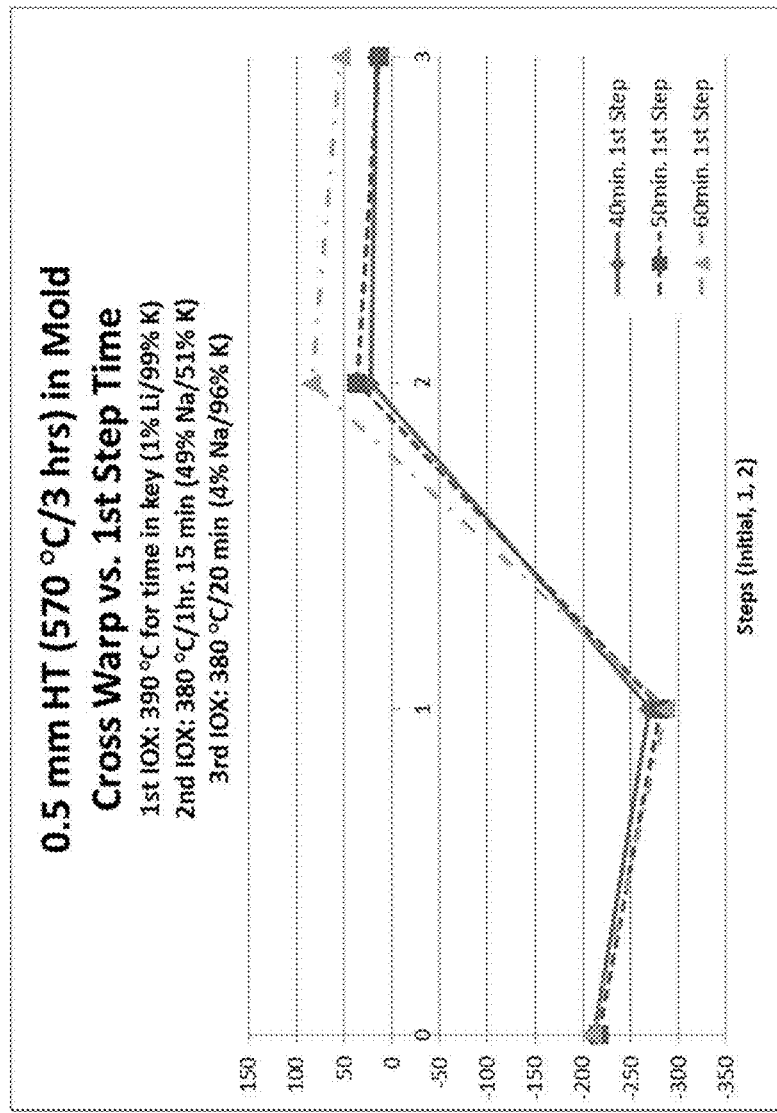
FIG. 28 is a plot of cross warp for samples at various stages in an ion exchange process.
Figure 29:
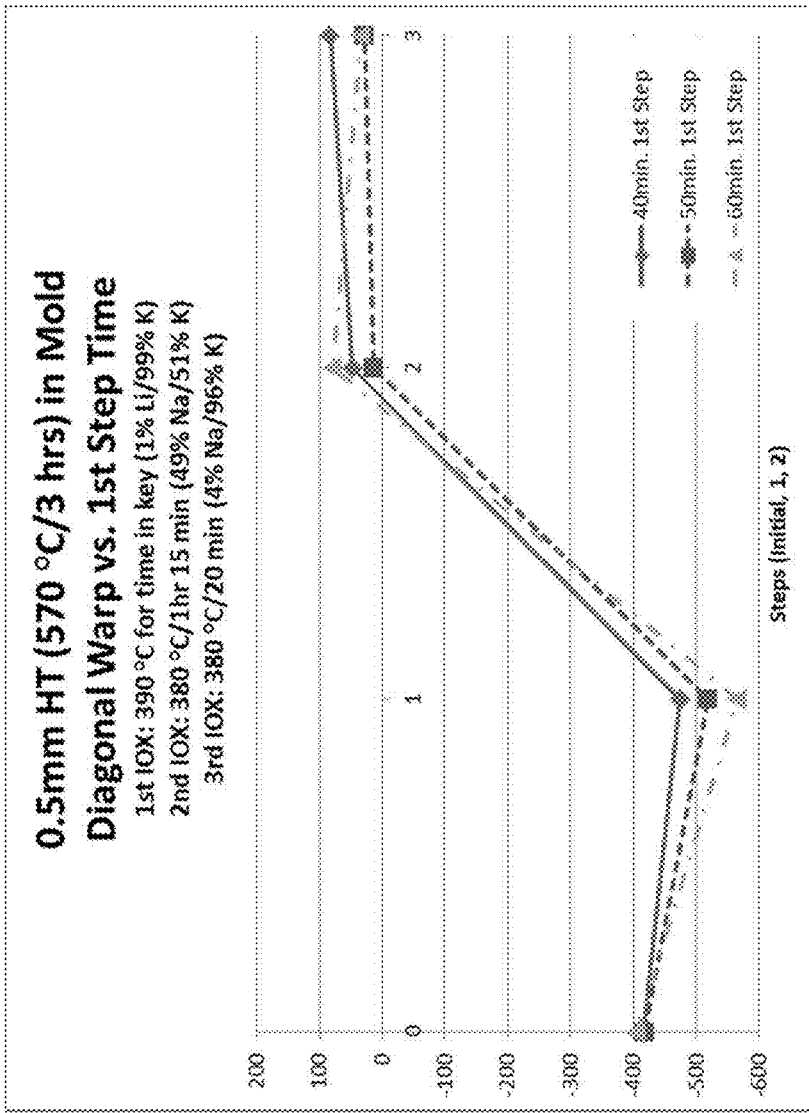
FIG. 29 is a plot of diagonal warp for the samples of FIG. 28 at various stages in an ion exchange process.

FIGS. 28 and 29 depict the cross warp and diagonal warp, respectively, for 0.5 mm thick pre warped samples after each step in an IOX process. The samples were pre warped by heat treatment in a spherical mold at a temperature of 570° C. for 3 hours. The salt concentration employed in the first IOX step was 1% $LiNO_3$ and 99% $KNO_3$ at a temperature of 390° C. for times of 40 minutes, 50 minutes, and 60 minutes. The second IOX step utilized a salt concentration of 49% $NaNO_3$/51% $KNO_3$ at a temperature of 380° C. for a time of 1 hour and 15 minutes. The third IOX step utilized a salt concentration of 4% $NaNO_3$/96% $KNO_3$ at a temperature of 380° C. for a time of 20 minutes. The initial condition shown in FIGS. 28 and 29 is the pre warped glass article.

Example 5

Glass article samples having a composition of 63.60 mol % $SiO_2$, 15.67 mol % $Al_2O_3$, 10.81 mol % $Na_2O$, 1.16 mol % ZnO, 6.24 mol % $Li_2O$, 0.04 mol % $SnO_2$, and 2.48 mol % $P_2O_5$. The samples were in the form of flat 2 inch by 2 inch square sheets, with thicknesses of 0.5 mm.

The samples were pre-warped in a large aluminum mold. The heat treatment process in the mold is a ramp rate of 20° C./minute to 500° C. where the sample was treated at that temperature for 2 hrs. An additional ramp at 2° C./minute to 560° C. where the sample was treated at that temperature for 4.5 hrs. To reduce initial warp, the final set point for the 4.5 hrs treatment was changed to 540° C. for some samples. Up to seven samples were placed in the mold at a time. A carbon suspension was used to protect the mold from any puncture damage that the samples could cause to the soft aluminum. The samples were also shaped to round out and smooth the edges to further protect the mold. Once the samples were pre-warped they were characterized by weight using a high precision scale and warp measurements were taken using a profilometer. The convex side of the sample was designated as the "back" side.

The samples were spray coated using a hot plate as described above. The range of total weight of salt on the sample was between 0.1 g and 0.2 g. The sample was then placed in the oven and covered as described above. The side that is coated is designated as the "back" side with negative warp and convex shape.

The three-step ion exchange process for making asymmetric profiles with initially warped samples, having thicknesses of 0.4 mm and 0.5 mm. The salt compositions used for spray coating included a 100% $KNO_3$ solution, a 2% $LiNO_3$/98% $KNO_3$, and a 4% $LiNO_3$/96% $KNO_3$. A single spray coat with larger volume of salt was attempted along with two spray coats with a slightly smaller volume of salt. Both a single and double spray coat was successfully scaled up to larger parts using the same procedure with a modification of the salt mass placed on the sample. Two temperatures used in the first IOX step procedure include 370° C. and 390° C. The first IOX step time ranged from 0.25 hr to 3 hrs, depending on whether a single or double coat of salt solution was employed.

Characterization after the first IOX step included: washing the samples with DI water to remove any residual salt, measuring warp using a profilometer, measuring weight using a high precision scale, and performing prism coupling measurements to determine the compressive stress, knee stress and depth of layer.

The second IOX step was a double sided exchange on both sides of the samples. The bath concentration used in this process was a 49% $NaNO_3$/51% $KNO_3$. Two different IOX times were used, 3.8 hrs and 4.5 hrs. Prior to ion exchange the samples are preheated in an oven in a secondary container for 10 minutes at the same temperature of the ion exchange, 350° C.

The third IOX step was a double sided spike on both sides of the glass using a 4% $NaNO_3$/96% $KNO_3$ salt solution for a time of 15 minutes to 20 minutes. Prior to ion exchange the samples were preheated in an oven in a secondary container for 5 minutes at the same temperature as the ion exchange, 380° C.

Characterization after the second and third IOX step included: washing the samples with DI water to remove any residual salt, measuring warp using a profilometer and a flatmaster system, measuring weight using a high precision scale, measuring center tension with SCALP, and performing prism coupling measurements to determine the compressive stress, knee stress and depth of layer. All measurements are used to determine the overall stress profile and mechanical properties for each of the samples.

Table III below shows multiple conditions as described above for the processing of the samples. These samples have the same final spike of 4% $NaNO_3$/96% $KNO_3$ at 380° C. for 15 minutes.

TABLE III

| | Pre Warp | | 1st step IOX Spray at 370° C. on Back Surface | | | | 1st step IOX Spray 100% KNO₃ at 370° C. on Back Surface | 2nd step double sided IOX 49% NaNO₃ at 350° C. | Final Warp | |
|---|---|---|---|---|---|---|---|---|---|---|
| ID: 0.5 mm | Cross (μm) | Diag (μm) | % KNO₃ | % LiNO₃ | Mass (g/cm²) | time (hr) | IOX time (hr) | IOX Mass (g/cm²) | IOX time (hr) | Cross (μm) Diag (μm) |
| M6C | 236 | 432 | 100 | 0 | 0.004 | 1.67 | 1.08 | 0.004 | 3.8 | 63  50 |
| M6D | 236 | 450 | 100 | 0 | 0.004 | 1.08 | 0.83 | 0.004 | 3.8 | 20  67 |
| M6E | 234 | 434 | 100 | 0 | 0.005 | 1.67 | 1.08 | 0.005 | 3.8 | 168  238 |
| M6G | 236 | 440 | 100 | 0 | 0.005 | 1.33 | 0.92 | 0.005 | 4.5 | 87  88 |
| M7G | 173 | 390 | 98 | 2 | 0.005 | 0.25 | 0.92 | 0.005 | 4.5 | 31  75 |

Figure 30:
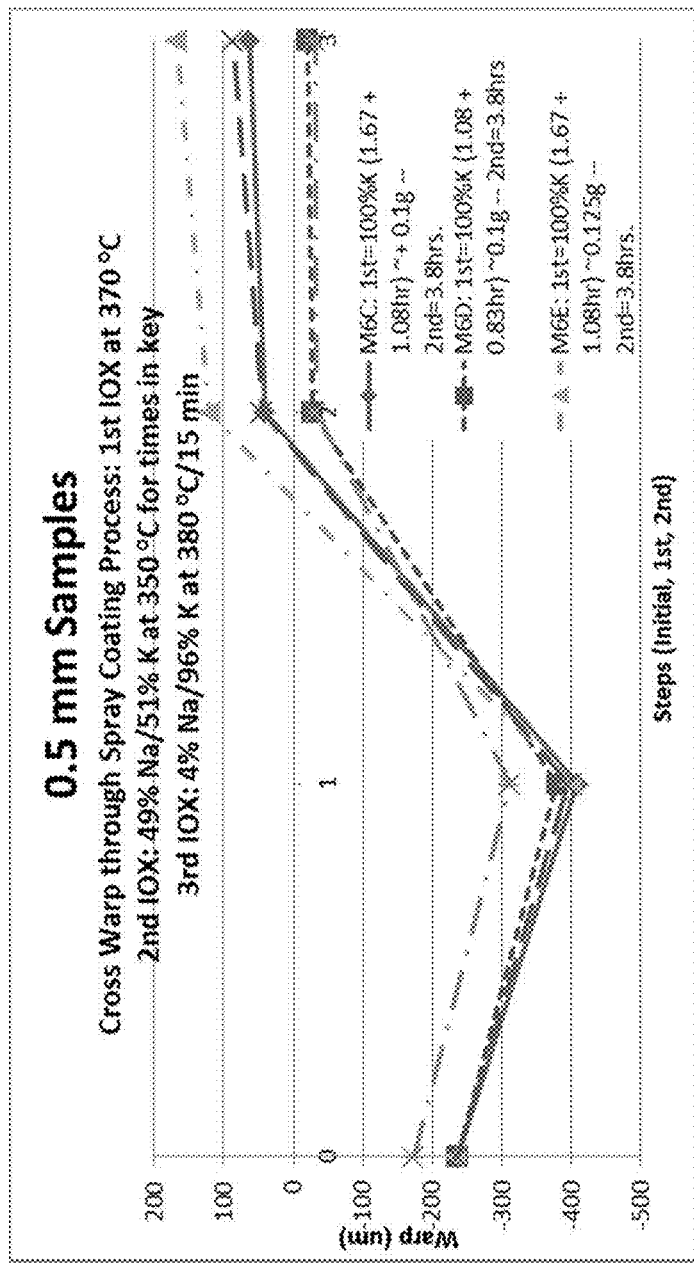
FIG. 30 is a plot of cross warp for samples at various stages in an ion exchange process.
Figure 31:
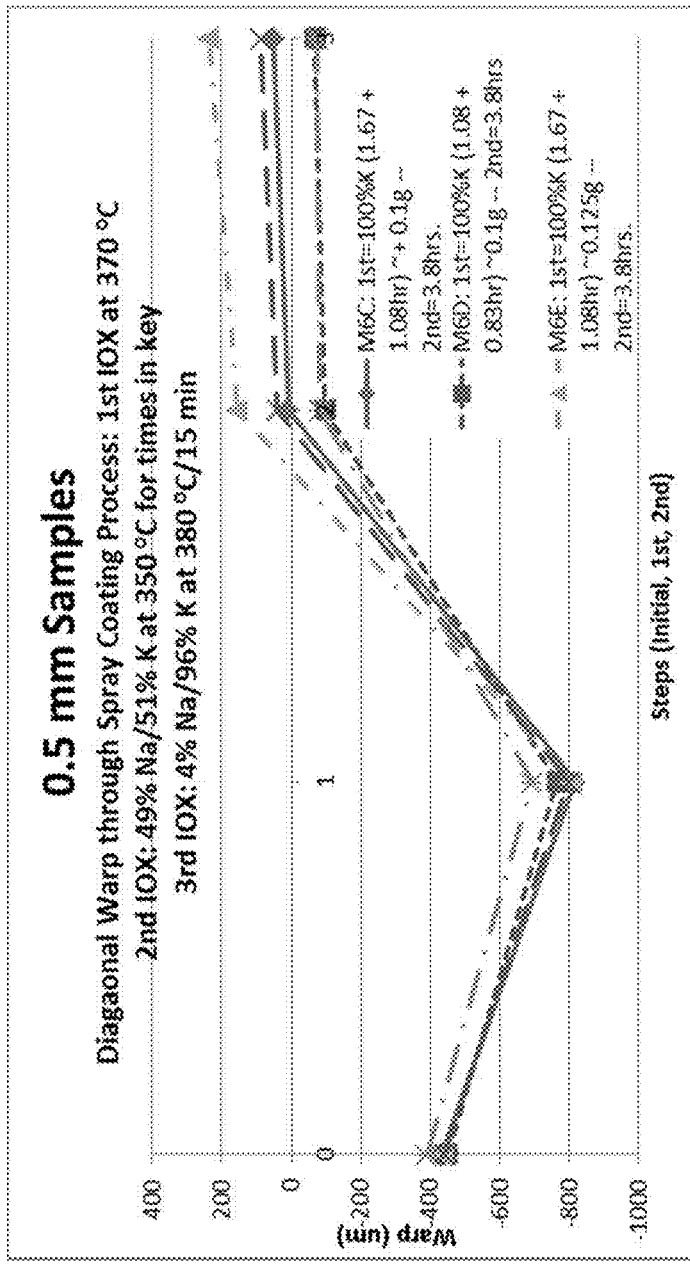
FIG. 31 is a plot of diagonal warp for the samples of FIG. 30 at various stages in an ion exchange process.

FIGS. 30 and 31 depict the cross warp and diagonal warp, respectively, for 0.5 mm thick pre warped samples after each step in an IOX process. The samples shown in FIGS. 30 and 31 are samples M6C, M6D, and M6E as described in Table III. The initial condition shown in FIGS. 30 and 31 is the pre warped glass article.

Example 6

Glass article samples having a composition of 63.76 mol % $SiO_2$, 15.05 mol % $Al_2O_3$, 9.24 mol % $Na_2O$, 2.37 mol % $B_2O_3$, 1.18 mol % ZnO, 5.88 mol % $Li_2O$, 0.05 mol % $SnO_2$, and 2.47 mol % $P_2O_5$. The samples were in the form of flat 50 mm by 50 mm square sheets, with thicknesses of 0.8 mm. The samples were subjected to a three step ion exchange process.

The samples were washed with deionized (DI) water and weighed with a high precision scale. The samples were then placed on a hot plate set at 200° C., to ensure that the salt solution that is sprayed on the surface of the sample dried quickly and that no residual water was present in the resulting salt deposit. The temperature of the sample was presumed to be between about 80° C. and 150° C. The number of actual sprays applied to the surface of the sample depended on the weight of salt desired on the sample. The number of spray applications was from 15 to 30. After the spray application was complete, the sample was weighed again to determine the total weight gain of salt. The sample was then placed in the oven with the coated side facing up for at a temperature of 420° C. for 1 hour to complete the first IOX step. The sample was also covered with a glass petri dish lid that did not make contact with the surface of the sample when placed in the oven. The surface of the sample that was coated is designated as the "back" surface with a negative warp and convex shape. Accordingly, the "front" surface had a concave shape.

The salt in the first IOX step was a coating of 100% tri-potassium phosphate (TKP), deposited by spray coating a near-saturated solution of TKP in DI water. Two samples were prepared, a first with a total salt weight of 0.563 g and a second with a total salt weight of about 0.6 g after drying.

Characterization after the first IOX step included: washing the samples with DI water to remove any residual salt, washing the samples with a 5% solution of acetic acid, washing the samples with DI water, wiping the samples with a cloth soaked in acetone, measuring warp using a profilometer and a flatmaster system, measuring weight using a high precision scale, and performing prism coupling measurements to determine the compressive stress, knee stress and depth of layer.

The second IOX step was a double sided exchange on both sides of the samples. The bath concentration used in this process was a 70% $NaNO_3$/30% $KNO_3$. The second IOX step was carried out for 4 hrs. Prior to ion exchange the samples were preheated in an oven for 15 minutes at the same temperature of the ion exchange, 380° C. The second IOX step resulted in a flip of the warp of the sample, such that the front surface had a convex shape and the back surface had a concave shape.

The third IOX step was a double sided spike on both sides of the glass using a 7% $NaNO_3$/93% $KNO_3$ salt solution for a time of 40 minutes at 380° C. Prior to ion exchange the samples were preheated at 250° C. for 5 minutes and then 380° C. for an additional 5 minutes, in separate ovens. After the third IOX step, the front surface of the sample had a convex shape and the back surface had a concave shape.

Characterization after the second and third IOX step included: washing the samples with DI water to remove any residual salt, wiping the samples with a cloth soaked in acetone, measuring warp using a profilometer and a flatmaster system, measuring weight using a high precision scale, measuring center tension with SCALP, and performing prism coupling measurements to determine the compressive stress, knee stress and depth of layer.

Figure 33:
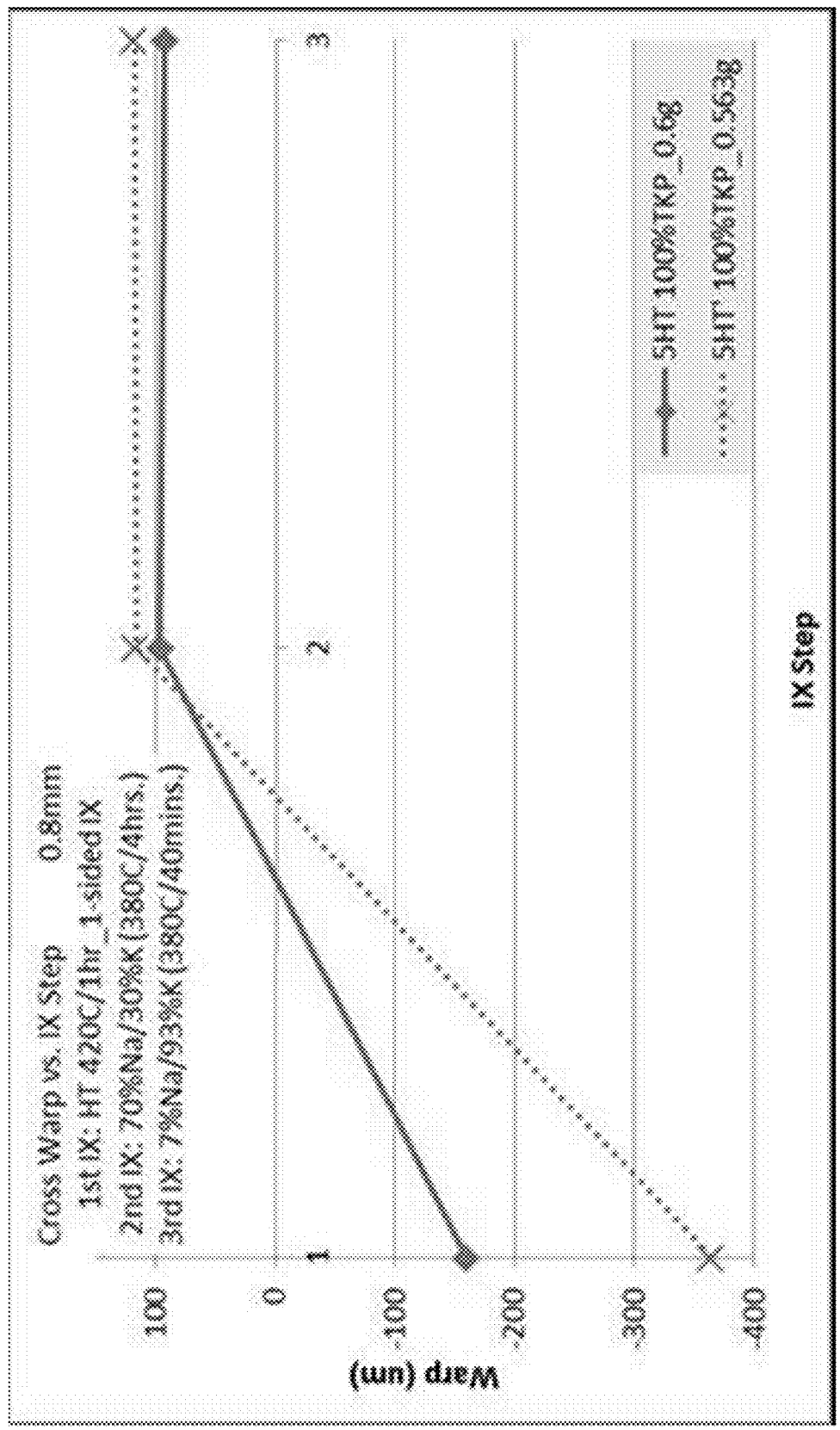
FIG. 33 is a plot of cross warp for samples at various stages in an ion exchange process.

The measured cross warp of the samples after each IOX step is shown in FIG. 33. The cross warp measurements indicate that the degree of warp after the first IOX step is not repeatable for this first IOX salt composition. The cross warp measurements after the second and the third IOX steps were substantially in agreement. The measured diagonal warp was between 1.88 and 2 times greater than the cross warp after each IOX step.

Example 7

Glass article samples having a composition of 63.76 mol % $SiO_2$, 15.05 mol % $Al_2O_3$, 9.24 mol % $Na_2O$, 2.37 mol % $B_2O_3$, 1.18 mol % ZnO, 5.88 mol % $Li_2O$, 0.05 mol % $SnO_2$, and 2.47 mol % $P_2O_5$. The samples were in the form of flat 50 mm by 50 mm square sheets, with thicknesses of 0.8 mm. The samples were subjected to a three step ion exchange process.

The samples were washed with deionized (DI) water and weighed with a high precision scale. The samples were then placed on a hot plate set at 200° C., to ensure that the salt solution that is sprayed on the surface of the sample dried quickly and that no residual water was present in the resulting salt deposit. The temperature of the sample was presumed to be between about 80° C. and 150° C. The number of actual sprays applied to the surface of the sample depended on the weight of salt desired on the sample. The number of spray applications was from 15 to 30. After the spray application was complete, the sample was weighed again to determine the total weight gain of salt. The sample was then placed in the oven with the coated side facing up for at a temperature of 420° C. for 1 hour to complete the first IOX step. The sample was also covered with a glass petri dish lid that did not make contact with the surface of the sample when placed in the oven. The surface of the sample that was coated is designated as the "back" surface with a negative warp and convex shape. Accordingly, the "front" surface had a concave shape.

The salt in the first IOX step was a coating of 99% tri-potassium phosphate (TKP) and 1% $KNO_3$, deposited by spray coating a near-saturated solution of 99% TKP and 1% $KNO_3$ by weight in DI water. Two samples were prepared, a first with a total salt weight of 0.279 g and a second with a total salt weight of about 0.412 g after drying.

Characterization after the first IOX step included: washing the samples with DI water to remove any residual salt, washing the samples with a 5% solution of acetic acid, washing the samples with DI water, wiping the samples with a cloth soaked in acetone, measuring warp using a profilometer and a flatmaster system, measuring weight using a high precision scale, and performing prism coupling measurements to determine the compressive stress, knee stress and depth of layer.

The second IOX step was a double sided exchange on both sides of the samples. The bath concentration used in this process was a 70% $NaNO_3$/30% $KNO_3$. The second IOX step was carried out for 4 hrs. Prior to ion exchange the samples were preheated in an oven for 15 minutes at the same temperature of the ion exchange, 380° C. The second IOX step resulted in a flip of the warp of the sample, such that the front surface had a convex shape and the back surface had a concave shape.

The third IOX step was a double sided spike on both sides of the glass using a 7% $NaNO_3$/93% $KNO_3$ salt solution for a time of 40 minutes at 380° C. Prior to ion exchange the samples were preheated at 250° C. for 5 minutes and then 380° C. for an additional 5 minutes, in separate ovens. After the third IOX step, the front surface of the sample had a convex shape and the back surface had a concave shape.

Characterization after the second and third IOX step included: washing the samples with DI water to remove any residual salt, wiping the samples with a cloth soaked in acetone, measuring warp using a profilometer and a flatmaster system, measuring weight using a high precision scale, measuring center tension with SCALP, and performing prism coupling measurements to determine the compressive stress, knee stress and depth of layer.

Figure 34:
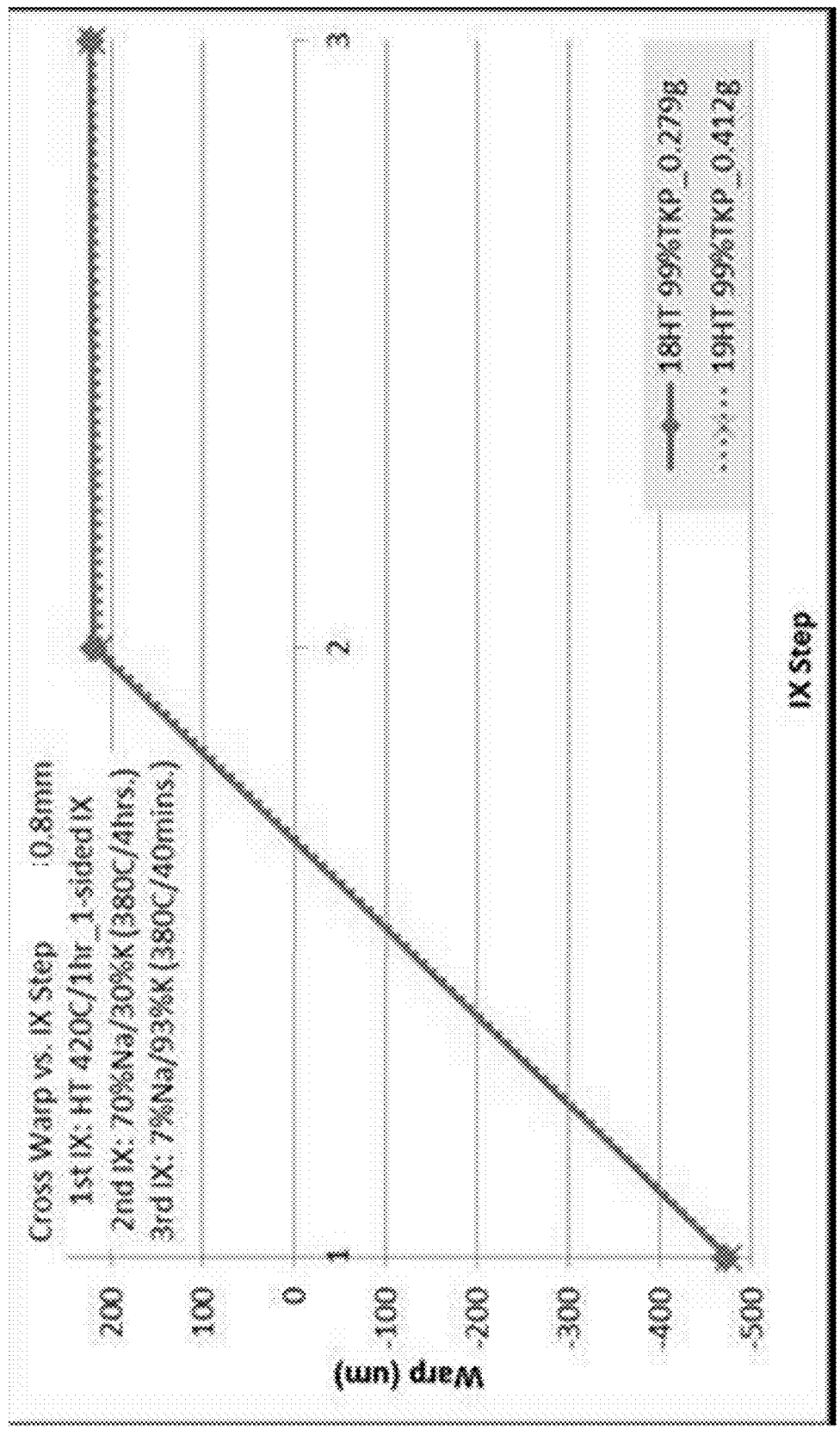
FIG. 34 is a plot of cross warp for samples at various stages in an ion exchange process.

The measured cross warp of the samples after each IOX step is shown in FIG. 34. The cross warp measurements indicate that the degree of warp was repeatable after each IOX step. The measured diagonal warp was between 1.8 and 1.97 times greater than the cross warp after each IOX step.

Example 8

Glass article samples having a composition of 63.76 mol % $SiO_2$, 15.05 mol % $Al_2O_3$, 9.24 mol % $Na_2O$, 2.37 mol % $B_2O_3$, 1.18 mol % ZnO, 5.88 mol % $Li_2O$, 0.05 mol % $SnO_2$, and 2.47 mol % $P_2O_5$. The samples were in the form of flat 50 mm by 50 mm square sheets, with thicknesses of 0.8 mm. The samples were subjected to a three step ion exchange process.

The samples were washed with deionized (DI) water and weighed with a high precision scale. The samples were then placed on a hot plate set at 200° C., to ensure that the salt solution that is sprayed on the surface of the sample dried quickly and that no residual water was present in the resulting salt deposit. The temperature of the sample was presumed to be between about 80° C. and 150° C. The number of actual sprays applied to the surface of the sample depended on the weight of salt desired on the sample. The number of spray applications was from 15 to 30. After the spray application was complete, the sample was weighed again to determine the total weight gain of salt. The sample was then placed in the oven with the coated side facing up for at a temperature of 420° C. for 1 hour to complete the first IOX step. The sample was also covered with a glass petri dish lid that did not make contact with the surface of the sample when placed in the oven. The surface of the sample that was coated is designated as the "back" surface with a negative warp and convex shape. Accordingly, the "front" surface had a concave shape.

The salt in the first IOX step was a coating of 96% tri-potassium phosphate (TKP) and 4% $KNO_3$, deposited by spray coating a near-saturated solution of 96% TKP and 4% $KNO_3$ by weight in DI water. Two samples were prepared, a first with a total salt weight of 0.403 g and a second with a total salt weight of about 0.266 g after drying.

Characterization after the first IOX step included: washing the samples with DI water to remove any residual salt, washing the samples with a 5% solution of acetic acid, washing the samples with DI water, wiping the samples with a cloth soaked in acetone, measuring warp using a profilometer and a flatmaster system, measuring weight using a high precision scale, and performing prism coupling measurements to determine the compressive stress, knee stress and depth of layer.

The second IOX step was a double sided exchange on both sides of the samples. The bath concentration used in this process was a 70% $NaNO_3$/30% $KNO_3$. The second IOX step was carried out for 4 hrs. Prior to ion exchange the samples were preheated in an oven for 15 minutes at the same temperature of the ion exchange, 380° C. The second IOX step resulted in a flip of the warp of the sample, such that the front surface had a convex shape and the back surface had a concave shape.

The third IOX step was a double sided spike on both sides of the glass using a 7% $NaNO_3$/93% $KNO_3$ salt solution for a time of 40 minutes at 380° C. Prior to ion exchange the samples were preheated at 250° C. for 5 minutes and then 380° C. for an additional 5 minutes, in separate ovens. After the third IOX step, the front surface of the sample had a convex shape and the back surface had a concave shape.

Characterization after the second and third IOX step included: washing the samples with DI water to remove any residual salt, wiping the samples with a cloth soaked in acetone, measuring warp using a profilometer and a flatmaster system, measuring weight using a high precision scale, measuring center tension with SCALP, and performing prism coupling measurements to determine the compressive stress, knee stress and depth of layer.

Figure 35:
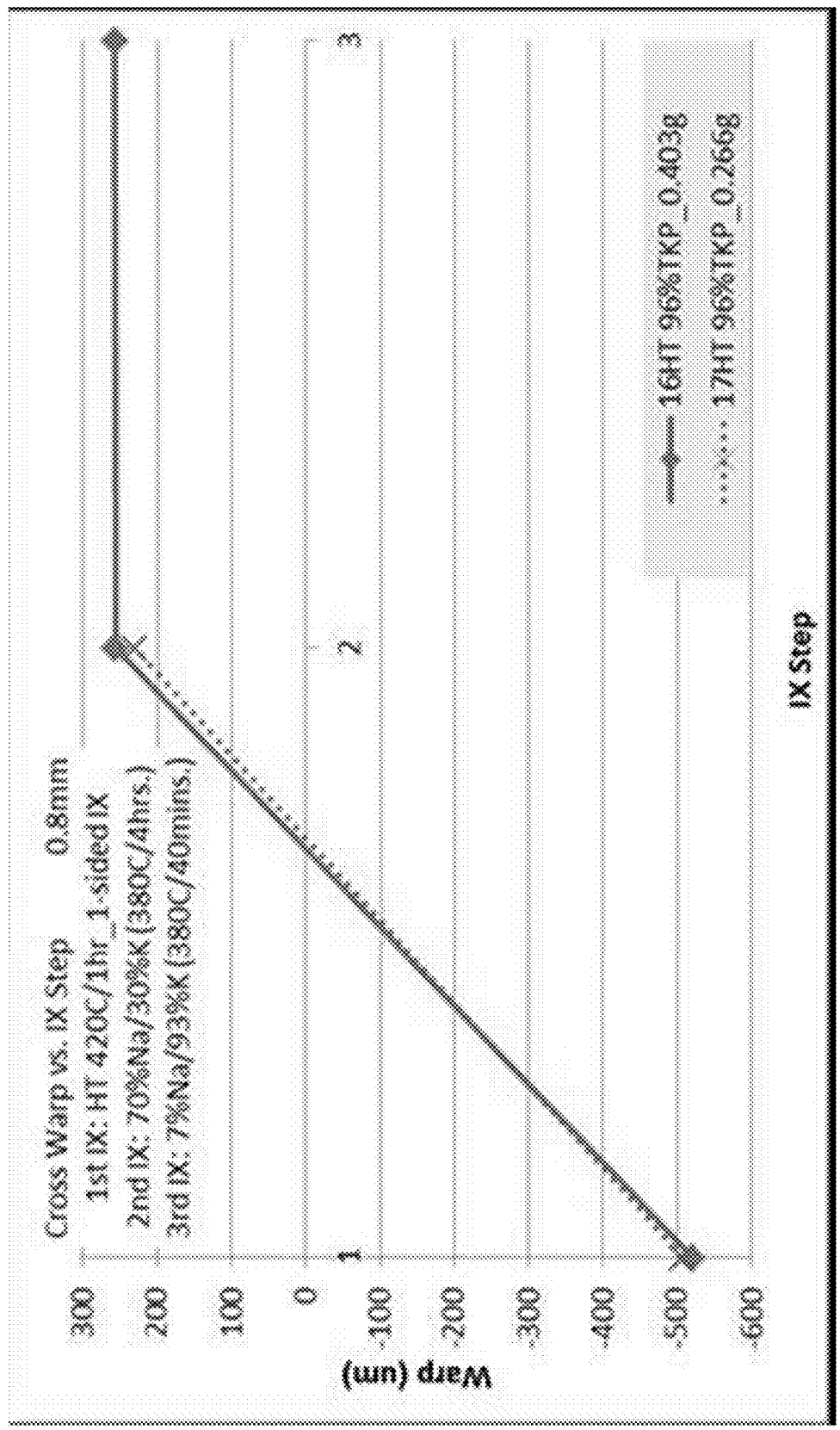
FIG. 35 is a plot of cross warp for samples at various stages in an ion exchange process.

The measured cross warp of the samples after each IOX step is shown in FIG. 35. The cross warp measurements indicate that the degree of warp was repeatable after each IOX step. The measured diagonal warp was between 1.89 and 1.99 times greater than the cross warp after each IOX step.

Example 9

Glass article samples having a composition of 63.76 mol % $SiO_2$, 15.05 mol % $Al_2O_3$, 9.24 mol % $Na_2O$, 2.37 mol % $B_2O_3$, 1.18 mol % ZnO, 5.88 mol % $Li_2O$, 0.05 mol % $SnO_2$, and 2.47 mol % $P_2O_5$. The samples were in the form of flat 50 mm by 50 mm square sheets, with thicknesses of 0.8 mm. The samples were subjected to a three step ion exchange process.

The samples were washed with deionized (DI) water and weighed with a high precision scale. The samples were then placed on a hot plate set at 200° C., to ensure that the salt solution that is sprayed on the surface of the sample dried quickly and that no residual water was present in the resulting salt deposit. The temperature of the sample was presumed to be between about 80° C. and 150° C. The number of actual sprays applied to the surface of the sample depended on the weight of salt desired on the sample. The number of spray applications was from 15 to 30. After the spray application was complete, the sample was weighed again to determine the total weight gain of salt. The sample was then placed in the oven with the coated side facing up for at to complete the first IOX step. The sample was also covered with a glass petri dish lid that did not make contact with the surface of the sample when placed in the oven. The surface of the sample that was coated is designated as the "back" surface with a negative warp and convex shape. Accordingly, the "front" surface had a concave shape.

The salt in the first IOX step was a coating of 92% tri-potassium phosphate (TKP) and 8% $KNO_3$, deposited by spray coating a near-saturated solution of 92% TKP and 8% $KNO_3$ by weight in DI water. Eight samples were prepared, with total salt weights of 0.102 g, 0.205 g, 0.210 g, 0.408 g, 0.417 g, 0.468 g, 0.494 g, and 0.575 g after drying. The first IOX step was conducted at a temperature of 420° C. for 1 hour, with the exception of the 0.205 g and 0.468 g total salt weight samples. The first IOX step for the 0.205 g total salt weight sample was conducted a temperature of 390° C. for 2 hours. The first IOX step for the 0.468 g total salt weight sample was conducted a temperature of 420° C. for 2 hours.

Characterization after the first IOX step included: washing the samples with DI water to remove any residual salt, washing the samples with a 5% solution of acetic acid, washing the samples with DI water, wiping the samples with a cloth soaked in acetone, measuring warp using a profilometer and a flatmaster system, measuring weight using a high precision scale, and performing prism coupling measurements to determine the compressive stress, knee stress and depth of layer.

The second IOX step was a double sided exchange on both sides of the samples. The bath concentration used in this process was a 70% $NaNO_3$/30% $KNO_3$. The second IOX step was carried out for 4 hrs. Prior to ion exchange the samples were preheated in an oven for 15 minutes at the same temperature of the ion exchange, 380° C. The second IOX step resulted in a flip of the warp of the sample, such that the front surface had a convex shape and the back surface had a concave shape.

The third IOX step was a double sided spike on both sides of the glass using a 7% $NaNO_3$/93% $KNO_3$ salt solution for a time of 40 minutes at 380° C. Prior to ion exchange the samples were preheated at 250° C. for 5 minutes and then 380° C. for an additional 5 minutes, in separate ovens. After the third IOX step, the front surface of the sample had a convex shape and the back surface had a concave shape.

Characterization after the second and third IOX step included: washing the samples with DI water to remove any residual salt, wiping the samples with a cloth soaked in acetone, measuring warp using a profilometer and a flatmaster system, measuring weight using a high precision scale, measuring center tension with SCALP, and performing prism coupling measurements to determine the compressive stress, knee stress and depth of layer.

Figure 36:
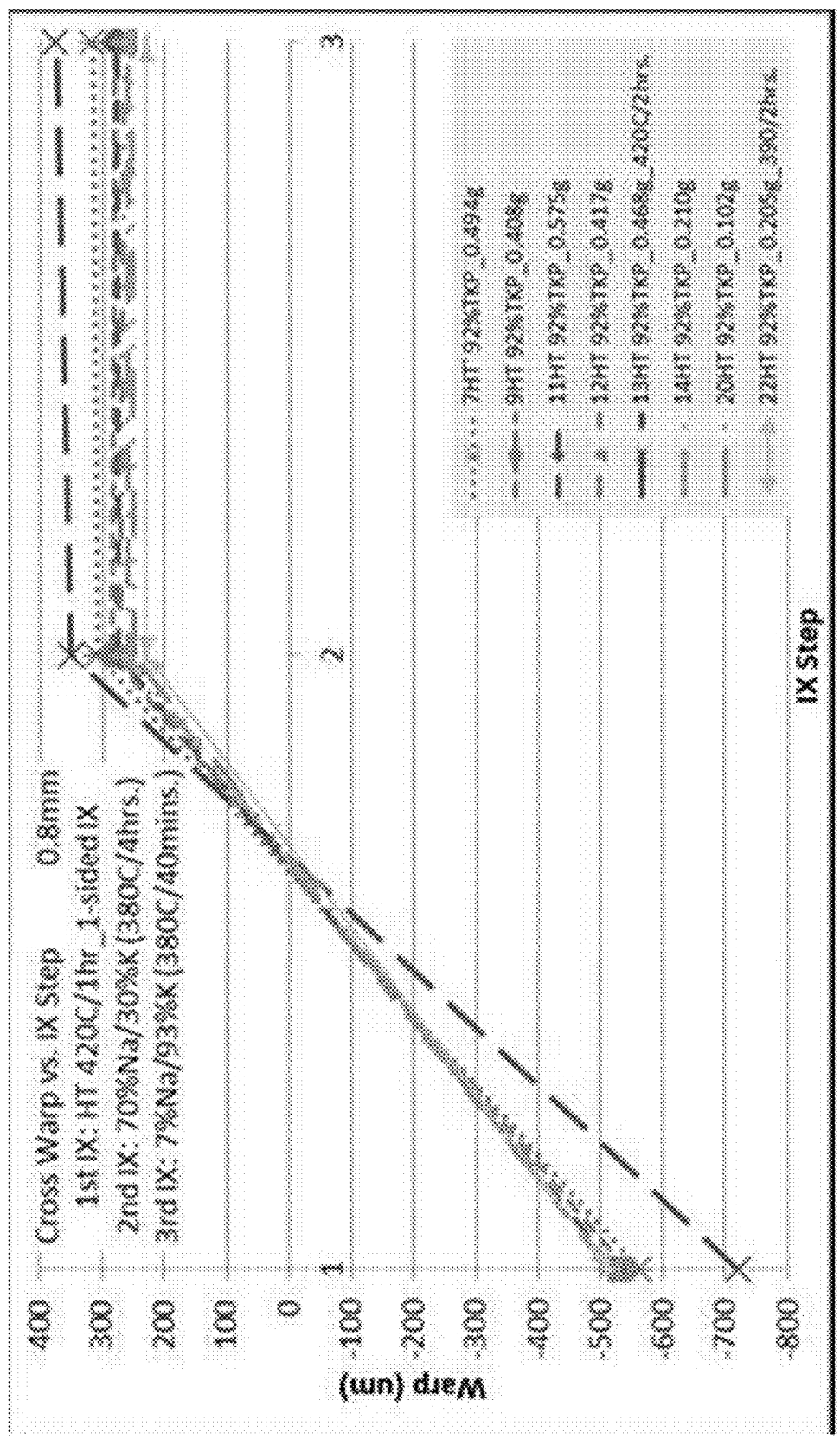
FIG. 36 is a plot of cross warp for samples at various stages in an ion exchange process.

The measured cross warp of the samples after each IOX step is shown in FIG. 36. The cross warp measurements indicate that the degree of warp was repeatable after each IOX step across each of the IOX conditions. The measured diagonal warp was between 1.86 and 2.1 times greater than the cross warp after each IOX step.

Example 10

Glass article samples having a composition of 63.76 mol % $SiO_2$, 15.05 mol % $Al_2O_3$, 9.24 mol % $Na_2O$, 2.37 mol % $B_2O_3$, 1.18 mol % ZnO, 5.88 mol % $Li_2O$, 0.05 mol % $SnO_2$, and 2.47 mol % $P_2O_5$. The samples were in the form of flat 50 mm by 50 mm square sheets, with thicknesses of 0.8 mm. The samples were subjected to a three step ion exchange process.

The samples were washed with deionized (DI) water and weighed with a high precision scale. The samples were then placed on a hot plate set at 200° C., to ensure that the salt solution that is sprayed on the surface of the sample dried quickly and that no residual water was present in the resulting salt deposit. The temperature of the sample was presumed to be between about 80° C. and 150° C. The number of actual sprays applied to the surface of the sample depended on the weight of salt desired on the sample. The number of spray applications was from 15 to 30. After the spray application was complete, the sample was weighed again to determine the total weight gain of salt. The sample was then placed in the oven with the coated side facing up for to complete the first IOX step. The sample was also covered with a glass petri dish lid that did not make contact with the surface of the sample when placed in the oven. The surface of the sample that was coated is designated as the "back" surface with a negative warp and convex shape. Accordingly, the "front" surface had a concave shape.

The salt in the first IOX step was a coating of 10% tri-potassium phosphate (TKP) and 90% $KNO_3$, deposited by spray coating a near-saturated solution of 10% TKP and 90% $KNO_3$ by weight in DI water. Three samples were prepared, with total salt weights of 0.106 g, 0.134 g, and 0.146 g after drying. The first IOX step was conducted at a temperature of 420° C. for 1 hour.

Characterization after the first IOX step included: washing the samples with DI water to remove any residual salt, washing the samples with a 5% solution of acetic acid, washing the samples with DI water, wiping the samples with a cloth soaked in acetone, measuring warp using a profilometer and a flatmaster system, measuring weight using a high precision scale, and performing prism coupling measurements to determine the compressive stress, knee stress and depth of layer.

The second IOX step was a double sided exchange on both sides of the samples. The bath concentration used in this process was a 70% $NaNO_3$/30% $KNO_3$. The second IOX step was carried out for 4 hrs. Prior to ion exchange the samples were preheated in an oven for 15 minutes at the same temperature of the ion exchange, 380° C. The second IOX step resulted in a flip of the warp of the sample, such that the front surface had a convex shape and the back surface had a concave shape.

The third IOX step was a double sided spike on both sides of the glass using a 7% $NaNO_3$/93% $KNO_3$ salt solution for a time of 40 minutes at 380° C. Prior to ion exchange the samples were preheated at 250° C. for 5 minutes and then 380° C. for an additional 5 minutes, in separate ovens. After the third IOX step, the front surface of the sample had a convex shape and the back surface had a concave shape.

Characterization after the second and third IOX step included: washing the samples with DI water to remove any residual salt, wiping the samples with a cloth soaked in acetone, measuring warp using a profilometer and a flatmaster system, measuring weight using a high precision scale, measuring center tension with SCALP, and performing prism coupling measurements to determine the compressive stress, knee stress and depth of layer.

Figure 37:
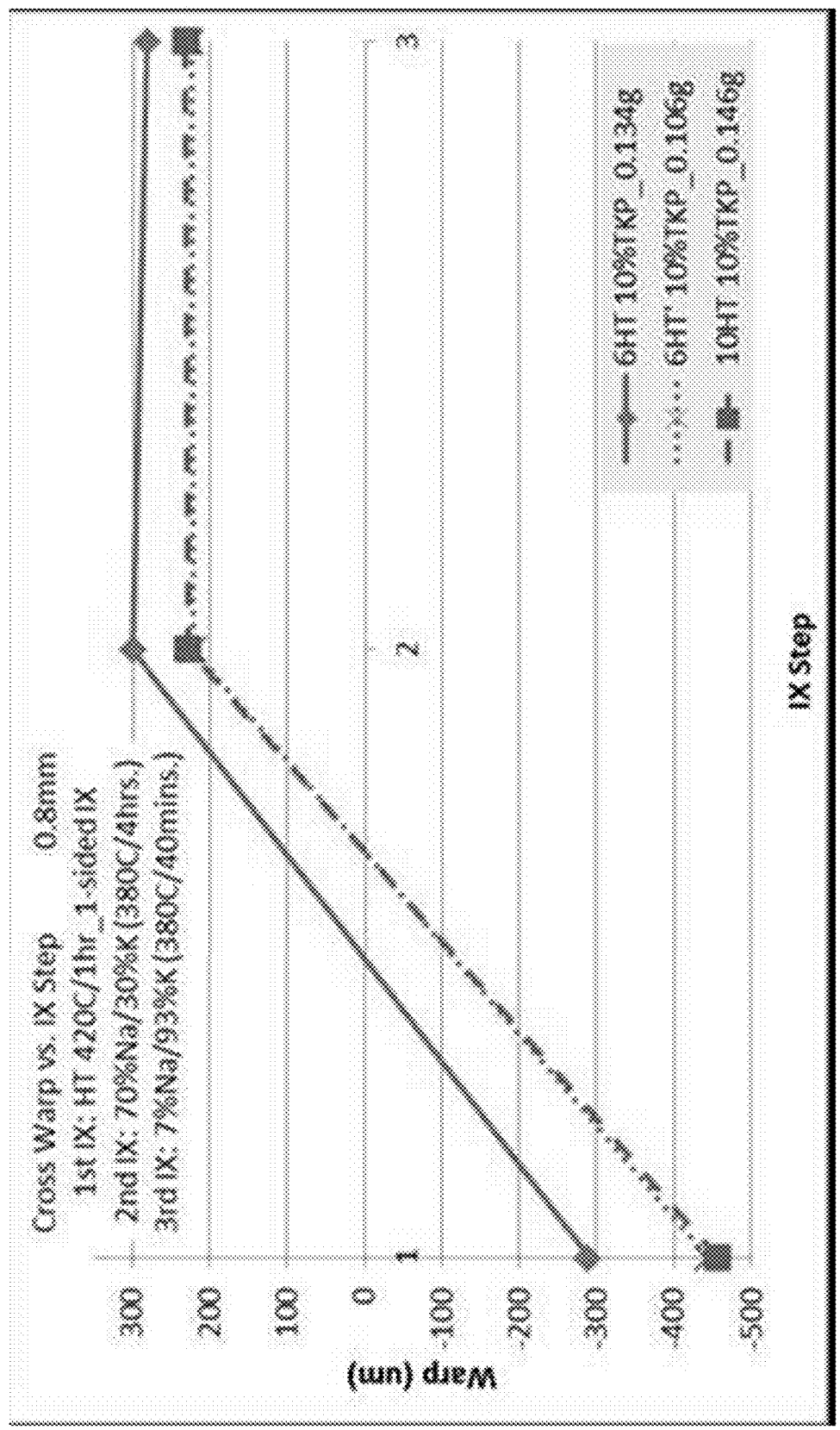
FIG. 37 is a plot of cross warp for samples at various stages in an ion exchange process.

The measured cross warp of the samples after each IOX step is shown in FIG. 37. The cross warp measurements indicate that the degree of warp was not repeatable after each IOX step. This may be due in part to observed wicking of the salt in the first IOX step from the back surface to the front surface of the sample, due to the low concentration of TKP. The measured diagonal warp was between 1.78 and 1.97 times greater than the cross warp after each IOX step.

Example 11

Glass article samples having a composition of 63.76 mol % $SiO_2$, 15.05 mol % $Al_2O_3$, 9.24 mol % $Na_2O$, 2.37 mol % $B_2O_3$, 1.18 mol % ZnO, 5.88 mol % $Li_2O$, 0.05 mol % $SnO_2$, and 2.47 mol % $P_2O_5$. The samples were in the form of flat 50 mm by 50 mm square sheets, with thicknesses of 0.8 mm. The samples were subjected to a three step ion exchange process.

The samples were washed with deionized (DI) water and weighed with a high precision scale. The samples were then placed on a hot plate set at 200° C., to ensure that the salt solution that is sprayed on the surface of the sample dried quickly and that no residual water was present in the resulting salt deposit. The temperature of the sample was presumed to be between about 80° C. and 150° C. A 40 mm by 40 mm square of aluminum foil was centered on the samples prior to spray coating the salt solution on the samples. This arrangement allowed the salt to be deposited only on the periphery of the samples, a region extending 5 mm from each edge of the surface. The number of actual sprays applied to the surface of the sample depended on the weight of salt desired on the sample. The number of spray applications was from 15 to 30. After the spray application was complete, the aluminum foil was removed from the sample and the sample was weighed again to determine the total weight gain of salt. The sample was then placed in the oven with the coated side facing up for at to complete the first IOX step. The sample was also covered with a glass petri dish lid that did not make contact with the surface of the sample when placed in the oven. The surface of the sample that was coated is designated as the "back" surface with a negative warp and convex shape. Accordingly, the "front" surface had a concave shape.

The salt in the first IOX step was a coating of 92% tri-potassium phosphate (TKP) and 8% $KNO_3$, deposited by spray coating a near-saturated solution of 92% TKP and 8% $KNO_3$ by weight in DI water. Three samples were prepared, with total salt weights of 0.110 g, 0.111 g, 0.112 g, and 0.183 g after drying. The first IOX step was conducted at a temperature of 420° C. for 1 hour, with the exception of the 0.112 g total salt weight sample. The first IOX step for the 0.112 g total salt weight sample was conducted a temperature of 420° C. for 2.42 hours.

Characterization after the first IOX step included: washing the samples with DI water to remove any residual salt, washing the samples with a 5% solution of acetic acid, washing the samples with DI water, wiping the samples with a cloth soaked in acetone, measuring warp using a profilometer and a flatmaster system, measuring weight using a high precision scale, and performing prism coupling measurements to determine the compressive stress, knee stress and depth of layer.

The second IOX step was a double sided exchange on both sides of the samples. The bath concentration used in this process was a 70% $NaNO_3$/30% $KNO_3$. The second IOX step was carried out for 4 hrs. Prior to ion exchange the samples were preheated in an oven for 15 minutes at the same temperature of the ion exchange, 380° C. The second IOX step resulted in a flip of the warp of the sample, such that the front surface had a convex shape and the back surface had a concave shape.

The third IOX step was a double sided spike on both sides of the glass using a 7% $NaNO_3$/93% $KNO_3$ salt solution for a time of 40 minutes at 380° C. Prior to ion exchange the samples were preheated at 250° C. for 5 minutes and then 380° C. for an additional 5 minutes, in separate ovens. After the third IOX step, the front surface of the sample had a convex shape and the back surface had a concave shape.

Characterization after the second and third IOX step included: washing the samples with DI water to remove any residual salt, wiping the samples with a cloth soaked in acetone, measuring warp using a profilometer and a flatmaster system, measuring weight using a high precision scale, measuring center tension with SCALP, and performing prism coupling measurements to determine the compressive stress, knee stress and depth of layer.

Figure 38:
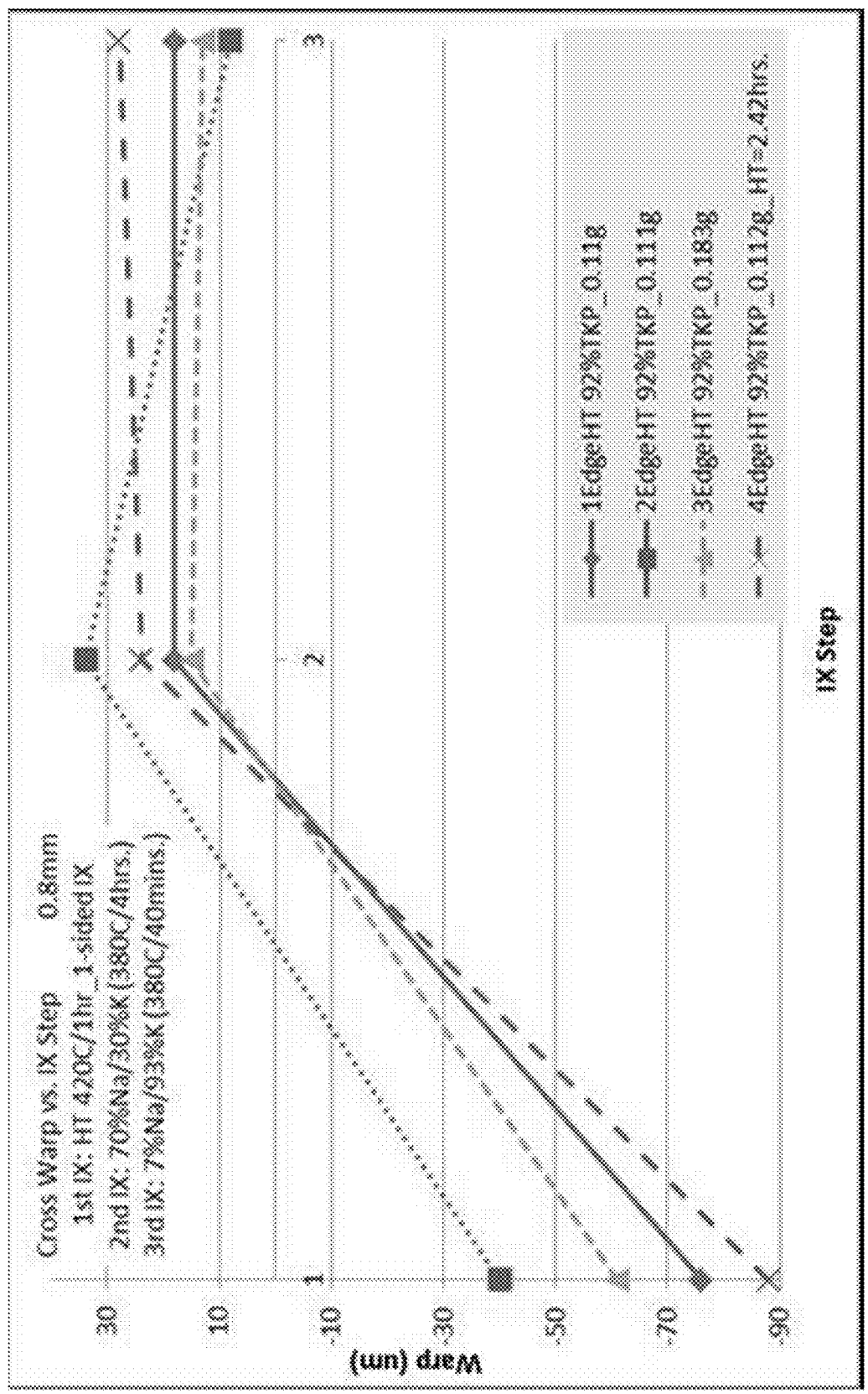
FIG. 38 is a plot of cross warp for samples at various stages in an ion exchange process.

The measured cross warp of the samples after each IOX step is shown in FIG. 38. The measured cross warp of the samples after the third IOX step was between 8 μm and 28 μm. The measured diagonal warp was between 1.26 and 3.63 times greater than the cross warp after each IOX step. The observed warp was concentrated at the periphery of the samples, such that the center of the samples exhibited substantially lower curvature than similar samples where the first IOX step involved coating the entire surface of the samples. The cross warp range and the average value of the cross warp were at least an order of magnitude smaller than similar samples where the first IOX step involved coating the entire surface of the samples.

Example 12

Glass article samples having a composition of 63.76 mol % $SiO_2$, 15.05 mol % $Al_2O_3$, 9.24 mol % $Na_2O$, 2.37 mol % $B_2O_3$, 1.18 mol % ZnO, 5.88 mol % $Li_2O$, 0.05 mol % $SnO_2$, and 2.47 mol % $P_2O_5$. The samples were in the form of flat 50 mm by 50 mm square sheets, with thicknesses of 0.8 mm. The samples were subjected to a three step ion exchange process.

The samples were washed with deionized (DI) water, wiped with a clean cloth soaked in acetone, and weighed with a high precision scale. The samples were then placed on a hot plate set at 200° C. to 250° C., to ensure that the salt solution that is sprayed on the surface of the sample dried quickly and that no residual water was present in the resulting salt deposit. The temperature of the sample was presumed to be between about 80° C. and 150° C. The number of actual sprays applied to the surface of the sample depended on the weight of salt desired on the sample. The number of spray applications was from 15 to 30. After the spray application was complete, the sample was weighed again to determine the total weight gain of salt. The sample was then placed in the oven with the coated side facing up for to complete the first IOX step. The sample was also covered with a glass petri dish lid that did not make contact with the surface of the sample when placed in the oven. The surface of the sample that was coated is designated as the "back" surface with a negative warp and convex shape. Accordingly, the "front" surface had a concave shape.

The salt in the first IOX step was a coating of the salts shown in Table IV below, deposited by spray coating a near-saturated in DI water. The solutions were prepared by mixing the components and shaking to allow the salts to completely dissolve. The solutions were then strained into a spray bottle using a clean cloth to remove any large contamination particles. The samples had total salt weights of 0.1 g to 0.6 g after drying.

TABLE IV

| Concentration | TKP (g) | KNO$_3$ (g) | Water (mL) |
|---|---|---|---|
| 10% TKP | 1 | 9 | 35 |
| 25% TKP | 2.5 | 7.5 | 30 |
| 50% TKP | 5 | 5 | 23 |
| 80% TKP | 8 | 2 | 20 |
| 92% TKP | 9.2 | 0.8 | 14 |
| 96% TKP | 9.6 | 0.4 | 12 |
| 99% TKP | 9.9 | 0.1 | 12 |
| 100% TKP | 18 | 0 | 20 |

The first IOX step was conducted at a temperature of 420° C. for 1 hour.

Characterization after the first IOX step included: washing the samples with DI water to remove any residual salt, washing the samples with a 5% solution of acetic acid to remove staining from the salt deposition, washing the samples with DI water, wiping the samples with a cloth soaked in acetone, measuring warp using a profilometer and a flatmaster system, measuring weight using a high precision scale, and performing prism coupling measurements to determine the compressive stress, knee stress and depth of layer. Depending on the extent of the staining, the acetic acid cleaning ranged from about 30 minutes to about 3 hours. In some cases, it was not possible to completely remove the staining.

The second IOX step was a double sided exchange on both sides of the samples. The bath concentration used in this process was a 70% NaNO$_3$/30% KNO$_3$. The second IOX step was carried out for 4 hrs. Prior to ion exchange the samples were preheated in an oven for 15 minutes at the same temperature of the ion exchange, 380° C. The second IOX step resulted in a flip of the warp of the sample, such that the front surface had a convex shape and the back surface had a concave shape.

The third IOX step was a double sided spike on both sides of the glass using a 7% NaNO$_3$/93% KNO$_3$ salt solution for a time of 40 minutes at 380° C. Prior to ion exchange the samples were preheated at 250° C. for 5 minutes and then 380° C. for an additional 5 minutes, in separate ovens. After the third IOX step, the front surface of the sample had a convex shape and the back surface had a concave shape.

Characterization after the second and third IOX step included: washing the samples with DI water to remove any residual salt, wiping the samples with a cloth soaked in acetone, measuring warp using a profilometer and a flatmaster system, measuring weight using a high precision scale, measuring center tension with SCALP, and performing prism coupling measurements to determine the compressive stress, knee stress and depth of layer.

The results of the characterization are reported in Table V below. As shown in Table 5, increased amounts of TKP as a solid component in the first IOX salt decreased the amount of surface spreading. Similarly, increased amounts of TKP also decreased the amount of compressive stress drop due to lithium poisoning.

TABLE V

| TKP Concentration | Surface Spreading | Salt Deposit Removal with 5% Acetic Acid | FSM Imaging | CS drop due to Li poisoning (MPa) |
|---|---|---|---|---|
| 10% | N/A | Difficult, only partly effective | Good | 250-350 |
| 25% | Minimal | Easy | Good | 0-100 |
| 50% | Minimal | Easy | Good | no drop |
| 80% | No | Easy | Good | no drop |
| 92% | No | Easy | Good | no drop |
| 96% | No | Medium | Good | no drop |
| 99% | No | Medium | Problematic | no drop |
| 100% | No | Medium | Very problematic, producing wrong results, no fringes | no drop |

While typical embodiments have been set forth for the purpose of illustration, the foregoing description should not be deemed to be a limitation on the scope of the disclosure or appended claims. Accordingly, various modifications, adaptations, and alternatives may occur to one skilled in the art without departing from the spirit and scope of the present disclosure or appended claims.

The invention claimed is:

1. A glass article, comprising:
   a first surface;
   a second surface;
   an asymmetric stress profile extending from the first surface to the second surface;
   a Warpage Figure of Merit of the asymmetric stress profile of at least about 0.5 m; and
   an Asymmetry Figure of Merit of the asymmetric stress profile of at least about 0.05.

2. The glass article of claim 1, further comprising:
   50-75 mol % SiO$_2$;
   5-20 mol % Al$_2$O$_3$;
   2-20 mol % B$_2$O$_3$;
   0-10 mol % P$_2$O$_5$;
   6-25 mol % Li$_2$O+Na$_2$O+K$_2$O; and
   0-15 mol % MgO+CaO+SrO+BaO+ZnO.

3. The glass article of claim 1, wherein the Warpage Figure of Merit of the asymmetric stress profile is at least about 1 m.

4. The glass article of claim 1, wherein the Asymmetry Figure of Merit of the asymmetric stress profile is at least about 0.2.

5. The glass article of claim 1, further comprising a radius of curvature of at least about 12.5 m.

6. The glass article of claim 1, wherein the glass article has a Warpage Suppression Factor of less than about 0.3.

7. The glass article of claim 1, wherein the glass article comprises a region with a second stress profile extending from the first surface to the second surface, and the second stress profile is different than the asymmetric stress profile.

8. The glass article of claim 1, further comprising a glass ceramic.

9. A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
a cover glass article disposed over the display, wherein at least one of a portion of the housing or the cover glass article comprises the glass article of claim 1.

10. A glass article, comprising:
a first surface;
a second surface;
an asymmetric stress profile extending from the first surface to the second surface;
a Warpage Tendency of the asymmetric stress profile of less than about one twelfth of a thickness of the glass article; and
an Asymmetry Figure of Merit of the asymmetric stress profile of at least about 0.05.

11. The glass article of claim 10, further comprising:
50-75 mol % $SiO_2$;
5-20 mol % $Al_2O_3$;
2-20 mol % $B_2O_3$;
0-10 mol % $P_2O_5$;
6-25 mol % $Li_2O+Na_2O+K_2O$; and
0-15 mol % $MgO+CaO+SrO+BaO+ZnO$.

12. The glass article of claim 10, wherein the Asymmetry Figure of Merit of the asymmetric stress profile is at least about 0.2.

13. The glass article of claim 10, further comprising a radius of curvature of at least about 12.5 m.

14. The glass article of claim 10, wherein the glass article has a Warpage Suppression Factor of less than about 0.3.

15. The glass article of claim 10, wherein the glass article comprises a region with a second stress profile extending from the first surface to the second surface, and the second stress profile is different than the asymmetric stress profile.

16. The glass article of claim 10, further comprising a glass ceramic.

17. A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
a cover glass article disposed over the display, wherein at least one of a portion of the housing or the cover glass article comprises the glass article of claim 10.

18. A glass article, comprising:
a first surface;
a second surface;
an asymmetric stress profile extending from the first surface to the second surface;
a first compressive stress layer extending from the first surface to a first depth of compression in the glass article;
a second compressive stress layer extending from the second surface to a second depth of compression in the glass article; and
a warpage height,
wherein at least one of the first depth of compression and the second depth of compression is greater than or equal to 0.16t where t is a thickness of the glass article, a ratio of the first depth of compression to the second depth of compression is at least about 1.5:1, and the warpage height is less than about 1% of a maximum dimension of the glass article.

19. The glass article of claim 18, further comprising:
a first maximum compressive stress in the first compressive stress layer; and
a second maximum compressive stress in the second compressive stress layer,
wherein the ratio of the first maximum compressive stress to the second maximum compressive stress is about 1:3 or less.

20. The glass article of claim 18, wherein the ratio of the first depth of compression to the second depth of compression is at least about 3:1.

21. The glass article of claim 18, wherein the warpage height is less than about 0.1% of the maximum dimension of the glass article.

22. The glass article of claim 18, further comprising at least one of:
a compressive stress at a depth of 10 μm below the second surface of at least about 500 MPa;
a compressive stress at a depth of 5 μm below the second surface of at least about 650 MPa;
a compressive stress at a depth below the first surface of 10% of the distance between the first surface and the second surface of at least about 40 MPa;
a compressive stress at a depth below the first surface of 15% of the distance between the first surface and the second surface of at least about 30 MPa.

23. The glass article of claim 18, further comprising a glass ceramic.

24. A consumer electronic product, comprising:
a housing having a front surface, a back surface and side surfaces;
electrical components provided at least partially within the housing, the electrical components including at least a controller, a memory, and a display, the display being provided at or adjacent the front surface of the housing; and
a cover glass article disposed over the display, wherein at least one of a portion of the housing or the cover glass article comprises the glass article of claim 18.

25. The glass article of claim 18, wherein at least one of the first depth of compression and the second depth of compression is greater than or equal to 110 μm.

26. The glass article of claim 18, wherein at least one of the first depth of compression and the second depth of compression is greater than or equal to 0.2t.

27. A method, comprising:
ion exchanging a first surface of a glass article to form a first compressive stress layer extending from the first surface;
ion exchanging a second surface of the glass article to form a second compressive stress layer extending from the second surface,
wherein the glass article including the first compressive stress layer and the second compressive stress layer comprises a Warpage Figure of Merit of at least about 0.5 m, and an Asymmetry Figure of Merit of at least about 0.05.

28. The method of claim 27, wherein the first compressive stress layer and the second compressive stress layer are formed concurrently.

29. The method of claim 27, further comprising forming a blocking layer at the first surface of the glass article prior to ion exchanging the second surface.

30. The method of claim 27, further comprising heat treating the glass article to form a curved glass article before ion exchanging the glass article.

31. A method, comprising:
disposing a salt on at least a portion of a first surface of a glass article;
ion exchanging the glass article by heating the glass article and salt to an ion exchange temperature to produce a glass article with an asymmetric stress profile,
wherein the salt comprises a solid component that is solid at the ion exchange temperature, and the glass article has an Asymmetry Figure of Merit of at least about 0.05, and a Warpage Figure of Merit of at least about 0.5 m.

32. The method of claim 31, wherein the salt further comprises a liquid component that is liquid at the ion exchange temperature.

33. The method of claim 31, wherein the solid component comprises at least one of tri-potassium phosphate, tri-sodium phosphate, potassium sulfate, and sodium sulfate.

34. The method of claim 32, wherein the liquid component comprises at least one of $KNO_3$ and $NaNO_3$.

35. The method of claim 31, wherein the solid component is present in the salt in an amount of 5 wt % to 99.5 wt %.

36. The method of claim 31, wherein the solid component is present in the salt in an amount of 30 wt % to 98 wt %.

37. The method of claim 31, wherein the salt is disposed on the entirety of the first surface.

38. The method of claim 31, further comprising forming a blocking layer on a portion of the first surface prior to disposing the salt.

39. The method of claim 31, further comprising contacting the glass article with a molten salt bath.

40. The method of claim 31, wherein the asymmetric stress profile has a Warpage Tendency of less than about one twelfth of a thickness of the glass article.

\* \* \* \* \*